(12) United States Patent
Wu

(10) Patent No.: US 6,524,756 B1
(45) Date of Patent: Feb. 25, 2003

(54) GRAY SCALE ALL-GLASS PHOTOMASKS

(75) Inventor: Che-Kuang Wu, San Diego, CA (US)

(73) Assignee: Canyon Materials, Inc., San Diego, CA (US)

( * ) Notice: Subject to any disclaimer, the term of this patent is extended or adjusted under 35 U.S.C. 154(b) by 0 days.

(21) Appl. No.: 10/160,573

(22) Filed: May 30, 2002

Related U.S. Application Data

(63) Continuation of application No. 09/934,218, filed on Aug. 21, 2001, which is a continuation-in-part of application No. 09/507,039, filed on Feb. 18, 2000, which is a continuation-in-part of application No. 08/961,459, filed on Oct. 30, 1997

(60) Provisional application No. 60/030,258, filed on Oct. 31, 1996.

(51) Int. Cl.$^7$ .............................. G03F 9/00; G03C 5/00
(52) U.S. Cl. .......................... 430/5; 430/296; 430/321; 430/325
(58) Field of Search ..................... 430/5, 296, 321, 430/325

(56) References Cited

U.S. PATENT DOCUMENTS

| | | | |
|---|---|---|---|
| 1,669,908 | A | 5/1928 | Long |
| 2,245,783 | A | 6/1941 | Hyde |
| 2,494,259 | A | 1/1950 | Nordberg |
| 2,554,952 | A | 5/1951 | Mockrin et al. |
| 2,566,134 | A | 8/1951 | Mockrin et al. |
| 2,604,410 | A | 7/1952 | Bryant |
| 2,683,666 | A | 7/1954 | Duncan et al. |
| 2,701,215 | A | 2/1955 | Kroeck |
| 2,799,590 | A | 7/1957 | Armistead |
| 2,913,345 | A | 11/1959 | Duncan |
| 2,920,971 | A | 1/1960 | Stookey |
| 2,943,059 | A | 6/1960 | Beck et al. |
| 3,001,880 | A | 9/1961 | Ruskin |
| 3,007,806 | A | 11/1961 | Hartwig |
| 3,022,182 | A | 2/1962 | Cleek et al. |
| 3,077,414 | A | 2/1963 | Wiker |
| 3,397,076 | A | 8/1968 | Little et al. |
| 3,419,370 | A | 12/1968 | Cramer et al. |
| 3,504,819 | A | 4/1970 | Veres |
| 3,528,847 | A | 9/1970 | Grego et al. |
| 3,541,330 | A | 11/1970 | Eichelberger et al. |
| 3,558,528 | A | 1/1971 | Buck et al. |
| 3,589,918 | A | 6/1971 | Jahn |
| 3,656,923 | A | 4/1972 | Garfinkel et al. |
| 3,677,960 | A | 7/1972 | Ishiyama |
| 3,704,467 | A | 11/1972 | Frock |
| 3,713,819 | A | 1/1973 | Hagenbach et al. |
| 3,840,379 | A | 10/1974 | Wolf |
| 3,861,926 | A | 1/1975 | Iriam et al. |
| 3,873,328 | A | 3/1975 | Brueggemann et al. |
| 3,873,408 | A | 3/1975 | Hensler |
| 3,887,348 | A | 6/1975 | Plumat et al. |
| 3,888,648 | A | 6/1975 | West et al. |
| 3,904,425 | A | 9/1975 | Young et al. |
| 3,938,977 | A | 2/1976 | Gliemeroth |
| 3,944,697 | A | 3/1976 | Ichimura et al. |
| 4,002,482 | A | 1/1977 | Coenen |
| 4,026,715 | A | 5/1977 | Erickson et al. |
| 4,036,623 | A | 7/1977 | Deeg et al. |
| 4,057,408 | A | 11/1977 | Pierson et al. |
| 4,086,073 | A | 4/1978 | Loukes |
| 4,102,665 | A | 7/1978 | Plumat et al. |
| 4,106,946 | A | 8/1978 | Ritze |
| 4,118,214 | A | 10/1978 | Wedding |
| 4,125,404 | A | 11/1978 | Araujo |

(List continued on next page.)

FOREIGN PATENT DOCUMENTS

| | | |
|---|---|---|
| BE | 760371 | 6/1971 |
| FR | 2323648 | 9/1975 |
| GB | 778355 | 7/1957 |
| GB | 804106 | 11/1958 |
| GB | 1290528 | 9/1972 |
| JP | 51-109918 | 3/1975 |
| SU | 579244 | 6/1976 |

OTHER PUBLICATIONS

Wu, Che–Kuang, *Journal of Non–Crystalline Solids*, "Stable Silicate Glasses Containing Up to 10 Weight Percent of Water", vol. 41, No. 3, Dec. 1980, pp 381–398.

Wu, Che–Kuang, *Journal of The American Ceramic Society*, "Nature of Incorporated Water in Hydrated Silicate Glasses", vol. 63, No. 7–8, Jul.–Aug. 1980, pp. 453–457.

Primary Examiner—Christopher G. Young
(74) Attorney, Agent, or Firm—Fish & Richardson P.C.

(57) ABSTRACT

A narrowly defined range of zinc silicate glass compositions is found to produce High Energy Beam Sensitive-glass (HEBS-glass) that possesses the essential properties of a true gray level mask which is necessary for the fabrication of general three dimensional microstructures with one optical exposure in a conventional photolithographic process. The essential properties are (1) A mask pattern or image is grainiless even when observed under optical microscope at 1000× or at higher magnifications. (2) The HEBS-glass is insensitive and/or inert to photons in the spectral ranges employed in photolithographic processes, and is also insensitive and/or inert to visible spectral range of light so that a HEBS-glass mask blank and a HEBS-glass mask are permanently stable under room lighting conditions. (3) The HEBS-glass is sufficiently sensitive to electron beam exposure, so that the cost of making a mask using an e-beam writer is affordable for at least certain applications. (4) The e-beam induced optical density is a unique function of, and is a very reproducible function of electron dosages for one or more combinations of the parameters of an e-beam writer. The parameters of e-beam writers include beam acceleration voltage, beam current, beam spot size, addressing grid size and number of retraces.

A method of fabricating three-dimensional microstructures using HEBS-glass gray scale photomask for three dimensional profiling of photoresist and reproducing the photoresist replica in the substrate with the existing microfabrication methods normally used for the production of microelectronics is described.

25 Claims, 29 Drawing Sheets

U.S. PATENT DOCUMENTS

| | | |
|---|---|---|
| 4,160,654 A | 7/1979 | Bartholomew et al. |
| 4,179,300 A | 12/1979 | Sagara |
| 4,191,547 A | 3/1980 | Wu |
| 4,192,689 A | 3/1980 | Rinehart |
| 4,287,018 A | 9/1981 | Gulati et al. |
| 4,290,794 A | 9/1981 | Wedding |
| 4,311,504 A | 1/1982 | Nigrin |
| 4,405,672 A | 9/1983 | Araujo et al. |
| 4,478,677 A | 10/1984 | Chen et al. |
| 4,530,736 A | 7/1985 | Mutter |
| 4,567,104 A | 1/1986 | Wu |
| 4,670,366 A | 6/1987 | Wu |
| 4,756,733 A | 7/1988 | Houde-Walter et al. |
| 4,894,303 A | 1/1990 | Wu |
| 5,078,771 A | 1/1992 | Wu |
| 5,285,517 A | 2/1994 | Wu |
| 6,107,000 A | 8/2000 | Lee et al. .................. 430/296 |

HEBS-Glass material exposed in e-beam writer

Gray-Level mask generated in HEBS-Glass

Photoresist exposure in mask-aligner

Resist surface profile after development

Lens profile after etching transfer step

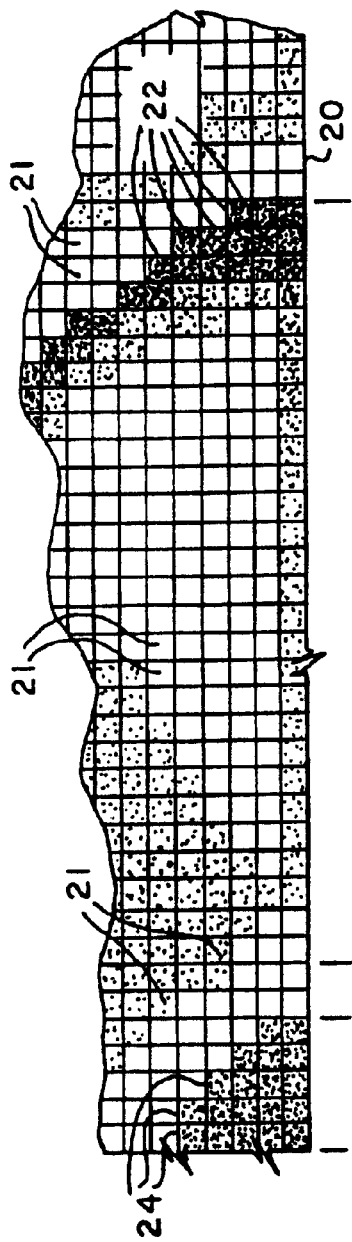
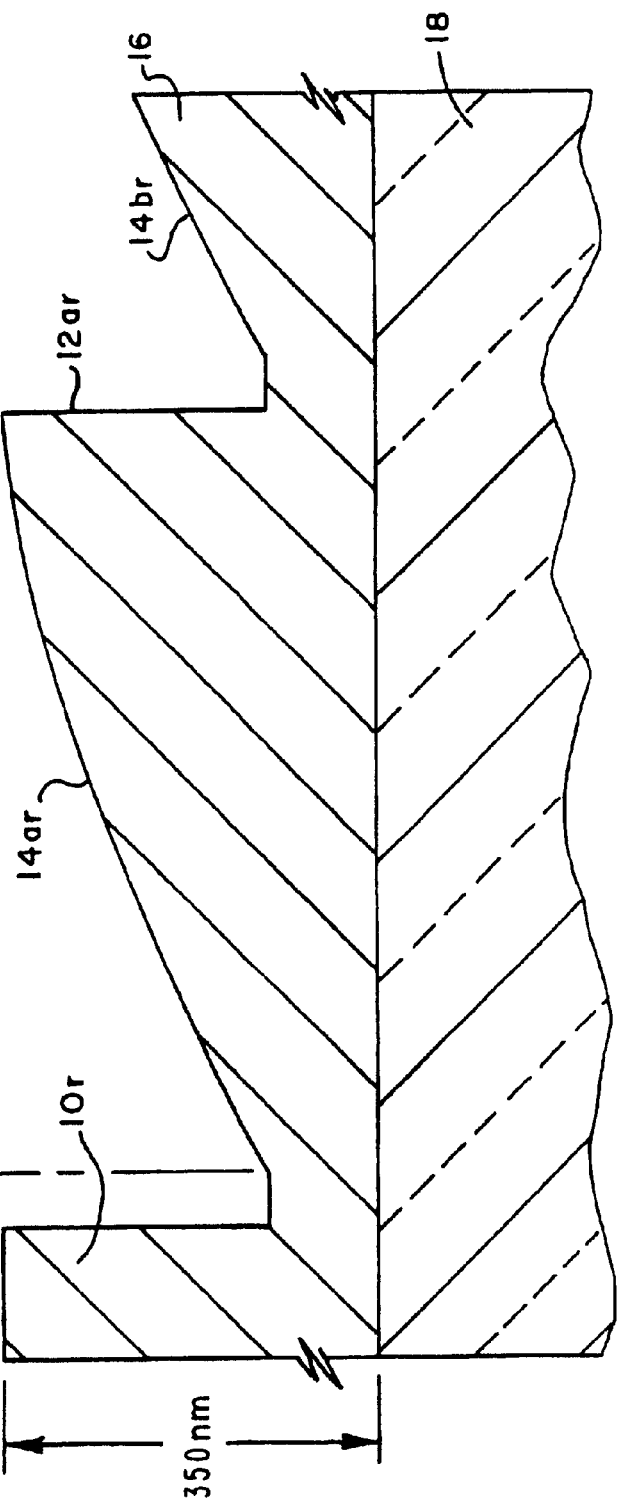

GRAY SCALE ALL-GLASS PHOTOMASKS

CROSS REFERENCE TO RELATED APPLICATIONS

This is a continuation of U.S. patent application Ser. No. 09/934,218 filed Aug. 21, 2001, which is a continuation-in-part of U.S. application Ser. No. 09/507,039 filed Feb. 18, 2000, which is a continuation-in-part of U.S. application Ser. No. 08/961,459, filed Oct. 30, 1997, which claims priority from U.S. provisional application serial No. 60/030,258, filed Oct. 31, 1996.

BACKGROUND OF THE INVENTION

"High efficiency diffractive coupling lenses by three-dimensional profiling with electron lithography and reactive ion etching," by A. Stemmer et al, J. Vat. Sci. Technol. B 12 (6), November/December 1994, teaches three dimensional profiling of a photoresist and transferring the three-dimensional microstructures of photoresist into the substrate using reactive ion etching. Three-dimensional profiling of photoresist with electron beam direct write on photoresist however is not cost effective for production quantities. "Fabrication of diffractive optical elements using a single optical exposure with a gray level mask," Walter Daschner, et al, J. Vat. Sci. Technol. B 13 (6), November/December 1995 teaches generating a gray level mask with eight discrete gray levels by means of cycles of evaporation of Iconel and a following lift-off step. This gray level mask allowed to expose a multi-level DOE in a single optical exposure step for three-dimensional profiling of photoresist. CAIBE was used to transfer the analog resist structure into the substrate. The tight thickness control necessary in the Iconel evaporation steps makes this method of fabricating the gray level mask economically undesirable.

"Gray scale microfabrication for integrated optical devices," George Gal et al., U.S. Pat. No. 5,480,764, issued Jan. 2, 1996, teaches the fabrication of three-dimensional microstructures including photonic waveguide surface, lens surface, and inclined planar surface for use as a beam splitter in a photonic device, using a half tone gray scale photomask for three-dimensional profiling of photoresist and reproducing the photoresist replica in the substrate with differential ion milling. However, a half tone gray scale mask is not desirable due to limited resolution.

Other gray level mask fabrication methods have been demonstrated and show potential for mass fabrication. See for example: H. Andersson, M. Ekberg, S. Hard, S. Jacobson, M. Larsson, and T. Nilsson, Appl. Opt. 29, 4259, 1990; and Y. Oppliger, P. Sixt, J. M Mayor, P. Regnault, and G. Voirin, Microelectron. Eng. 23, 449, 1994. After the mask fabrication only a single-exposure step is necessary to generate a multilevel resist profile. These approaches, however, have limited resolution since silver halide-based photographic emulsion is used and the grayscale mask is a halftone mask, that is not a true gray scale mask.

The fabrication of microoptical elements such as refractive microlens arrays, diffractive optical elements, prism couples, and three-dimensional microstructures in general can be realized with the existing micro-fabrication methods normally used for the production of microelectronics. The well-established microfabrication technologies include photolithographic process and reactive ion etching. Photolithographic processes are employed to print a mask pattern in a photomask onto photoresist film, which is typically coated on a silicon wafer or a glass wafer. Commercially available photolithographic printers for microfabrication include contact and proximity printers, 1× projection printer, 1× steppers and 5× as well as 10× reduction steppers. Reactive ion etching is employed to transfer and/or replicate patterns in photoresist into the underlying substrate material. Commercially available systems include plasma etchers, inductive coupled plasma (ICP) and chemically assisted ion beam etchers (CAIBE).

For the fabrication of integrated circuits (IC) in microelectronics industry, a set of binary masks is used in the photolithographic process. The binary masks typically have IC patterns defined in a chrome film which is coated on a silicate glass plate, typically a fused silica glass plate. However, for the fabrication of microoptical elements, a gray scale photomask is needed to define the three dimensional microstructures.

A gray scale photomask carries patterns with areas of different transmittance. When the pattern is printed on photoresist, areas of different transmittance in the gray scale mask create areas of different thickness in photoresist after development. Therefore, a gray scale pattern in a gray scale photomask can be used to create predetermined 3D microstructures in photoresist film, which are then transferred and/or replicated into the underlying substrate material in a reactive ion etcher.

Instead of using a gray scale photomask a varied exposure in a photoresist can also be generated by directly exposing the photoresist with an e-beam writer or a laser beam writer. The developed 3D resist structure can then be transferred into underlying substrate material to produce microoptical elements. However, in this case no mask is created. Each element must be written one at a time, with no benefit from economies of scale. Namely, it is not cost effective for making microoptical elements in production quantities using this direct write method.

There have been several methods of making gray scale photomasks in the past, but each of them have a major shortcoming as described below.

U.S. Pat. Nos. 5,480,764 and 5,482,800 of Gal et al and an article by W. W. Anderson et al "Fabrication of Microoptical Devices" conference on Binary Optics 1993, pp. 255–269, teach half tone gray scale masks. According to this technique, the mask is created by constructing a plurality of precisely located and sized openings, the frequency and size of these openings produce the desired gray scale effect provided the mask pattern is blurred in the photolithographic process to print on photoresist. The smallest features of this mask are binary, either open or closed, i.e. on or off. A group of a large number of on and off spots is needed to create a gray scale resolution element. The gray scale resolution element appears for example as 80% transmittance or as 20% transmittance depending on the ratio of the number of the on-spots and off spots. Therefore, the resolution of a half-tone gray scale pattern is much reduced from that of a binary pattern in a chrome mask.

Photographic emulsion has been used to provide gray scale masks. A gray area consists of a number of silver grains and openings. The silver grains are totally opaque and the openings are totally transparent. Therefore, the photographic gray scale mask is also a half-tone mask. The gray scale resolution element of a photographic film is in general larger in size than that of the halftone gray scale chrome mask. This is because the silver grains in a developed photographic emulsion film are in general larger than an opening or a chrome spot that can be made in a chrome mask.

One improvement in the production of gray scale masks for use in fabricating microoptical elements has been realized with the provision of a gray scale mask wherein different thicknesses of a light absorbing material, such as Inconel are coated on a glass plate to form the gray scale mask (see U.S. Pat. No. 6,071,652 of Feldman, et al, Jun. 6, 2000). This gray scale mask could have the high resolution required for fabricating microoptical elements. However, one disadvantage of this technique is the cost of the mask generation, wherein multiple direct write steps on photoresist are required to provide the lift off process of the light absorbing material for each discrete thickness desired. The tight thickness control necessary in the material evaporation steps makes this technique economically undesirable.

The gray scale photomasks described above cannot be utilized for the fabrication of high quality micro-optical elements in production quantities, because of their failure to satisfy either one or both of the following requirements: 1.) a sub-micrometer gray scale resolution element, 2.) acceptable cost in the mask generation.

High Energy Beam Sensitive (HEBS) glasses were described in U.S. Pat. Nos. 4,567,104, 4,670,366, 4,894,303, 5,078,771, and 5,285,517 (Wu patents herein after) by Che-Kuang Wu who is also known as Chuck Wu, the latter name is used in some of his publications in technical journals. The size of a gray scale resolution element in an HEBS-glass gray scale mask is limited only by the e-beam darkened spot size recorded in the high energy beam sensitive glass plate. It is typically 0.1 micrometer to 0.4 micrometer depending on the acceleration voltage of the electron beam and on the electron dosage. It is obvious that an HEBS-glass gray scale mask satisfies the high resolution requirement. However, the HEBS-glass plates of Wu patents did not satisfy the second requirement listed in the paragraph immediately above. The reason for not being able to satisfy the requirement of acceptable cost in the mask generation is elaborated below:

1. To render HEBS-glass of Wu patents opaque, the required e-beam dosage is typically about 1,000 microcoulomb/cm$^2$. This should be compared with the sensitivity of the electron beam resist used in IC industry to fabricate the binary chrome photomask. The required e-beam dosage for the electron beam resist employed by the mask shops in IC industry ranges from 0.1 to 1 microcoulomb/cm$^2$. HEBS-glass of the Wu patents has an e-beam sensitivity that is a factor of 1,000 to 10,000 times less than that of electron beam resist used in IC industry. 1,000 to 10,000 times less in sensitivity is herein after referred to as the sensitivity factor. Relative to photographic emulsion, HEBS-glass is also very insensitive. This is expected because there is not a development step for the HEBS-glass to enhance the contrast of the e-beam exposure induced optical density. The amplification in the optical density of a photographic film by a chemical development step is a factor of 10$^7$. Namely there is a contrast enhancement of ten million times from the latent image to the chemically developed image in a photographic emulsion film.

E-beam writers are very expensive, the write time of a mask has to be in the order of minute or hours, not days, otherwise there would be little economic value. E-beam exposure systems that are commercially available include flood electron beam exposure systems, raster scan e-beam pattern generators, variable shape beam vector scan e-beam pattern generators and Gaussian spot vector scan e-beam pattern generators. The price of the systems together with the write time for generating a mask determines the cost of making an HEBS-glass mask.

Flood e-beam exposure system, for example, EVC Electron Cure systems manufactured by Electron Vision Corp. are priced at about $250,000 each. Raster scan e-beam pattern generators, for example, MEBES systems manufactured by ETEC are priced at more than ten million dollars each. Variable shaped beam vector scan e-beam pattern generators, for example ZBA 23H manufactured by Leica Microsystems, Inc. are priced at about $6 million each. Gaussian spot vector scan e-beam pattern generators such as Vector Beam manufactured by Leica Microsystems, Inc. are priced at more than $6 million each.

Flood e-beam exposure system is ideally suited for HEBS-glass composition research for comparing the e-beam sensitivity among many glass compositions via uniformly exposing the entire area of many HEBS-glass plate samples in one exposure to an identical electron dosage.

However, flood e-beam exposure system, which is much less expensive, is not an option for making a photomask for the following reason. EVC Electron Cure systems has no capability of delivering an e-beam dosage having a predetermined functional variation in x and y coordinates. An Electron Cure 30 flood e-beam exposure system provides an 8 inch diameter beam to uniformly expose an area of up to 8 inch diameter. HEBS-glass of Wu patents are typically darkened to 1 unit of optical density value under the flood gun exposure for about 10 minutes. If one aperture down the beam size of the EVC Electron Cure system to 0.1 micron spot to write a gray scale pattern in HEBS-glass, it would take 10$^{10}$ minutes or in other words, 6.9 million days, to expose a pattern size of 1 cm×1 cm area. Moreover, there exists no fixture in EVC Electron Cure system for precision movements of an aperture in the X-Y plane to create a mask pattern. U.S. Pat. No. 5,468,595 of William R. Livesay teaches a method of controlling the solubility of photoresist layer in the depth dimension, i.e. Z-axis, through flood exposure on photoresist a uniform electron dosage in X-Y plane. This is accomplished by the electron beam having a controlled acceleration voltage. This method is not applicable and is undesirable for making a HEBS-glass gray scale photomask for the following reason. The gray scale patterns in a photomask have to be in one plane (X-Y plane) without variation in the thickness dimension so that all patterns in the mask can be in focus simultaneously during the photolithographic printing process.

During the months of March and April of 1987, Motorola, one of the world's largest manufacturers of integrated circuits (i.e. IC chips), evaluated the HEBS-glass plates of Wu patents for use as a binary mask for IC photomask applications and concluded that HEBS-glass plates of Wu patents require too much e-beam write time creating a high cost of mask generation. This deterred their use of HEBS-glass photomask. Motorola's evaluation report of 6-25-87 stated "Numerous hours of e-beam write time are required to produce one photomask. This condition is totally unacceptable on Motorola's present and future mask making plans." This began the search for new applications for HEBS-glass of Wu patents. The possibility of making a gray scale photomask using HEBS-glass of Wu patents was pursued. In 1988, gray scale test patterns were written with a MEBES e-beam writer using the number of retraces as a variable parameter to vary the electron dosage. CMI purchased an EVC Electron Cure 30 flood e-beam exposure system and a Hitachi Spectrophotometer Model u2000 for the purpose of HEBS-glass composition research, in search of a much improved e-beam sensitivity. Glass batches of a large number of different glass compositions were melted in alumina crucibles. Ground and polished glass plates from the glass melts were ion-exchanged in acidic aqueous solution containing silver nitrate to produce HEBS-glass plates. Groups of 5 to 10 HEBS-glass plates, typically in sizes up to about 0.5"×1" each were exposed together in the 8" diameter electron beam of the Electron Cure 30 with an electron dosage of 400 microcoulomb/cm2. Spectral absorption curves of the darkened HEBS-glass plates were measured with Hitachi Spectrophotometer Model u2000 in order to compare the e-beam sensitivity among the compositions of glass melts for further iterations of glass melts in the optimization of the HEBS-glass compositions.

2. The industrial standard mask making tool is a MEBES e-beam writer. In the IC industry, only binary photomasks are required, and all commercial photomask shops in the U.S. use MEBES systems to write the binary photomasks for the fabrication of IC chips. The MEBES system is a raster scan system. An electron beam is raster scanned in a serial manner to each and every address of for example $10^{10}$ addresses in a 1 cm×1 cm area when a 0.1 micron addressing grid size is chosen. Patterns are generated by blanking or un-blanking the beam at each address. The raster scan is done at a fixed constant rate for each MEBES system; for example at 160 MHz rate, the e-beam dwell time at each address is 6.25 nanosecond. To produce a gray scale pattern in a HEBS-glass plate, it is necessary that the electron dosage at each address is predetermined by the design of the gray scale pattern. Since the MEBES system have a constant dwell time of 6.25 nanoseconds for each of all addressing grid points and the e-beam dwell time cannot be varied from one address to the next address, a gray scale pattern in a HEBS-glass plate can only be generated with multiple retraces. This exposure scheme is impractical for making HEBS-glass gray scale photomasks.

A gray scale pattern of continuously varying optical density on a HEBS-glass plate requires a large number of gray scale levels. Gray scale patterns having more than 1,000 gray levels can be produced in a HEBS-glass plate when a practical exposure scheme becomes available. Using a raster scan e-beam writer, the write time of writing one gray scale level in a HEBS-glass plate would be the same as that of writing a binary chrome mask if the e-beam sensitivity of a HEBS-glass plate is identical to that of an electron beam resist. However, the write time of generating a gray scale photomask in a HEBS-glass plate is the write time of a binary chrome mask multiplied by the sensitivity factor of 1,000 to 10,000 and then multiplied by the number of gray scale levels. For a HEBS-glass gray scale photomask having 1,000 gray scale levels, 1,000 retraces is required and the write time would be at least 1,000,000 times that of writing a binary chrome mask. In other words, the throughput of making a HEBS-glass mask with 1,000 gray levels is 1,000,000 times lower relative to making a binary chrome mask. The write time of a binary chrome mask is typically more than 1 hour at a cost of about $1,000 per hour of e-beam write time. The cost of e-beam write time, e.g. 1,000,000 hours to write 1 plate clearly prohibits the use of a HEBS-glass plate of Wu patents to make a gray scale photomask.

Besides the prohibitive cost, the technical feasibility of making a HEBS-glass gray scale mask is doubtful due to the properties of HEBS-glass described immediately below:

1. The heat effect of HEBS-glass is described in the section "Heat Effect of the Write Beam" in this application, and is also described in an article co-authored by Wu and E. B. Kley et al "Adapting existing e-beam writers to write HEBS-glass gray scale masks" in Proceedings of SPIE Vol. 3633 (January 1999). The heat effect increases the sensitivity of HEBS-glass, but the heat effect is a strong function of exposure beam sizes and shapes. As a consequence, for a constant e-beam exposure dosage, the e-beam induced optical density in HEBS-glass is not a constant value and is a function of exposure beam size and shape. This property of HEBS-glass restricts the utilization of the advantages of the exposure scheme inherent in a variable shape beam system for increasing the throughput of writing a mask pattern.

2. The e-beam darkening mechanism of HEBS-glass includes an intermittence effect in addition to the heat effect. The e-beam darkening mechanism is not known with certainty and is postulated as follows. In the presence of a high energy electron beam (e-beam), some of Cl– ion and Ag+ ion in the silver halide alkalihalide complex crystal or complex microphases in the integral ion exchanged surface glass layer of a HEBS-glass plate react with energetic electrons to produce Cl atom and Ag atom. Cl atom and Ag atom are not stable species and a reverse reaction takes place simultaneously. A third reaction process also occurs simultaneously wherein portions of Cl atom and Ag atom become stable species of $Cl_2$ and Silver specks $Ag_n$ with the help of lattice vibrations as described in the section "Heat Effect of the Write beam" in the above application.

If the e-beam exposure is done with intermittence such as an exposure with multiple retraces, the e-beam induced optical density in a HEBS-glass plate resulting from a constant total exposure dosage of multiple retraces is not a constant value, but is a function of the intermittence time duration. This is because the intermittence time duration contributes additional time duration for the formation of the stable species of $Cl_2$ and silver specks and retards the reverse reaction of Cl atom and Ag atom back to Cl– ion and Ag+ ion, due to the reduced concentration of Cl atom and Ag atom. Due to the intermittence effect, exposure schemes with multiple retraces is complicated by the additional variable parameter, the intermittence time duration. The intermittence effect is described in the article co-authored by Wu and E. B. Kley et al "Adapting Existing E-beam Writer to Write HEBS-glass Gray Scale Masks" in Proceedings of SPIE vol. 3633, January 1999.

In the IC industry, direct write on photoresist to generate binary IC patterns is benefited from the choice of a variable shaped beam system to increase the throughput of pattern generation. However, for the fabrication of HEBS-glass photomasks, an exposure scheme utilizing a variable shaped beam does not produce a constant value of e-beam induced optical density in HEBS-glass for a constant e-beam exposure dosage, particularly when a high e-beam current density is used. Therefore, the fabrication of HEBS-glass gray scale photomasks using an exposure scheme with a variable shaped beam requires multiple retraces and a low current density, and thus the throughput of writing the HEBS-glass mask is further reduced.

MEBES e-beam writers, the only e-beam writers commercially available for mask writing service, do not provide a practical exposure scheme for making HEBS-glass gray scale masks. A raster scan e-beam system can write at a very high data rate, which is ideally suited for writing a binary mask. For a gray scale mask requiring many gray scale levels such as 1,000 gray scale levels, 1,000 retraces is needed to write 1 mask using a raster scan e-beam writer. A vector scan e-beam writer with a capability of changing dwell time at each address on the fly may not require multiple retraces to write a HEBS-glass gray scale mask. Therefore, C. Wu set forth to look for e-beam writing tools that are designed for R&D purposes in the universities. CMI (Canyon Materials, Inc.) product information No. 94-88 "HEBS-glass Photomask Blanks" was prepared by C. Wu in Dec. 1994, for the purpose of encouraging researchers and e-beam operators in the university to test write HEBS-glass plates.

On Apr. 13, 1995, C. Wu visited Mr. Robert Stein, who was an e-beam operator at UCSD (University of California, San Diego), and showed Mr. Stein e-beam written plates of HEBS-glass. The HEBS-glass plates were written with a MEBES e-beam writer. Test patterns with variation of optical density were written with different numbers of retraces.

After explaining to Mr. Stein the e-beam direct write phenomenon, Mr. Stein agreed to test write on a HEBS-glass plate using an EBMF 10.5 e-beam writer.

By May 24, 1995, Mr. Stein finished writing a HEBS-glass plate with EBMF 10.5 e-beam writer using various beam currents at 30 kv and at 20 kv. An addressing grid size of 0.1 micron was employed. Sixteen gray levels were generated with each setting of beam current and kv combinations using 16 clock rates.

C. Wu had Mr. Walter Daschner examine the gray scale pattern in the HEBS-glass plate written by Mr. Stein, and met with Mr. Daschner, a graduate student under Professor S. H. Lee, on Jun. 12, 1995 at 10AM at UCSD for the first time. During the meeting C. Wu presented to Mr. Daschner a copy of CMI Product Information No. 94-88 "HEBS-glass Photomask Blanks," one plate of a HEBS-glass photomask blank, and a copy of U.S. Pat. No. 5,078,771 "Method of Making High Energy Beam Sensitive Glass." This meeting led to joint research and the following publications that C. Wu co-authored with others:

A. "General aspheric refractive micro-optics fabricated by optical lithography using a high energy beam sensitive glass gray-level mask" by Walter Daschner, Pin Long, Robert Stein, Chuck Wu, and S. H. Lee, in J. Vac. Sci. Technol. B 14(6), November/December 1996.

B. "Cost-effective mass fabrication of multilevel diffractive optical elements by use of a single optical exposure with a gray-scale mask on high energy beam-sensitive glass" by Walter Daschner, Pin Long, Robert Stein, Chuck Wu, and S. H. Lee, in Applied Optics, Vol. 36, No. 20, Jul. 10, 1997.

CMI Product Information No. 94-88 was cited as reference No. 11, and as reference No. 7 in the above listed publication A of November/December 1996 and B of Jul. 10, 1997, respectively.

Based on the results of written HEBS-glass plates by Mr. Stein, C. Wu, being the Chairman of Canyon Materials, Inc., caused Canyon Materials, Inc. to purchase a EBMF 10.5 e-beam writer from Leica Microsystems, Inc. for the purpose of developing an e-beam exposure scheme and optimizing e-beam write parameters for making gray scale photomasks using HEBS-glass plates, and for commercializing HEBS-glass gray scale photomasks. Before the EBMF 10.5 e-beam writer became available in-house, CMI purchased write time of EBMF 10.5 e-beam writer from UCSD for the above stated purposes.

C. Wu also conducted other efforts to write HEBS-glass plates using other e-beam writers and efforts to write LDW glass plates using laser beam pattern generators through joint efforts with other research institutions and universities in the US as well as abroad. These other efforts result in, for example, the following 3 publications that C. Wu co-authored:

C. "Adapting existing e-beam writers to write HEBS-glass gray scale masks" by E.-Bernhard Kley, Matthias Cumme, Lars-Christian Wittig, and Chuck Wu, in Proceedings of SPIE Vol 3633, January 1999.

D. "Applications of gray scale LDW-glass masks for fabrication of high-efficiency DOEs" by V. P. Korolkov, A. I. Malyshev, V. G. Nikitin, A. G. Poleshchuck, A. A. Kharissov, V. V. Cherkashin, and C. Wu, in Proceedings of SPIE Vol. 3633, January 1999.

E. "Fabrication of gray scale masks and diffractive optical elements with LDW-glass" by Victor Korolkov, Anatoly Malyshev, Alexander Poleshchuk, Vadim Cherkashin, Hans Tiziani, Christof Prub, Thomas Schoder, Johann Westhauser, and C. Wu, in Proceedings of SPIE Vol. 4440, July 2001.

It is not at all obvious and is a total surprise that the high throughput of e-beam writing HEBS-glass gray scale photomasks such as mask No. 81, 82, 83, and 84 were produced. The surprise is that the 1,000,000 times too low throughput of making a HEBS-glass mask has been overcome by the combined efforts of the glass compositions of this application and an e-beam exposure scheme optimized for the properties of the HEBS-glass of this application. Mask No. 81, 82, 83, and 84 were written with an EBMF 10.5 e-beam writer using the write parameters necessary for producing the combined effects. These write parameters of the exposure scheme are described in the section "Description of the Invention" of this application. EBMF 10.5 is a Gaussian spot vector scan e-beam writer manufactured by Leica Microsystems, Inc. This e-beam writer is a research tool and is not available in commercial mask shops for IC photomask fabrication. The write parameters necessary for producing the combined effects of this application has never been and can never be applied to expose electron beam resists for which the e-beam writers were designed. This is because the e-beam power that generates the heat effect for the enhanced e-beam sensitivity in HEBS-glass, would burn or decompose the electron beam resist. The e-beam power is the input-power density defined as (beam current)×(beam acceleration voltage)/(beam spot size) in the section "Heat Effect of the Write E-Beam" of this application.

HEBS-glass gray scale mask No. 81 having 1,000 gray scale levels was written in 1 hour, 14 minutes, and 26 seconds. This gray scale mask is fabricated for making 50 copies of 100 micron×6 mm prism couples in each contact print on wafer. Each prism couple has a right angle triangular cross section of 2 micron height and is 6 mm long. The gray scale pattern for each prism has 1,000 gray levels. There is no other product, apparatus, or method that could produce such a gray scale mask at the cost of a HEBS-glass mask.

HEBS-glass gray scale mask No. 82 having 100 gray scale levels was written in 57 minutes 35 seconds. This gray scale mask is fabricated for making blazed gratings having a 20 micron pitch in fused silica glass wafer using a contact printing process. The micron pitch grating is 10 mm long, and has 500 periods. The grating is 1 cm×1 cm in size.

HEBS-glass gray scale mask No. 83 having 23,040 lens patterns, each of 100 gray scale levels was written in 13 hours 12 minutes and 1 second. A large portion of the e-beam write time is consumed by data loading since circular patterns with a large number of gray levels require a very large data file. This gray scale mask is fabricated for making 1×40 arrays of refractive microlenses for fiber optical interconnect. Each lenslet has 200 micron diameter and 100 gray levels. There are 576 dies in the mask pattern, each die being a 1×40 lens array.

HEBS-glass gray scale mask No. 84 having 62,500 lens patterns, each of 57 gray scale levels, was written in 3 hours and 36 minutes. This gray scale mask is fabricated for making a 250×250 array of refractive microlenses. Each lenslet is a 40 micron×40 micron square lens having 57 gray levels in the HEBS-glass mask. The array has 100% fill factor for use in detector enhancement. To create an array of square lenses (100% fill factor), a circular lens whose diameter is the diagonal of the square, i.e. 56.56 micron in this case, with the appropriate number of gray levels is created, trimmed into a square, and stepped and repeated to create the lens array. Each gray level of the mask is a layer in the data file.

Based on the postulated model of e-beam darkening mechanism in HEBS-glass described herein, high throughput of e-beam patterning HEBS-glass gray scale photomasks is made possible as follows:

1. In the section of this application "Heat Effect of Write Beam" the e-beam darkening mechanism is elaborated. The formation of a silver speck consisting of 2, 3, or more atoms requires the deformation of silver halide lattice to silver lattice. Cycles of lattice vibration of sufficient amplitudes are necessary to cause the formation of the silver specks. Since larger amplitudes of lattice vibrational modes exist at higher temperatures, silver specks are formed more quickly at a higher temperature. HEBS-glass compositions No. 1 to No. 20 represent the HEBS-glass compositions of this invention having produced silver halide alkalihalide complex crystals, in the integral ion exchanged surface glass layer of the HEBS-glass plates, that are optimized to maximize the e-beam sensitivity enhancement of the heat effect. The relative concentrations as well as the total concentration of alkali oxides, i.e. $Li_2O$, $Na_2O$ and $K_2O$ are among the more important parameters of the base glass composition that determine the heat enhanced e-beam sensitivity of the silver halide alkalihalide complex crystals. Other variable parameters of the HEBS-glass compositions of this application are represented in Exhibit A of the application.

2. The acceleration voltage of an electron beam among all the commercially available e-beam writers ranges from 1 kV to 100 kV. In other words, the kinetic energy of electrons in the e-beam writer ranges from 1 keV to 100 keV. When a high energy electron enters into any solid material, i.e. HEBS-glass in this application, it creates secondary electrons and third generation electrons due to electron-electron collision. For example, a 100 keV electron penetrating HEBS-glass could in principle produce up to 100,000 energetic electrons, each having a kinetic energy of 1 ev on the average. The secondary and third generation electrons are the energetic electrons that cause the chemical reaction of Cl− ion and Ag+ ion to form Cl atoms and Ag atom. A higher kV electron beam creates a larger number of energetic electrons. However, the bulk of the energetic electrons exists deeper into the thickness dimension from the HEBS-glass surface as the acceleration voltage of e-beam increases. By adjusting the thickness dimension, i.e. $x_1$ and $x_2$ (see FIG. 1 of the Application) of the ion exchanged surface glass layer of a HEBS-glass plate, the bulk of the energetic electrons can be captured within the e-beam sensitized glass layer. However, to produce a gray scale photomask with a high resolution capability in a photolithographic process, a smaller value of $(x_2-x_1)$, such as less than 3 micron is necessary. Therefore, for each of the glass compositions No. 1 to No. 20 of Exhibit A of the Application, $x_1$ and $x_2$ values were optimized for a maximum sensitivity to 20 kV electron beam to produce HEBS-glass plate No. 1 to No. 20. Although HEBS-glass plate No. 1 to No. 20 were optimized for the penetration depth of a 20 kV electron beam, a 30 kV electron beam in general produces a higher OD (Optical Density) value with the same electron dosage. This is due in part to a stronger heat effect described above.

High throughput of e-beam patterning HEBS glass gray scale masks is made possible by maximizing the heat enhanced e-beam sensitivity of the HEBS-glass compositions of this application and writing gray scale patterns in HEBS-glass plates with an exposure scheme that produced the combined effects described herein. The exposure scheme employed for the high throughput writing of HEBS-glass plates is not available from the e-beam writers such as MEBES that are typically utilized by IC photomask shops.

U.S. Pat. Nos. 4,567,104; 4,670,366; 4,894,303; and 078,771 and 5,285,517, all of inventions of Che-Kuang Wu, described High Energy Beam Sensitive glass (HEBS-glass) articles exhibiting insensitivity and/or inertness to actinic radiation, the HEBS-glass articles which are darkened and/or colored within a thin surface layer of about 0.1–3 micron upon exposure to a high energy beam, electron beam, and ion beams in particular, without a subsequent development step, and which need no fixing to stabilize the colored image, since both the recorded image and the glass article are insensitive to radiation in the spectral range of uv and longer wavelengths. These patents are concerned with Ag+ ion-exchanged glass articles having base glass within alkali metal silicate composition fields containing at least one of the oxides of transition metals which have one to four d-electrons in an atomic state. The base glass composition can be varied widely, spontaneous reduction upon ion-exchange reaction as well as photo-reduction of Ag+ ions are inhibited and/or eliminated due to the presence of said transition metal oxides in the. glass article. The HEBS-glass is suitable for use as recording and archival storage medium and as phototools. The recorded images and/or masking patterns are up-dateable, can be any single color seen in the visible spectrum, and is erasable by heat at temperatures above 200° C. Heat erasure mode of recording the high energy beam darkened glass article using a high intensity light beam, focused laser beam in particular, was also described.

Diffractive optics technology is maturing see for example, the publication by C. W. Chen and J. S. Anderson, "Imaging by diffraction: grating design and hardware results," in Diffractive and Miniaturized Optics, S. H. Lee, ed., Vol. CR49 of SPIE Critical Reviews Series (Society of Photo-Optical Instrumentation Engineers, Bellingham, Wash., 1993) pp. 77–97. Diffractive Optical Elements (DOE's) of various designs have been found useful for improving the design and performance of optical systems. Instead of using the binary method, such as described in "Binary Optics Technology: The Theory and Design of Multi-level Phase Diffractive Optical Elements" by G. J. Swanson of MIT, documented in MIT Tech. Rep. 854. (MIT, Cambridge, Mass., 1989), a cost-effective way of fabricating large numbers of DOE's in the shortest possible turnaround time has become increasingly important. Gray scale mask fabrication methods offer these features by drastically reducing the amount of processing steps involved to generate a multilevel and monolithic DOE. Currently multiplexing schemes exist to fabricate a quasi-gray-scale mask by changing the number of area openings in a binary mask (similar to the halftone method) or by photographic emulsions. These approaches were described by Y.Opplinger et al. in Microelectron Eng. 23, 449–454 (1994) and by H. Anderson et al. in Appln. Opt. 29, 4259–4267 (1990). Other methods of fabrication of gray-scale masks involve the cumberstone task of multiple binary exposures and following evaporation steps such as described by W. Daschner, et al. in J. Vac. Sci. Technol. B 13, 2729–2731 (1995). The High Energy Beam Sensitive (HEBS) glass of the present invention offers the advantage of a one-step fabrication of true gray-scale masks.

The continuing development of exceedingly small or so-called micro-devices such as micro-optic elements and micro-machines is of great importance to optoelectronic interconnection technologies and the development of communications and control systems. Diffractive optical elements such as spherical, cylindrical, Fresnel lenses, asperics and other micro-devices having rather precise three dimensional profiles or contours present certain problems with respect to volume production of these elements of an acceptable quality, in particular. The fabrication of large arrays of such elements covering large areas is very costly with regard to known methods of production.

One technique for mass production of diffractive optical elements involves fabricating a master element which itself is made by etching processes similar to those used in the fabrication of micro-electronic circuits and similar devices wherein a multi-masking process using binary masks is conducted. The fabrication of a master or individual elements using a multi-binary mask method can result in significant dimensional errors in the master and the fabricated element due to residual alignment errors between consecutive masking steps. Although diamond turning, for example, can be employed in producing a master element, the multi-binary mask technique is limited with symmetric elements, for example. Still further, diffractive optical elements can be produced by injection molding, embossing or casting. However, the materials used in these techniques have limited optical and environmental properties, and are, for example, operable to be transmissive to radiation only in the spectral range visible to the human eye.

Some of the disadvantages of prior systems including those mentioned above have been overcome with the development of so-called gray scale masks which avoid multiple processing steps by providing a single mask which contains all of the information necessary for generating multi-phase levels, i.e., the three-dimensional contours required in a diffractive optical element and the like. Photographic emulsions have been used to provide gray scale masks which can be generated using a laser writer or an optical imaging system, for example. However, the high resolution required of diffractive optical elements and other micro-elements is limited with this technique due to the limited resolution of the laser writer and the graininess of the image on the emulsion based mask. Moreover, photographic emulsions are not particularly durable and do not allow cleaning of the mask with water or mechanical scrubbing.

Other gray scale masking techniques, including the so-called half tone binary mask, are also limited due to the small holes in the mask which will also diffract light passing through the mask, further limiting the resolution of the desired diffractive optical element, for example.

One improvement in the production of gray scale masks for use in fabricating diffractive optical elements and other micro-elements has been realized with the provision of a gray scale mask wherein different thicknesses of a light-absorbing material, such as Inconel, coated on a glass plate mask element, for example, can provide for the fabrication of a gray level mask with high resolution and compatibility with substantially all wavelength ranges used in optical lithography. However, one disadvantage of this technique is the cost of the mask generation method wherein multiple direct write steps are required to provide the lift off process of the light-absorbing material for each discrete thickness desired. The tight thickness control necessary in the material evaporation step makes this technique somewhat economically infeasible for many applications.

The use of a gray scale mask fabrication method for producing large quantities or large arrays of diffractive optical elements and similar micro-elements requiring high resolution of three dimensional contours has several advantages. Gray. scale masks require only a single exposure of a photoresist when fabricating the elements on a substrate using an etching process. Gray scale masks thus avoid the alignment errors resulting from processes requiring the use of multiple binary masks. Moreover, if a suitable gray scale mask material is provided, thermal expansion and contraction of the mask can also be avoided.

Accordingly, there has been a continuing need to develop an improved fabrication method for relatively large quantities of and large arrays of micro-elements, such as diffractive optical elements or other elements covering large areas, such as computer generated holograms. It is to these ends that the present invention has been developed.

SUMMARY OF THE INVENTION

Since there is no graininess, HEBS-glass is capable of resolution to molecular dimensions. HEBS-glass turns dark instantaneously upon exposure to an electron beam, the more electron dosage the more it darkens. Therefore, HEBS-glass is ideally suited for making gray level masks. HEBS-glass gray level masks can be written with an e-beam writer using a 0.1 $\mu$m addressing grid size. Every 0.1 $\mu$m spot in the 5"×5" HEBS-glass plate acquires a predetermined transmittance value ranging from 100 percent down to less than 0.1 percent upon e-beam patterning with a predetermined dosage for each address. A gray level mask made of HEBS-glass does not relay on a halftone method. Therefore, it is a true gray level mask.

It is the objective of the present invention to design HEBS-glass compositions so that the HEBS-glass gray level mask of the present invention facilitates new designs and low cost manufacturing processes for high-performance diffractive optics; asymmetric, irregularly shaped microlens arrays; and general three dimensional surfaces.

Application of the HEBS-glass of the present invention include micro-optical devices, microelectrical devices, micro-opto-electromechanical devices, integrated optical devices, two-dimensional fanout grating, optical interconnect, fiber pigtailing, diffractive optical elements, refractive microlens arrays, microprism arrays, micromirror arrays and Bragg grating.

The essential properties of a HEBS-glass gray level mask which is necessary for the fabrication of general three dimensional microstructures are:

1. A mask pattern or image is grainiless even when observed under optical microscope at 1000× or at higher magnifications.

2. The HEBS-glass is insensitive and/or inert to photons in the spectral ranges employed in photolithographic processes, and is also insensitive and/or inert to visible spectral range of light so that a HEBS-glass mask blank and a HEBS-glass mask are permanently stable under room lighting conditions.

3. The HEBS-glass is sufficiently sensitive to electron beam exposures, so that the cost of making a mask using an e-beam writer is affordable for many applications. 4. The e-beam induced optical density is a unique function of, and is a very reproducible function of electron dosages for one or more combinations of the parameters of an e-beam writer. The parameters of e-beam writers include beam acceleration voltage, beam current, beam spot size and addressing grid size.

The essential properties No. 1 and No. 2 are properties of HEBS-glasses described in the US patents listed above. However, HEBS-glass compositions having a better e-beam sensitivity is in general more sensitive to photon energy as well.

It is the objective of the present invention to optimize HEBS-glass composition so that the HEBS-glass of the present invention is sufficiently sensitive to electron beam and that the cost of writing a gray level mask is affordable for many applications, and yet HEBS-glass of the present invention is totally inert to actinic radiation of 436 nm and longer wavelengths and has no sensitivity to actinic radiation at 365 nm for practical purposes, eg. no significant darkening for 1,000,000 exposures in I-line steppers.

It has been determined that with a given value of e-beam exposure dosage the e-beam induced optical density in HEBS-glass is a function of beam acceleration voltage, of beam spot size, of beam current and of addressing grid size. Therefore, it is another objective of the present invention to design e-beam write schemes such as that the essential properties No. 3 and No. 4 of a HEBS-glass gray level mask are both fulfilled.

The present invention is directed to a gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na., an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$.

In one embodiment, at least one gray scale zone has a continuous gray scale comprising a plurality of grade scale levels.

The present invention is also directed to a method of making a gray scale mask comprising writing on a plurality of areas on at least a portion of a High Energy Beam Sensitive-glass (HEBS-glass) with an electron beam having an acceleration voltage of 20 to 30 kiloVolts, a beam current of 25 to 175 nanoamps, and addressing a grid size of 0.1 to 0.4 micron; the writing carried out at an electron dosage that falls on the net optical density vs. electron dosage sensitivity curve of the High Energy Beam Sensitive-glass, the initial slope of the sensitivity curve being from 2.454 to 12.507 per electron dosage unit of milli-coulombs/cm$^2$; the exposure duration of the writing on each area are different than the exposure duration of the immediate adjacent areas; the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$.

The present invention is also directed to a method of making a three dimensional microstructure with three dimensional surfaces in a photoresist comprising exposing a photoresist to a gray scale pattern in a gray scale mask using an optical lithography tool and developing the exposed photoresist to form three dimensional microstructures in the photoresist;

the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of mlli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$.

The present invention is also directed to an analog photoresist with a three dimensional microstructure produced by exposing a photoresist to a gray scale pattern in a gray scale mask using an optical lithography tool and developing the exposed photoresist to form the three dimensional microstructure in the photoresist; the gray scale mask comprising:

A gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$ 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a method of producing three dimensional microstructures in substrate material comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is directed to a component having a three dimensional microstructure selected from the group consisting of tapered structures for microelectronics, micro-optical devices, integrated optical components, micro-electro-mechanical devices, micro-opto-electro-mechanical devices, microelectrical devices, diffractive optical elements (DOE), refractive microlens arrays, micromirror arrays, and diffractive microlens arrays; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and
(b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a component having a three dimensional microstructure selected from the group consisting of electrical connections between two metallic layers separated by tapered structures of thick polyimide, bifocal intraocular lenses, widely asymmetric DOE, random phase plate DOEs, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separation, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro-mechanical sensors and actuators, micro valves, inertial micro sensors, micro machined RF switches, GPS component miniaturization devices, laser scanners, optical shutters, dynamic micro mirrors, optical choppers and optical switches; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is directed to a method of producing a component having a three dimensional microstructure selected from the group consisting of tapered structures for microelectronics, micro optical devices, integrated optical components, micro-electro-mechanical devices, micro-opto-electro-mechanical devices, diffractive optical elements, refractive microlens arrays, diffractive microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask using an optical lithography tool and developing the exposed photoresist to form three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a method of producing a component having a three dimensional microstructure selected from the group consisting of electrical connections between two metallic layers separated by tapered structures of thick polyimide, bifocal intraocular lenses, widely asymmetric DOE, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separations, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro-mechanical sensors and actuators, micro valves, inertial micro sensors, micro machined RF switches,.GPS component miniaturization devices, laser scanners, optical shutters, dynamic micro mirrors, optical shoppers and optical switches; the microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask using an optical lithography tool and developing the exposed photoresist to from three dimensional microstructures in the photoresist; the gray scale mask comprising a transparent High Energy Beam Sensitive-glass (HEBS-glass) having at least one gray scale zone with a plurality of gray scale levels, each gray scale level having a different optical density, the High Energy Beam Sensitive-glass in bodies of 0.090 inch cross section will exhibit the following properties:

(a) a transmittance of more than 88% at 436 nm; and (b) upon exposure to an electron beam using an electron beam pattern generator operated with a write scheme having a value of acceleration voltage selected from 20 to 30 kV, an addressing grid size of from 0.1 to 0.4 micrometer, and a value of beam current selected from 25 to 250 na, an electron beam darkening sensitivity in the linear portion of the sensitivity curve, of at least 2.454 unit of optical density value in the spectral range of 365 nm to 630 nm per electron dosage unit of milli coulomb/cm$^2$; said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% being $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a Laser Direct Write-glass (LDW-glass) which is a High Energy Beam Sensitive-glass (HEBS-glass) having at least a portion uniformly darkened to a uniform optical density, said LDW-glass prior to being darkened with an electron beam is a transparent HEBS-glass which in bodies 0.090 inch cross section will exhibit the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

The present invention is also directed to a gray scale mask on a Laser Direct Write glass (LDW-glass) produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:
 (a) transmittance of more than 88% at 436 nm; and
 (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO2; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

In an alternative embodiment of the gray scale mark, the gray scale zone has a continuous gray scale comprising a plurality of grade scale levels.

The present invention is also directed to a method of making a gray scale mask comprising darkening at least a portion of a High Energy Beam Sensitive-glass (HEBS-glass) with an electron beam to form a Laser Direct Write-glass having uniformly darkened portion having a uniform optical density, the HEBS-glass in bodies of 0.090 inch cross section exhibiting the following properties:
 (a) transmittance of more than 88% at 436 nm; and
 (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

In one embodiment of the method, the focused laser beam exposure write time for each area exposed is different. In another embodiment of the method, the focused laser beam intensity for each area exposed is different. In still another embodiment of the method, the number of retraces of the focused laser beam writing for each area exposed is different.

The present invention is also directed to a method of making a three dimensional microstructure with three dimensional surfaces in a photoresist comprising exposing a photoresist to a gray scale pattern in a gray scale mask on a Laser Direct Write-glass (LDW-glass) using an optical lithography tool and developing the exposed photoresist to form three dimensional microstructures in the photoresist; A gray scale mask on a Laser Direct Write glass (LDW-glass) produced by darkening at least a portion of a High energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:
 (a) transmittance of more than 88% at 436 nm; and
 (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is also directed to an analog photoresist with a three dimensional microstructure produced by exposing a photoresist to a gray scale pattern in a gray scale mask on a Laser Direct Write-glass (LDW-glass) using an optical lithography tool and developing the exposed photoresist to form the three dimensional microstructure in the photoresist; the gray scale mask comprising: A gray scale mask on a Laser Direct Write glass (LDW-glass) produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a method of producing three dimensional microstructures in substrate material comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask on a Laser Direct Write-glass (LDW-glass) using an optical lithography tool and developing the exposed photoresist to form three dimensional microstructures in the photoresist; the gray scale mask comprising a LDW-glass having at least one gray scale zone with a plurality of gray scale levels, each gray scale level having a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a component having a three dimensional microstructure selected from the group consisting of tapered structures for microelectronics, microoptical devices, integrated optical components, microelectro-mechanical devices, micro-opto-electro-mechanical devices, microelectrical devices, diffractive optical elements (DOE), refractive microlens arrays, micromirror arrays, and diffractive microlens arrays; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask on a Laser Direct Write-glass (LDW-glass) using an optical lithography tool and- developing the exposed photoresist to form three dimensional microstructures in the photoresist; the gray scale mask comprising a LDW-glass having at least one gray scale zone with a plurality of gray scale levels, each gray scale level having a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a component having a three dimensional microstructure selected from the group consisting of electrical connections between two metallic layers separated by tapered structures of thick polyimide, bifocal intraocular lenses, widely asymmetric DOE, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separation, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro-mechanical sensors and actuators, micro valves, inertial micro sensors, micro machined RF switches, GPS component miniaturization devices, laser scanners, optical shutters, dynamic micro mirrors, optical choppers and optical switches; the component comprising a substrate having a three dimensional microstructure produced by exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process comprising exposing a photoresist to a gray scale pattern in a gray scale mask on a Laser Direct Write-glass (LDW-glass) using an optical lithography tool and developing the exposed photoresist to form three dimensional microstructures in the photoresist; the gray scale mask comprising a transparent High Energy Beam Sensitive-glass having at least one gray scale zone with a plurality of gray scale levels, each gray scale level having a different optical density, the gray scale produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and
(b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to. 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is directed to a method of producing a component having a three dimensional microstructure selected from the group consisting of tapered structures for microelectronics, micro optical devices, integrated optical components, micro-electro-mechanical devices, micro-opto-electro-mechanical devices, diffractive optical elements, refractive microlens arrays, diffractive microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask on a Laser Direct Write-glass (LDW-glass) using an optical lithography tool and developing the exposed photoresist to form three dimensional microstructures in the photoresist; the gray scale mask comprising a transparent High Energy Beam Sensitive-glass having at least one gray scale zone with a plurality of gray scale levels, each gray scale level having a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section exhibiting the following properties:

(a) transmittance of more than 88% at 436 nm; and
(b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/cm$^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% TiO$_2$; 1.1 to 2.4% Al$_2$O$_3$; 0 to 4.6% B$_2$O$_3$; 3.7 to 13.2% ZnO; 0.5 to 6% Cl; and 58.2 to 78.8% SiO$_2$;

and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

The present invention is also directed to a method of producing a component having a three dimensional microstructure selected from the group consisting of electrical connections between two metallic layers separated by tapered structures of thick polyimide, bifocal intraocular lenses, widely asymmetric DOE, miniature compact disc heads, antireflective surface, complex imaging optics, grating couples, polarization-sensitive beam splitters, spectral filters, wavelength division multiplexers, micro optical elements for head-up and helmet mounted display, micro optical elements for focal plane optical concentration and optical efficiency enhancement, micro optical elements for color separations, beam shaping, and for miniature optical scanners, microlens arrays, diffraction gratings, diffractive lenses, laser diode array collimators and correctors, micro optical elements for aberration correction, hybrid optics, microprism arrays, micromirror arrays, random phase plates and Bragg gratings, two dimensional fanout gratings, optical interconnects, signal switches, fiber pig tailing, DOEs for coupling laser light into a fiber, micro-electro-mechanical sensors and actuators, micro valves, inertial micro sensors, micro machined RF switches, GPS component miniaturization devices, laser scanners, optical shutters, dynamic micro mirrors, optical shoppers and optical switches; the microlens, and micromirror arrays, the method comprising exposing a substrate through a developed analog photoresist with a three dimensional microstructure with an ion beam in an ion beam etching system to transfer the three dimensional microstructure of the developed analog photoresist on to the surface of the substrate in a single step exposure; the analog photoresist with three dimensional microstructure being the product of the process of exposing a photoresist to a gray scale pattern in a gray scale mask on a Laser Direct Write-glass (LDW-glass) using an optical lithography tool and developing the exposed photoresist to from three dimensional microstructures in the photoresist; the gray scale mask comprising a transparent High Energy Beam Sensitive-glass having at least one gray scale zone with a plurality of gray scale levels, each gray scale level having a different optical density, the gray scale mask produced by darkening at least a portion of a High Energy Beam Sensitive-glass (HEBS-glass) with an electron beam to form a LDW-glass having a uniformly darkened portion having a uniform optical density, the HEBS-glass in bodies of 0.090 inch cross section will exhibit the following properties:

(a) transmittance of more than 88% at 436 nm; and
  (b) upon exposure to an electron beam using an electron beam pattern generator operated with a write scheme having a value of acceleration voltage selected from 20 to 30 kV, an addressing grid size selected from 0.1 to 0.4 micrometer, and a value of beam current selected from 25 to 250 na, an electron beam darkening sensitivity in the linear portion of the sensitivity curve of at least 2.454 unit of optical density value in the spectral range of 365 nm to 630 nm per electron dosage unit of milli coulomb/$cm^2$, said HEBS-glass having a base glass composition consisting essentially on the mole % oxide basis 11.4 to 17.5% of one or more alkali metal oxide, 2.4 to 10.2% of photosensitivity inhibitors and RS suppressing agents with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$; and exposing a plurality of areas on the uniformly darkened portion of the LDW-glass with a focused laser beam to form a gray scale zone with a plurality of gray scale levels, the optical density of each gray scale level differing from the optical density of adjacent gray scale levels, and the optical density of the darkest gray scale level not exceeding the optical density of the uniformly darkened portion of the LDW-glass.

A method of fabricating a three-dimensional micro-optic lens on a substrate selected from a group consisting of quartz glass, silicate glass, germanium and an optically transmissive material coated with a photoresist layer, comprising: providing a gray scale mask having a body portion and a surface layer formed thereon which is responsive to electron beam radiation to change the optical density of the surface layer; exposing the mask to an electron beam of selected charge density over a grid of discrete locations on the mask to provide a predetermined gray scale pattern of continuously varying optical transmissivity on the mask; exposing the photoresist layer to radiation transmitted through the mask; and removing material from the photoresist layer and the substrate to provide a predetermined varying thickness of the substrate as determined by the gray scale patterns on the mask.

The above method optionally including the step of generating said electron beam with a current of at least about 25 nA.

The above method optionally including the step of applying an electrically conductive coating to the mask prior to exposing the mask to said electron beam and removing said coating from the mask after exposing the mask to said electron beam.

The above method optionally including the step of removing material from said photoresist layer and said substrate by chemically assisted ion beam etching.

The above method optionally including the step of comparing a thickness of said photoresist layer which may be exposed to radiation with a corresponding electron beam charge density value required to darken said layer of the mask to provide a predetermined depth level in said substrate; and exposing the mask to said electron beam at a preselected charge density corresponding to the desired thickness of exposure of said photoresist layer.

Another method for producing various depth levels in a layer of photoresist material includes the steps of exposing a layer of photoresist material to radiation through a gray scale mask having areas of continuously varying transmissivity; removing photoresist material from said photoresist layer to depth in said photoresist layer at a predetermined position thereon corresponding to a predetermined transmissivity of said gray scale Mask at a corresponding predetermined position on said gray scale mask; and providing said gray scale mask as a glass article comprising a body portion and an integral ion exchanged surface layer which, upon exposure to a high energy electron beam, becomes darkened and is substantially insensitive to actinic radiation.

The above method optionally including the step of exposing said gray scale mask to selected discrete charge densities of electron beam radiation over a grid of preselected grid spacings and varying the electron beam charge density from one spacing to the next in accordance with a predetermined depth level desired to be produced in said photoresist layer.

The above method optionally including the step of comparing a thickness of said photoresist layer which may be exposed to radiation with a corresponding electron beam charge density value required to darken said gray scale mask to provide a predetermined depth level in said photoresist layer; and exposing said gray scale mask to said electron beam at a preselected charge density corresponding to the desired thickness of exposure of said photoresist layer.

The above method optionally including the step of selectively darkening a surface layer of said gray scale mask by generating an electron beam at discrete, predetermined positions thereon and at an acceleration voltage of at least about 20 kV.

Another method of fabricating a three-dimensional micro-element on a substrate to various depth levels comprising one of discrete depth levels and a continuous depth profile through a photoresist layer, comprises the steps of exposing said photoresist layer to radiation transmitted through a gray scale mask having a gray scale pattern thereon comprising image areas having a continuously varying transmissivity corresponding to a depth of material to be removed from said substrate to provide said element; removing material from said photoresist layer and said substrate in a predetermined pattern as determined by said gray scale pattern on said mask; providing said gray scale mask characterized as a glass article comprising a body portion and an integral radiation absorbing surface layer which is substantially insensitive to actinic radiation; and providing said glass article with said ion exchanged surface layer having Ag+ ions therein, and/or silver halide containing and/or $Ag_2O$ containing and/or Ag+ ion containing micro-crystals and/or micro-phases therein.

The above method optionally including the step of exposing the mask to an electron beam at a predetermined dosage corresponding to a degree of darkening of the mask required to produce a predetermined depth level in said photoresist layer.

The above method optionally including the step of darkening the mask by generating an electron beam at an acceleration voltage in the range of 20 kV to 30 kV.

The above method optionally including the step of exposing the mask to an electron beam charge density of 0 $mC/cm^2$ to about 400 $mC/cm^2$.

The above method optionally including the step of generating said electron beam with a current of at least about 25 nA.

The above method optionally including the step of applying an electrically conductive coating to the mask prior to exposing the mask to said electron beam.

The above method optionally including the step of removing said coating from the mask after exposing the mask to said electron beam.

The above method optionally including the step of comparing a thickness of said photoresist layer which may be exposed to radiation with a corresponding electron beam charge density value required to darken the mask to provide a predetermined depth level in said substrate; and exposing the mask to said electron beam at a preselected charge density corresponding to the desired thickness of exposure of said photoresist layer.

The above method optionally including the step of: exposing the mask to selected discrete charge densities of electron beam radiation over a grid of preselected grid spacings and varying the electron beam charge density from one spacing to the next in accordance with a predetermined depth level desired to be produced in said substrate.

Another method of fabricating a three-dimensional micro-element on a substrate and to various depth levels comprising one of discrete depth levels and a continuously depth profile through a photoresist layer, comprises the steps of providing a gray scale mask characterized as a glass article comprising a body portion and an internal radiation absorbing surface layer which is substantially insensitive to actinic radiation; and providing said glass article as a silicate glass having a silicon dioxide content in mole percent of from 30 to 95 and essentially no transition metals having 1–4 d electrons in the atomic state and at least one surface of said article having a substantially continuous silver and hydration content over its area, effective to render said surface darkenable upon exposure to electron beam radiation.

The present invention provides an improved method for producing micro-elements, including diffractive optical elements and the like, using a gray scale mask.

The present invention also provides an improved method for producing a gray scale mask comprising a glass article which is sensitive to exposure to a high energy electron beam, for example, to provide a pre-determined pattern on the article by varying the optical density of the glass as a result of exposure to the high energy electron beam.

In accordance with one aspect of the present invention micro-elements, such as diffractive optical elements, computer-generated holograms and other three dimensional micro-elements, may be produced with greater accuracy of the prescribed geometry of the element and in large quantities or large arrays by providing a gray scale mask having a masking pattern developed on a durable glass substrate comprising a high energy beam sensitive (HEBS) glass. The glass substrate or article includes a body portion and an integral ion exchanged surface layer which, upon exposure to high energy electron beams, becomes darkened to a selected degree to provide the gray levels required for developing the various depths or phase levels in the three dimensional elements to be manufactured using the mask. In particular, the mask glass article preferably comprises a plate of a high energy beam-sensitive glass having an integral ion exchanged surface layer containing a high concentration of $Ag^+$ ions and/or a large number density of AgCl-containing and/or $Ag_2O$-containing and/or $Ag^+$ ion-containing micro-crystals and/or micro-phases, and also containing silanol groups and/or water in the concentration range of about 0.01% to 12.0% by weight water. The gray scale mask may also be formed of a glass such as a silicate glass composition hydrated and containing silver and which can be effectively written with high energy beams, such as electron beams, to produce high optical density images thereon.

In accordance with another aspect of the present invention a method for generating a gray scale mask is provided wherein a glass mask element is provided with a pre-determined masking pattern formed directly thereon to provide a durable mask structure which eliminates the need for thin film coatings and ablative thin film materials. The particular method for producing a mask structure contemplated by the present invention comprises exposing a high energy beam-sensitive glass plate directly to an electron beam, using a commercially available electron beam writing device, at a relatively low acceleration voltage to provide a more precise configuration of the mask image pattern and the variations of optical density required to generate the various gray levels. In particular, acceleration voltage is controlled to produce sufficient penetration depth in the mask material without extending the electron trajectories unnecessarily with the resultant loss in resolution of the mask pattern.

In accordance with still another aspect of the present invention micro-elements, such as diffractive optical elements, are fabricated with improved geometries using a gray scale mask formed of a glass composition which is operable to provide stable images generated by exposure to an electron beam which may be controlled to generate a precise image on the glass. A gray scale mask in accordance with the invention may be reused many times, is relatively insensitive to exposure to environmental factors and is capable of providing high resolution and the resultant precise contour or dimensional control over the workpiece.

The present invention further provides an improved method of fabricating micro-optic devices, such as diffractive optical elements, with a gray scale mask which is simplified and cost effective, and wherein only a single mask needs to be exposed in an electron beam writer and wherein no multiple resist processing steps are required to generate the mask. Since the multiple levels or contour shading of the gray levels are written in a single step on a single mask the inevitable misregistrations between multiple lithography steps used in prior art mask fabricating methods are avoided.

Still further, the number of processing steps for fabrication of micro-elements compared to the steps required in fabrication methods using binary masks is substantially reduced in the method of the present invention wherein the element workpiece material may be optimized, that is the material which is best suited for the application can be chosen without being limited by the constraints of a molding material used in molded element fabrication methods.

Moreover, the method of the invention utilizes certain materials, tools and equipment compatible with the fabrication of large scale integrated electronic circuits. In this regard, the development of new fabrication techniques, environments and computer programs, for example, are not required to be established. The reduction in the number of steps involved in the fabrication method of the present invention will improve the efficiency and speed of the fabrication process. In this regard, mass production may be carried out based on a step and repeat photoresist exposure process followed by a chemically assisted ion beam etching batch process, for example.

Those skilled in the art will further appreciate the above-mentioned advantages and superior features of the invention together with other important aspects thereof upon reading the detailed description which follows in conjunction with the drawing.

BRIEF DESCRIPTION OF THE DRAWINGS

FIG. 7($b$) records net optical density at 530 nm versus electron dosage at 30 kV. Curve A—250 na, 0.4 $\mu$m address size, Curve B—75 na, 0.2 $\mu$m address size, EVC—e-beam flood exposure.

FIG. 7($c$) records net optical density at 630 nm versus electron dosage at 30 kV. Curve A—250 na, 0.4 $\mu$m address size, Curve B—75 na, 0.2 $\mu$m address size, EVC—e-beam flood exposure.

FIG. 7($d$) records data points of the net optical density at 365 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 $\mu$m. In the equation, Y represents the net optical density at 365 nm and X represents values of electron dosage in milli-coulomb/cm$^2$.

FIG. 7($e$) records data points of the net optical density at 435 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 $\mu$m. In the equation, Y represents the net optical density at 435 nm and X represents values of electron dosage in milli-coulomb/cm$^2$.

FIG. 7($f$) records data points of the net optical density at 530 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 $\mu$m. In the equation, Y represents the net optical density at 530 $\mu$m and X represents values of electron dosage in milli-coulomb/cm$^2$.

FIG. 7($g$) records data points of the net optical density at 630 nm vs. electron dosage, depicts the best fit curve and displays the equation describing the best fit curve; the electron beam exposure was done with Cambridge EBMF 10.5 e-beam writer operated at 30 kV having a beam current of 250 na and an addressing grid spacing of 0.4 $\mu$m. In the equation, Y represents the net optical density at 630 nm and X represents values of electron dosage in milli-coulomb/m$^2$.

FIG. 26 is a perspective view, greatly enlarged, of a gray scale mask and a photoresist coated substrate for fabricating an array of micro-lenses in accordance with the present invention; and FIG. 27 is a diagram showing the geometry of a micro-lens fabricated in accordance with the method of the invention.

DESCRIPTION OF THE INVENTION

Figure 1:
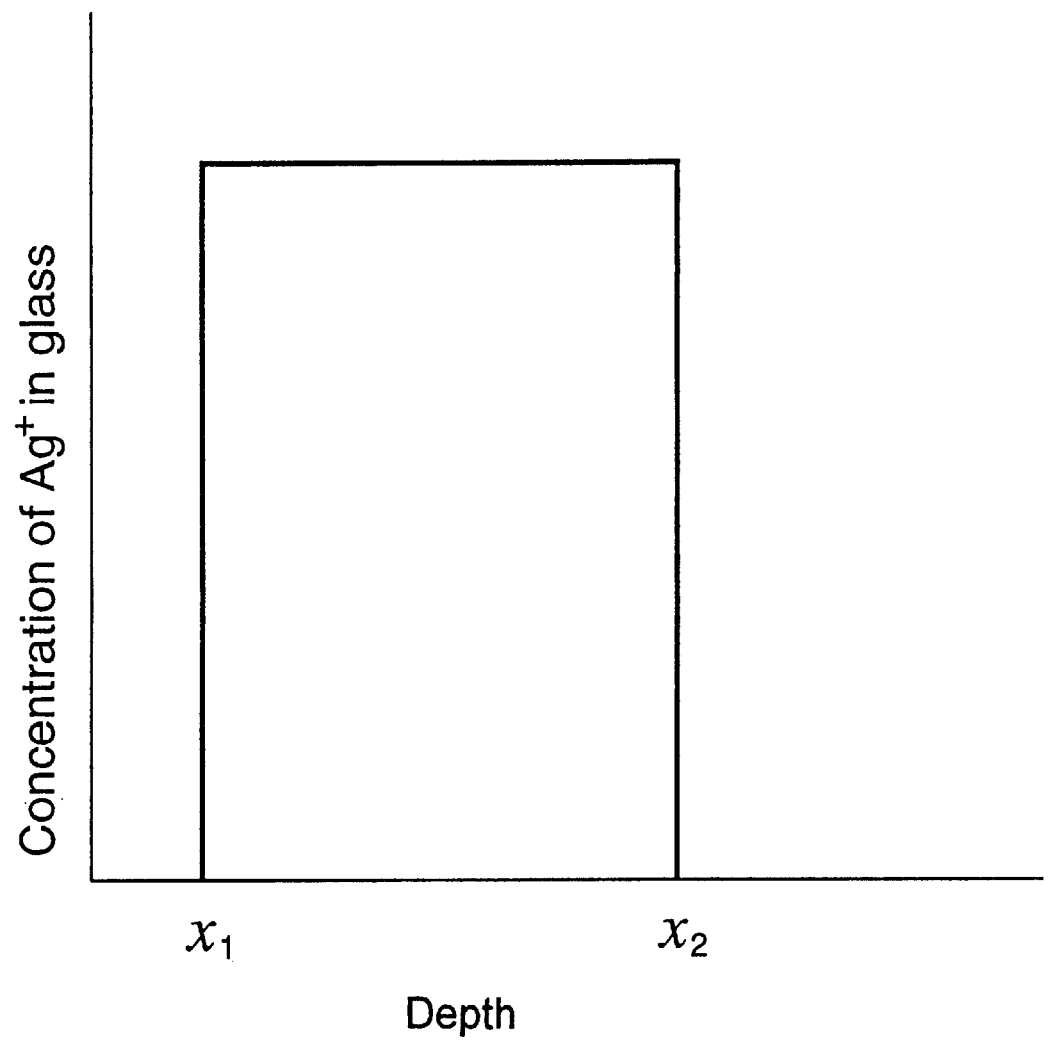
FIG. 1 illustrates a quality representation of the silver concentration profile in HEBS-glass.
Figure 2:
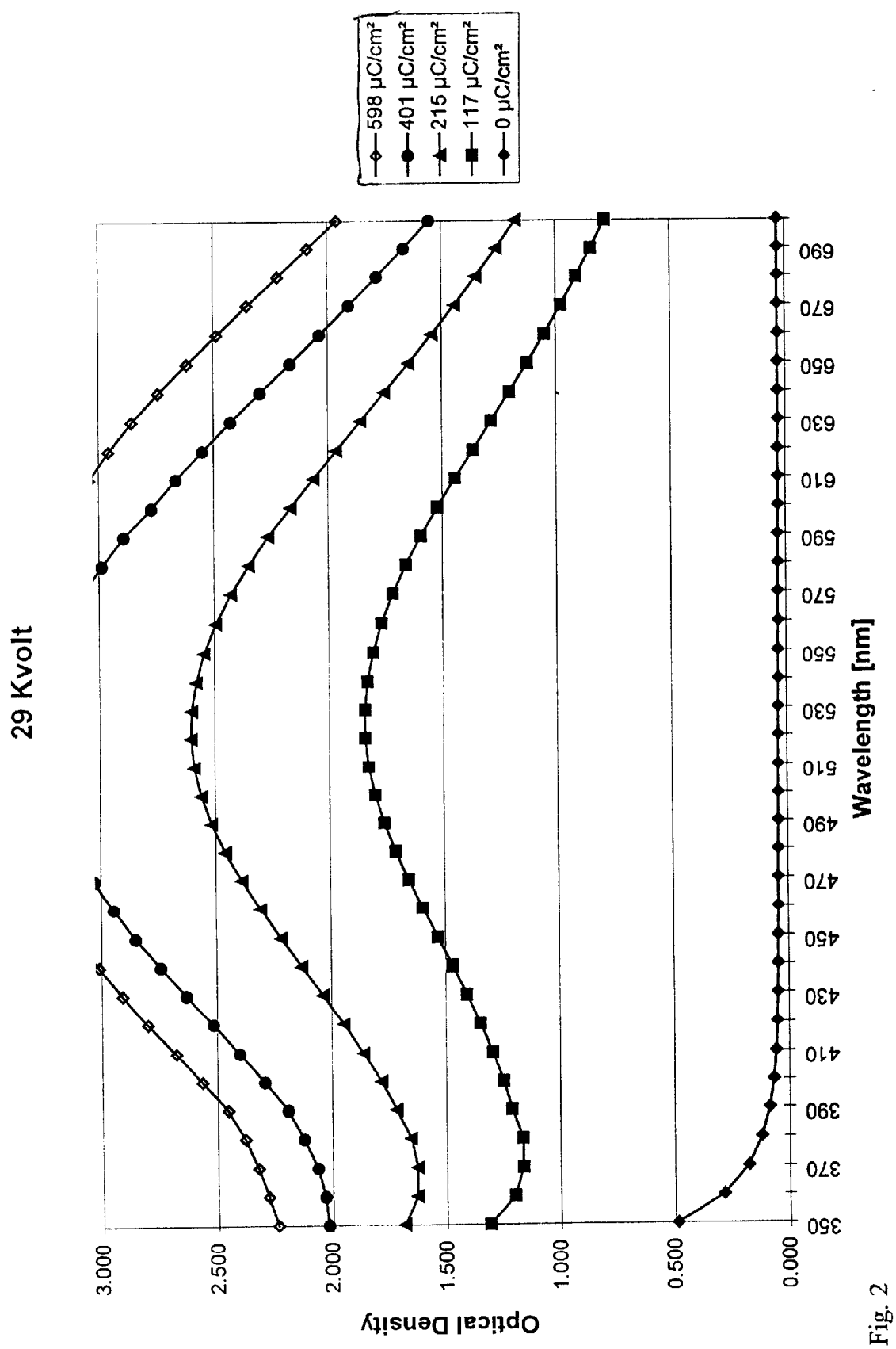
FIG. 2 records absorbence spectra of HEBS-glass No. 3 after flood exposure with e-beam at 29 kV acceleration voltage.
Figure 3:
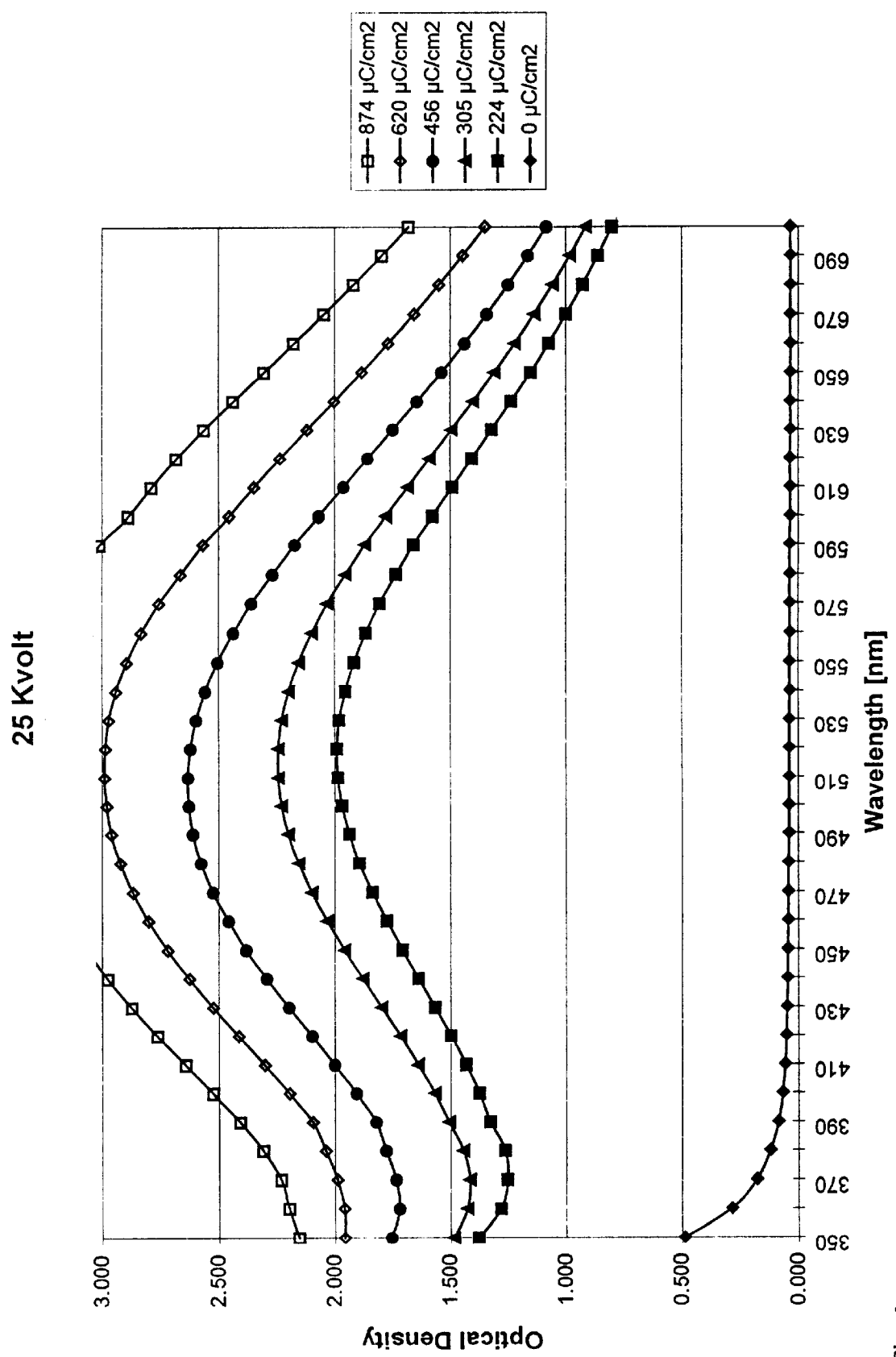
FIG. 3 records absorbence spectra of HEBS-glass No. 3 after flood exposure with e-beam at 25 kV acceleration voltage.
Figure 4:
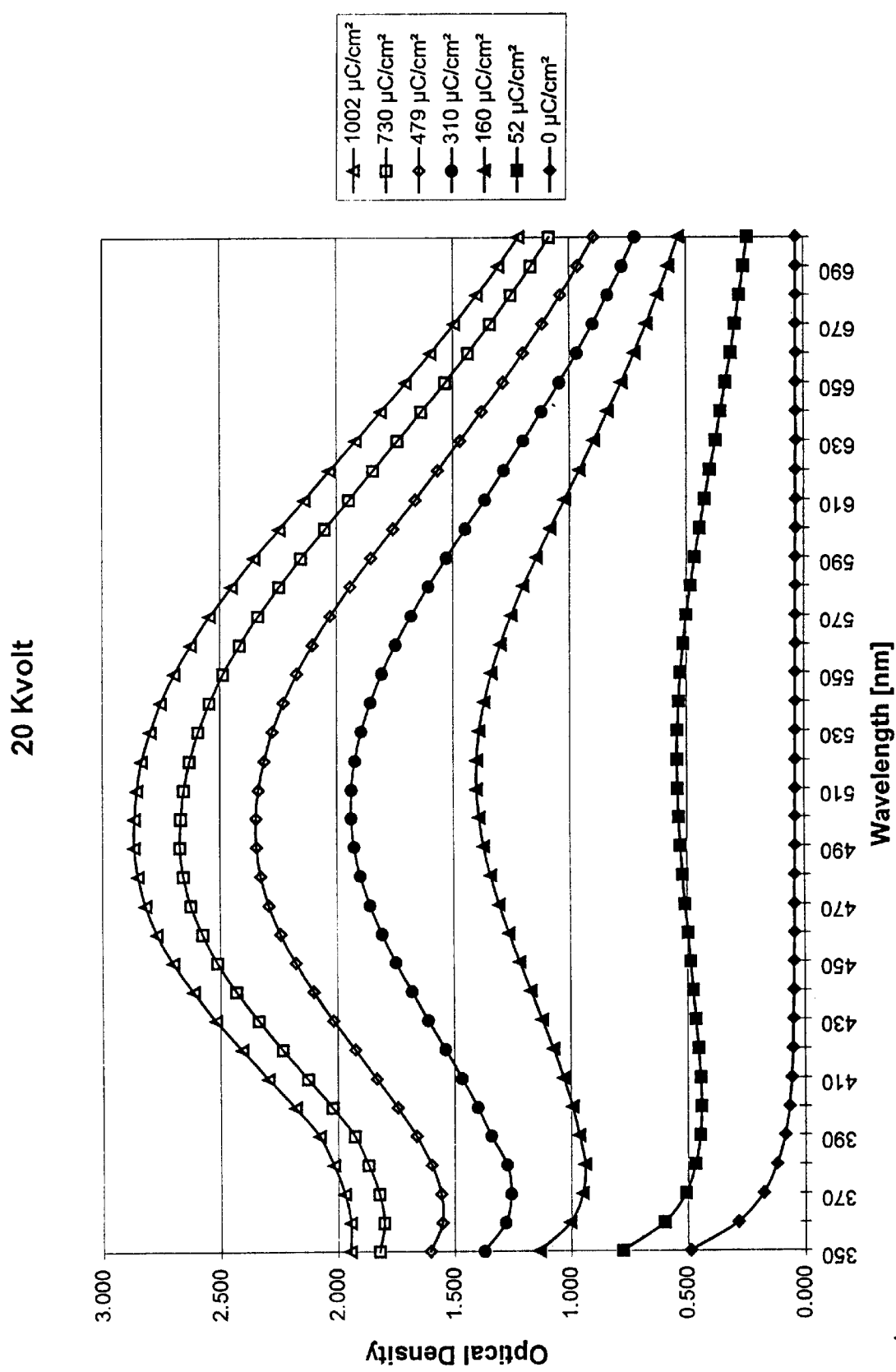
FIG. 4 records absorbence spectra of HEBS-glass No. 3 after flood exposure with e-beam at 20 kV acceleration voltage.
Figure 5:
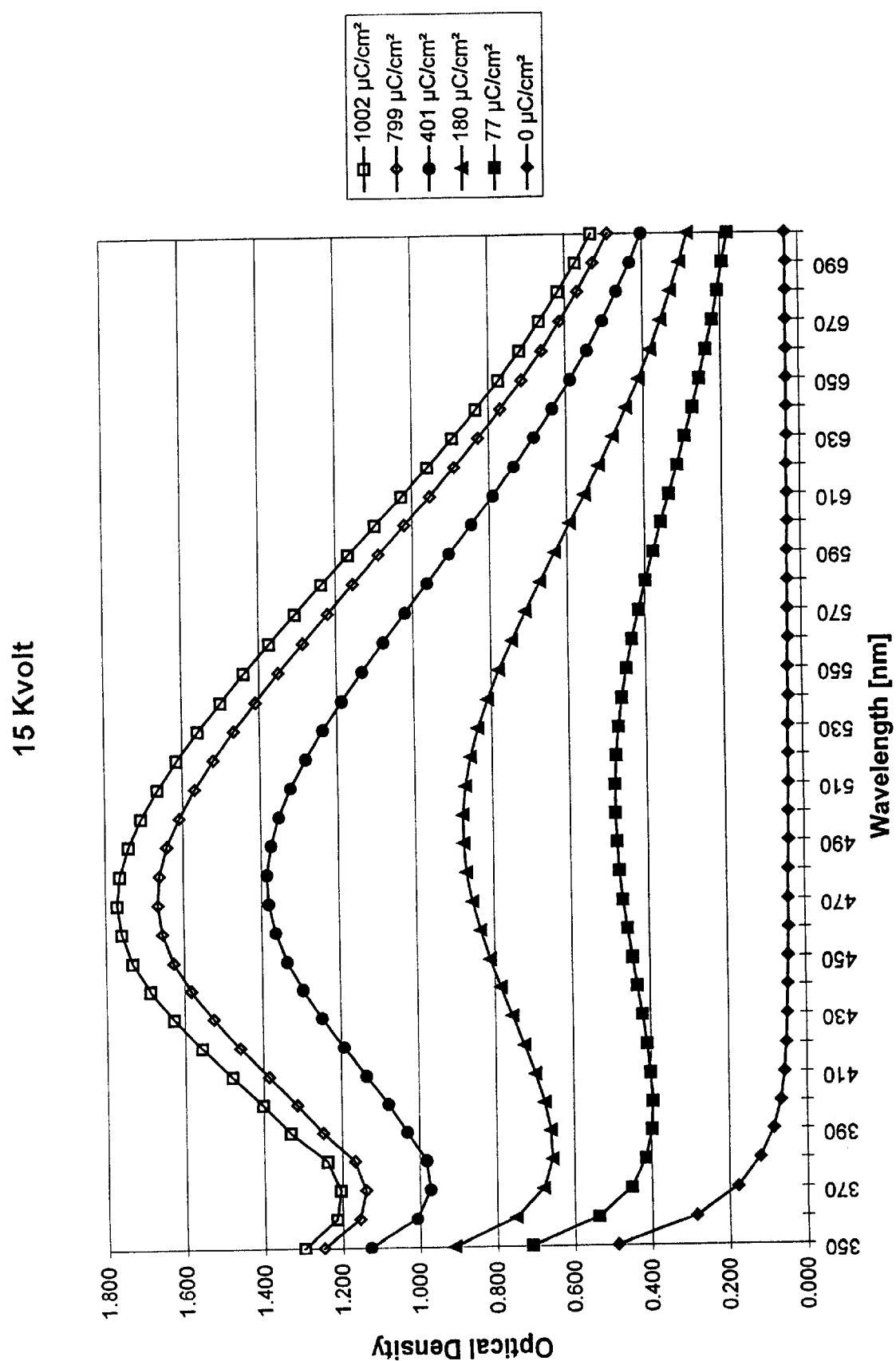
FIG. 5 records absorbence spectra of HEBS-glass No. 3 after flood exposure with e-beam at 15 kV acceleration voltage.

High energy beam sensitive glasses used to generate the gray level mask, consist of a low expansion zinc-silicate glass, a white crown glass. The base glass can be produced from glass melting just like the conventional white crown optical glasses. The base glass contains alkali to facilitate the following ion-exchange reactions which achieve the sensitivity of the HEBS-glass towards high energy beams, e-beam in particular. After ion-exchange HEBS-glass is essentially alkali free as a result of the ion-exchange process and the concurrent leaching process carried out in an acidic aqueous solution at temperatures above 320° C. The base glass composition consists of silica, metal oxides, halides and photo inhibitors. Typically $TiO_2$, $Nb_2O_5$ or $Y_2O_3$ are used as photo inhibitors. The photo inhibitors are used to dope the silver ion containing complex crystals, silver-alkali-halide. These $(AgX)_m (MX)_n$ complex crystals are the beam sensitive material and the doping of the photo inhibitors increases the energy band gap of the otherwise photo-sensitive glass.

The exemplary glass compositions that are optimized for making HEBS-glass gray level masks are listed in Exhibit A. Photosensitivity inhibitors and RS-suppression agents other than $TiO_2$, selected from the group consisting of $Ta_2O_5$, $ZrO_2$, $Nb_2O_5$, $La_2O_3$, $Y_2O_3$ and $WO_3$ may optionally be added to the glass batch or replaces portions of $TiO_2$ in the base glass compositions of Exhibit A. More than about 1% of Cl is added in the forms of Alkali Chloride to the glass batch to ensure that the glass melt is saturated with chlorides. The Chlorides also function as a fining agent for the glass melt.

The base glass compositions of the present invention consist in the glass batch essentially of, in mole percent on the oxide basis, 11.4 to 17.5% of one or more alkali metal oxides, 2.4 to 10.2% total of photo sensitivity inhibitors and RS suppression agents including 2.4 to 10.2% $TiO_2$, 1.1 to 2.4% $Al_2O_3$, 0 to 4.6% $B_2O_3$, 3.7 to 13.2% ZnO, 0.5 to 6% Cl, and 58.2 to 78.8% $SiO_2$.

After the glass is melted, drawn, ground and polished the base glass plates are ion-exchanged in an acidic aqueous solution containing soluble ionic silver. The ion exchange process is carried out at temperatures in excess of 320° C. for a duration sufficient to cause silver ions to diffuse into the glass plates 3 μm, i.e., $(x_2-x_1)$ in the thickness dimension of FIG. 1. As a result silver ions are present in the form of silver-alkali-halide $(AgX)_m(MX)_n$ complex crystals that are about 10 nm in each dimension within the cavity of the $SiO_4$ tetrahedron network Ground and polished glass plates of the exemplary glass compositions of Exhibit. A were ion exchanged in aqueous solution containing ionic silver. The aqueous ion exchange solution consists, on the weight percent basis, 7.5% or more of $AgNO_3$ and 0.5% or more of $HNO_3$. HEBS-glass No. 1 to No. 20 are the glass plates of the exemplary base glass compositions No. 1 to No. 20 respectively having been ion exchanged in the aqueous ion exchange solution.

Doping of the base glass with the photo inhibitors causes an increased energy band gap, making the ion exchanged glasses inert to UV and actinic radiation of shorter wavelengths as the concentration of the doping with photo inhibitors increases. Nevertheless the chemical reduction of silver ions in the silver-alkali-halide containing complex crystals to produce coloring specks of silver atoms can be accomplished by exposing the HEBS-glass to high energy beans, eg., ≧10 kV electron beams. This property of the material can be utilized to generate the necessary change in transmission for a gray level mask.

FIGS. 2 to 5 exhibit the resulting optical density of the HEBS-glass No. 3 of the exemplary base glass composition No. 3 after exposure with a flood electron beam exposure system using a 29 kV, a 25 kV, a 20 kV and a 15 kV electron beam respectively at a number of dosage levels. The flood e-beam exposure system manufactured and marketed by EVC Corporation, San Diego, Calif., has a beam diameter of 8 inches and was operated at a beam current of 2 milli amp. The absorption data was collected using a Hitachi U2000 spophotometer.

Figure 6:
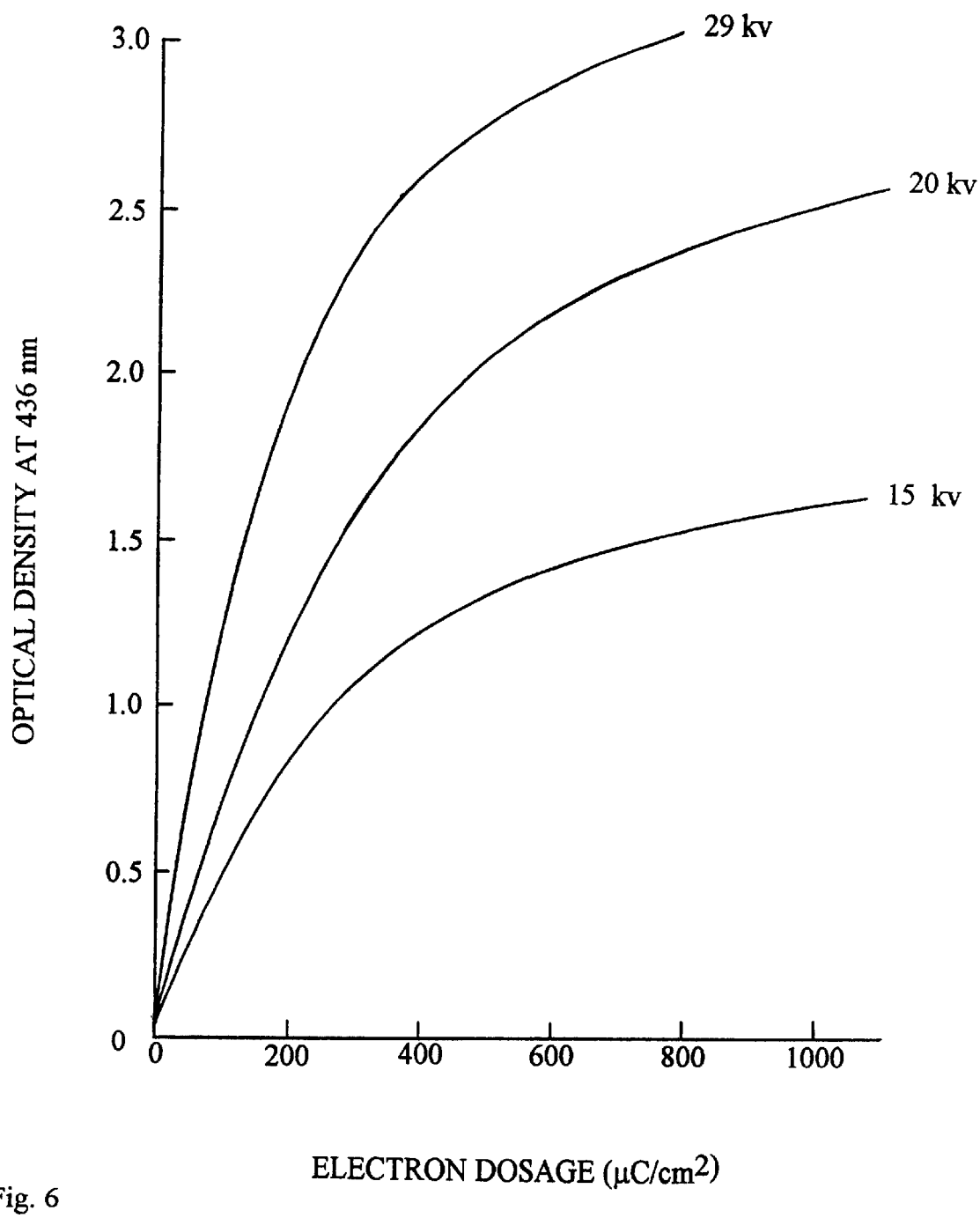
FIG. 6 depicts optical density at 436 nm of HEBS-glass No. 3 versus electron dosage. Electron beam exposure was done with EVC flood exposure system at 29 kV, 20 kV, and 15 kV.

Optical density values of HEBS-glass No. 3 at 436 nm as a function of e-beam dosage is plotted in FIG. 6 for e-beam acceleration voltages of 29 kV, 20 kV and 15 kV. In this plot the finite optical density value at zero electron dosage is due to reflection loss of probing light beam at two surfaces of glass plate samples. To

EXHIBIT A

Exemplary Glass Compositions

| | GLASS NO. | | | | | | | | | |
|---|---|---|---|---|---|---|---|---|---|---|
| | 1 | 2 | 3 | 4 | 5 | 6 | 7 | 8 | 9 | 10 |
| $SiO_2$ | 71.5 | 78.8 | 68.5 | 72.7 | 70.9 | 68.9 | 67.4 | 67.1 | 66.1 | 63.8 |
| $Li_2O$ | 3.3 | 3.4 | 3.8 | 3.6 | 3.7 | 3.9 | 3.9 | 4.2 | 4.2 | 4.5 |
| $Na_2O$ | 5.3 | 5.4 | 6.4 | 5.7 | 5.6 | 6.2 | 6.2 | 6.7 | 6.7 | 7.2 |
| $K_2O$ | 2.8 | 2.7 | 3.2 | 3.1 | 3.1 | 3.3 | 3.3 | 3.5 | 3.5 | 3.8 |
| $TiO_2$ | 2.4 | 4.3 | 4.6 | 3.4 | 4.5 | 5.6 | 4.5 | 5.4 | 5.4 | 6.7 |
| $Al_2O_3$ | 1.3 | 1.2 | 1.3 | 1.4 | 1.2 | 1.1 | 1.3 | 1.2 | 1.1 | 1.6 |
| ZnO | 7.2 | 3.7 | 7.4 | 7.1 | 6.0 | 7.0 | 9.0 | 7.1 | 8.2 | 7.6 |
| $Ta_2O_5$ | | | | | | | | | | |
| $Nb_2O_3$ | | | | | | | | | | |
| $ZrO_2$ | | | | | | | | | | |
| $WO_3$ | | | | | | | | | | |
| $B_2O_3$ | 3.2 | | 1.8 | | 2.0 | 1.0 | 1.4 | 1.8 | 0.8 | 1.8 |
| Cl | 3.0 | 0.5 | 3.0 | 3.0 | 3.0 | 3.0 | 3.0 | 3.0 | 3.0 | 3.0 |

| | GLASS NO. | | | | | | | | | |
|---|---|---|---|---|---|---|---|---|---|---|
| | 11 | 12 | 13 | 14 | 15 | 16 | 17 | 18 | 19 | 20 |
| $SiO_2$ | 64.8 | 64.0 | 60.1 | 60.5 | 58.2 | 69.7 | 64.2 | 64.5 | 66.3 | 67.8 |
| $Li_2O$ | 4.5 | 4.7 | 4.3 | 5.1 | 5.1 | 3.9 | 3.8 | 3.8 | 3.8 | 3.8 |
| $Na_2O$ | 7.4 | 7.6 | 7.8 | 8.1 | 8.1 | 6.2 | 6.4 | 6.4 | 6.4 | 6.4 |
| $K_2O$ | 3.6 | 4 | 4.2 | 4.3 | 4.3 | 3.3 | 3.2 | 3.2 | 3.2 | 3.2 |
| $TiO_2$ | 5.4 | 7.4 | 6.1 | 10.2 | 5.7 | 4.4 | 4.6 | 4.6 | 4.6 | 4.6 |
| $Al_2O_3$ | 1.2 | 1.2 | 1.5 | 1.2 | 2.4 | 1.2 | 1.3 | 1.3 | 1.3 | 1.3 |
| ZnO | 10.1 | 8.1 | 11.0 | 7.1 | 13.2 | 7.1 | 7.4 | 7.4 | 7.4 | 7.4 |
| $Ta_2O_5$ | | | | | | | 1.6 | | | |
| $Nb_2O_3$ | | | | | | | | 1.2 | | |
| $ZrO_2$ | | | | | | | | | 2.0 | |
| $WO_3$ | | | | | | | | | | 0.5 |
| $B_2O_3$ | 1.8 | | 2.0 | 0.5 | | 2.0 | | 4.6 | 2.0 | 2.0 |
| Cl | 1.2 | 3.0 | 3.0 | 3.0 | 3.0 | 2.2 | 6.0 | 3.0 | 3.0 | 3.0 | obtain an optical density value of 1.0 at 436 nm in HEBS-glass the required electron dosage is 75 $\mu C/cm^2$, 155 $\mu C/cm^2$ and 270 $\mu C/cm^2$ using EVC e-beam exposure system at 29 kV, 20 kV and 15 kV respectively.

The e-beam exposure-induced optical density i.e. net optical density in HEBS-glass is a function of e-beam exposure scheme and write parameters which include e-beam energy (i.e. e-beam acceleration voltage), beam spot size, beam current and addressing grid. The net optical density is defined herein as the optical density of the e-beam darkened area minus the optical density of the clear (unexposed) area.

The net optical density in the visible spectral range was measured as a function of electron dosage using HEBS-glass No.3 having been exposed in a number of 3 mm×3 mm square areas with the following e-beam pattern generators: (1) MEBES of ETEC Systems, Inc., (2) Cambridge EBMF 10.5 e-beam writer. Results of exemplary exposure schemes are discussed immediately below.

Figure 7A:
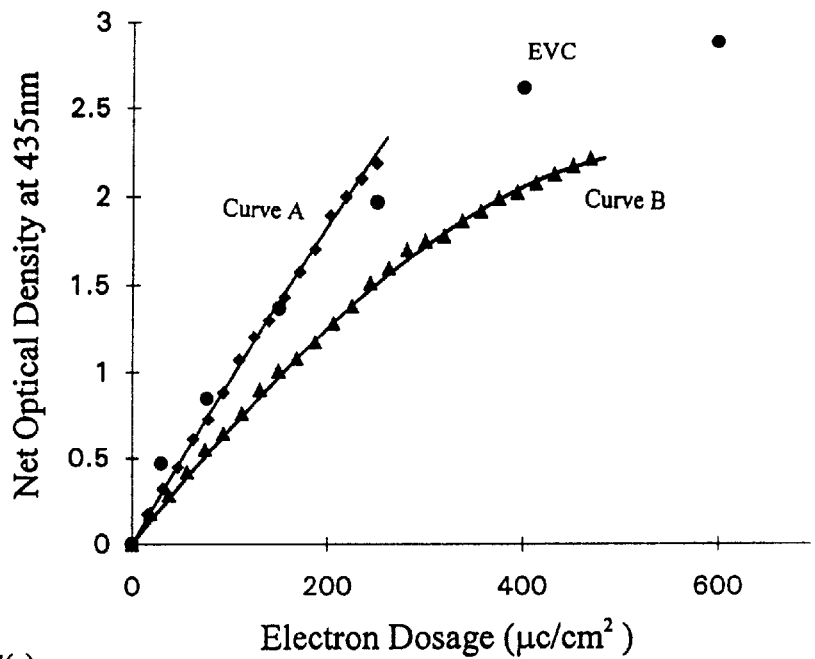
FIG. 7($a$) records net optical density at 435 nm versus electron dosage at 30 kV. Curve A—250 na, 0.4 $\mu$m address size, Curve B—75 na, 0.2 $\mu$m address size, EVC—e-beam flood exposure.

FIG. 7(a) exhibits net optical density values of HEBS-glass No. 3 at 435 nm vs. electron dosage at 30 kv. The e-beam exposure was done using the vector scan e-beam writer, Cambridge EBMF 10.5. The e-beam parameters are as follows:

Curve A—30 kv, 250 na beam current, 0.4 $\mu$m addressing grid spacing.

Curve B—30 kv, 75 na beam current, 0.2 $\mu$m addressing grid spacing.

The data points of the net optical density values at 435 nm resulting from EVC flood gun exposure at 30 kV are shown in the figure for comparison.

Figure 7B:
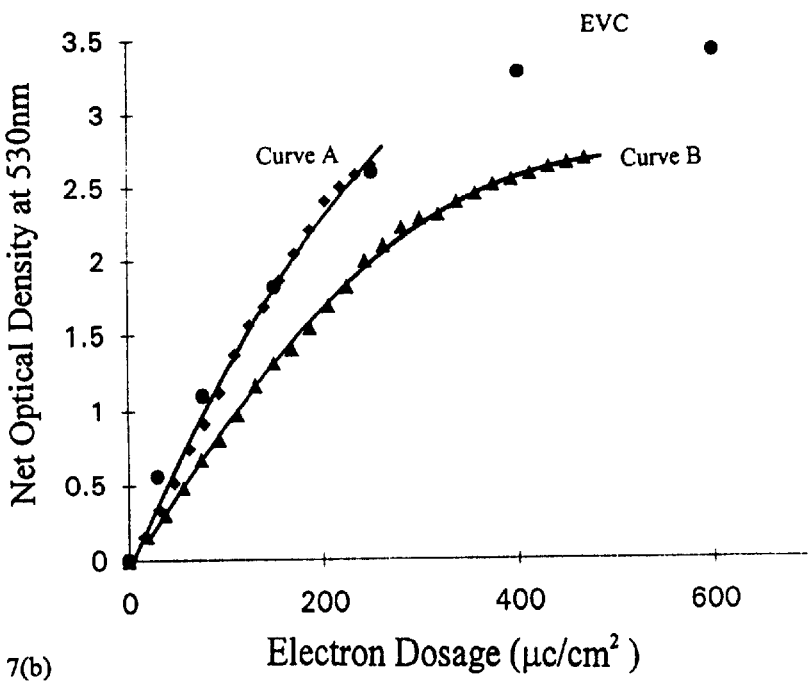

FIG. 7(b) displays the corresponding net optical density values at 530 nm as a function of electron dosage at 30 kv.

Figure 7C:
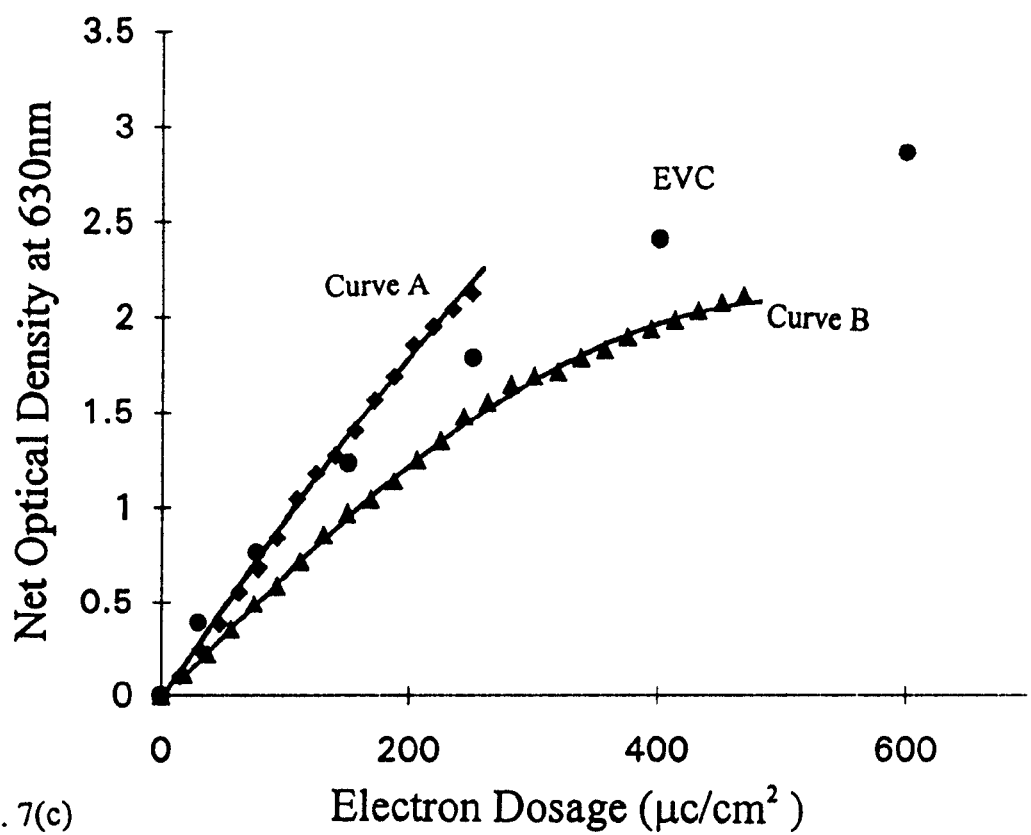

FIG. 7(c) exhibits the corresponding net optical density values at 630 nm as a function of electron dosage at 30 kv.

Figure 7:
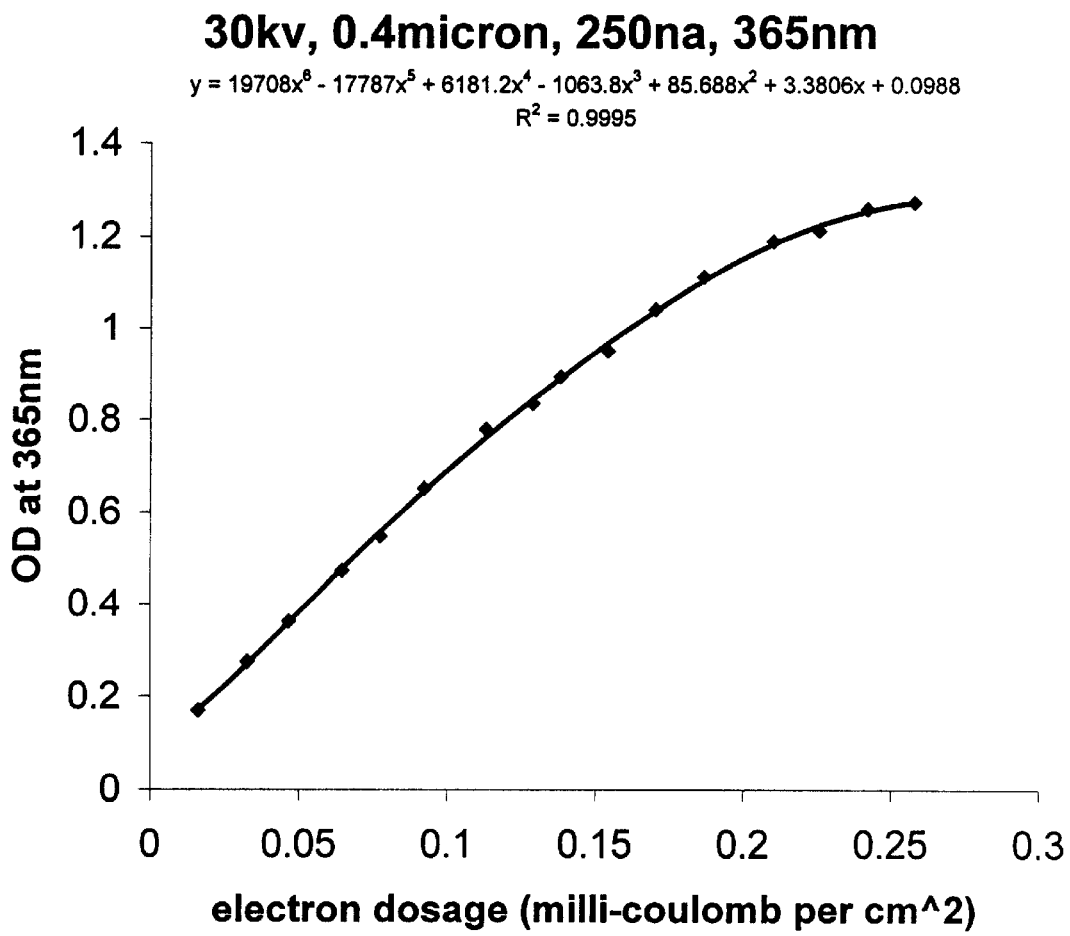
Figure 7:
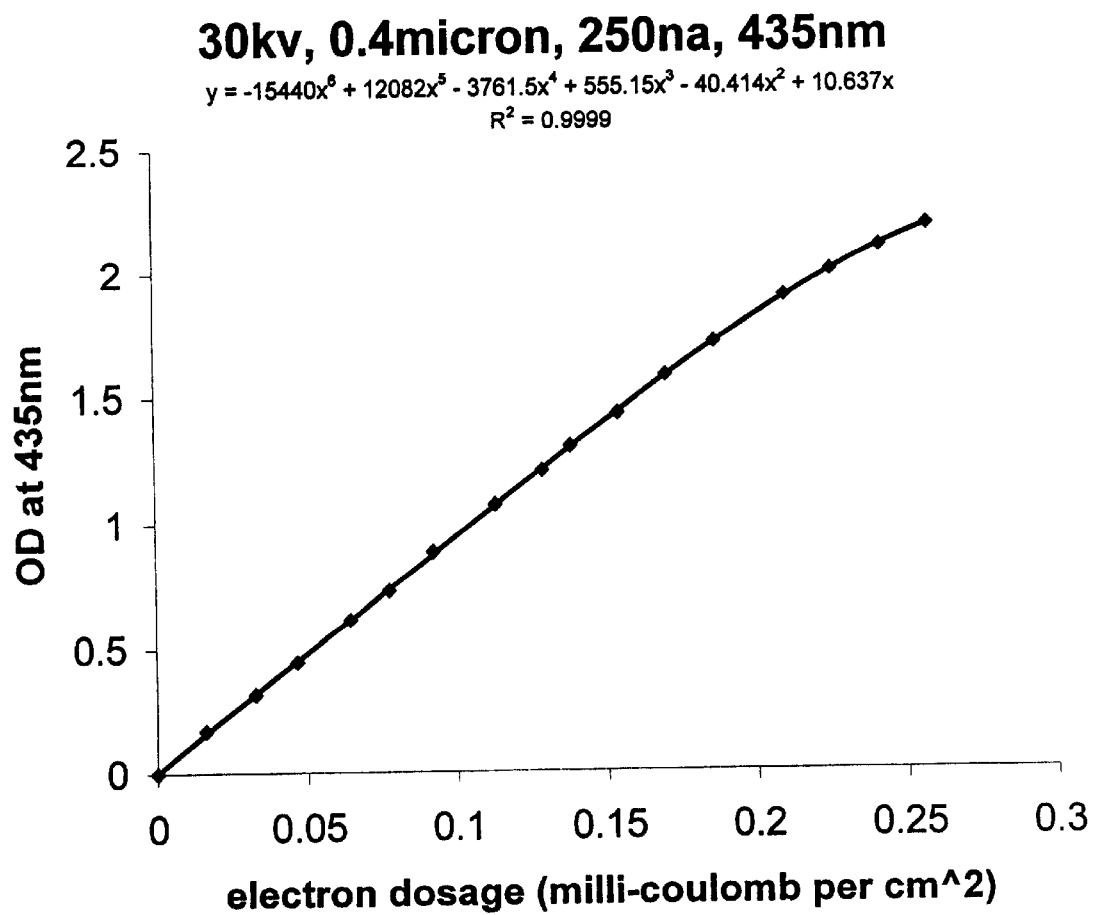
Figure 7:
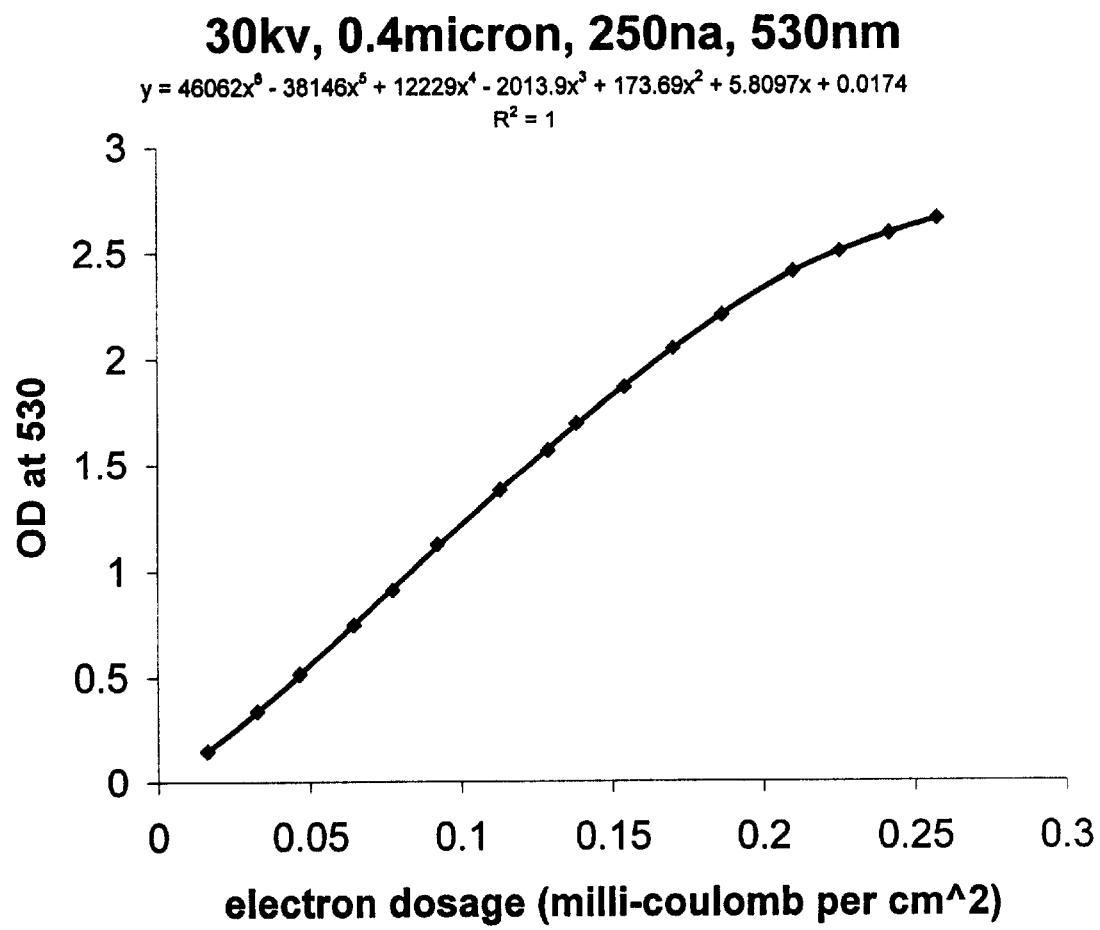
Figure 7:
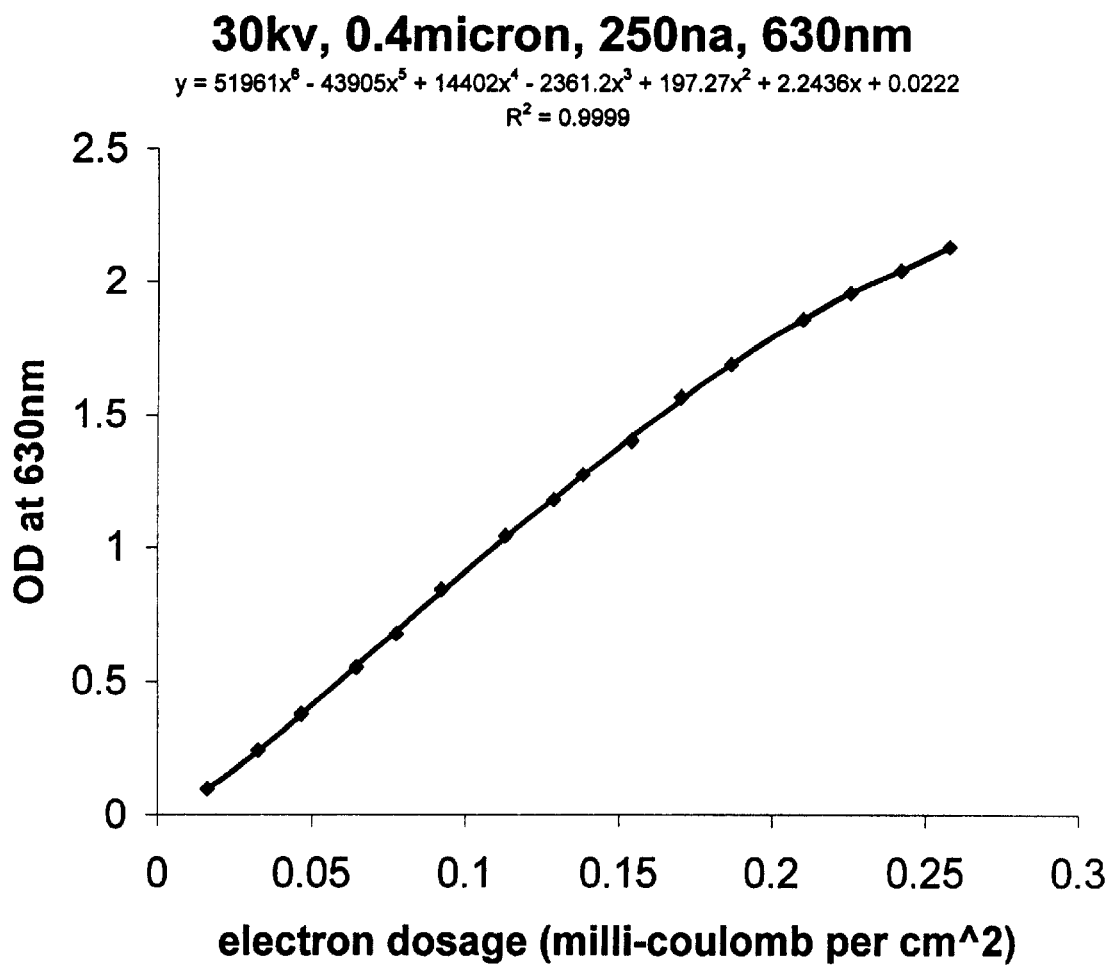

The data points of curve A in FIG. 7 are listed in Table 1. Also listed in Table 1 is the net optical density values at 365 nm. The electron dosage in $\mu$Coulomb/cm$^2$ and in milli Coulomb/cm$^2$, the clock rates and the corresponding e-beam exposure durations per address to result in the tabulated electron dosages are also listed in the table.

The best fit polynomial equations that depict the experimental data of net optical density vs. electron dosage in milli coulomb/cm$^2$ of Table 1 are shown in FIG. 7(d), FIG. 7(e), FIG. 7(f) and FIG. 7(g) respectively for the net optical density values at 365 nm, 435 nm, 530 nm and 630 nm respectively. In the equations, y represents net optical density values and x represents values of electron dosage in milli coulomb/cm$^2$. The experimental data points and the best fitted curves are also shown in FIGS. 7(d), 7(e), 7(f), and 7(g).

As shown in FIG. 7(d), a large portion of the best fit curve is a straight line. The linear portion ranges in net optical density values from 0 to 0.9. The slope of the linear portion representing the e-beam sensitivity of HEBS-glass No. 3 darkening at the spectral wavelength of 365 nm upon e-beam exposure with write parameters of 30 kV acceleration voltage, 250 nano-amp beam current, and 0.4 $\mu$m addressing grid size, is 6.2767 unit of optical density value per milli coulomb/cm$^2$. Namely to obtain a net optical density value of 0.62767 at 365 nm, the required electron dosage is 100 micro-coulomb/cm$^2$.

As shown in FIG. 7(e), a large portion of the best fit curve is a straight line. The linear portion ranges in net optical density values from 0 to 1.65. The slope of the straight line portion representing the e-beam sensitivity of HEBS-glass No. 3 darkening at the spectal wavelength of 435 nm upon e-beam exposure with write parameters of 30 kV acceleration voltage, 250 nano-amp beam current, and 0.4 μm addressing grid size, is 9.2113 unit of optical density value per milli coulomb/cm². Namely to obtain a net optical density value of 0.92113 at 435 nm, the required electron dosage is 100 micro-coulomb/cm².

As shown in FIG. 7(f), a large portion of the best fit curve is a straight line. The linear portion ranges in net optical density values from 0 to 2.05. The slope of the linear portion representing the e-beam sensitivity of HEBS-glass No. 3 darkening at the spectral wavelength of 530 nm upon e-beam exposure with write parameters of 30 kV acceleration voltage, 250 nano-amp beam current, and 0.4 μm addressing grid size, is 12.507 unit of optical density value per milli coulomb/cm². Namely to obtain a net optical density value of 1.2507 at 530 nm, the required electron dosage is 100 micro-coulomb/cm².

As shown in FIG. 7(g), a large portion of the best fit curve is a straight line. The linear portion ranges in net optical density values from 0 to 1.7. The slope of the linear portion representing the e-beam sensitivity of HEBS-glass No. 3 darkening at the spectral wavelength of 630 nm upon e-beam exposure with write parameters of 30 kV acceleration voltage, 250 nano-amp beam current, and 0.4 μm addressing grid size, is 9.5929 unit of optical density value per milli coulomb/cm². Namely to obtain a net optical density value of 0.95929 at 630 nm, the required electron dosage is 100 micro-coulomb/cm².

7(d) to 7(g) as well as the slope of the linear portion of the best fit curves were obtained for a number of combinations of e-beam writer parameters. It has been determined that the exemplary write schemes using EBMF 10.5 e-beam writer, which are practical and cost effective to make HEBS-glass gray level masks include (1) 30 kV, 0.4 μm address, 250 na; (2) 30 kV, 0.2 μm address, 150 na; (3) 30 kV, 0.2 μm address, 125 na; (4) 30 kV, 0.2 μm address, 100 na; (5) 30 kV, 0.2 μm address, 75 na; (6) 20 kV, 0.2 μm address, 175 na; (7) 20 kV, 0.2 μm address, 150 na; (8) 20 kV, 0.2 μm address, 125 na; (9) 20 kV, 0.2 μm address, 100 na; and (10) 20 kV, 0.1 μm address, 25 na. Using each of the ten write schemes listed immediately above net optical density values of HEBS-glass NO.3 at wavelength from 350 nm to 1100 nm were obtained as a function of the electron dosage. The best fit polynomial equations and the slope of the linear portion of each of the best fit curves of net optical density values at 365 nm, at 435 nm, at 530 nm and 630 nm vs. electron dosage are represented in Table 2.

Figure 8:
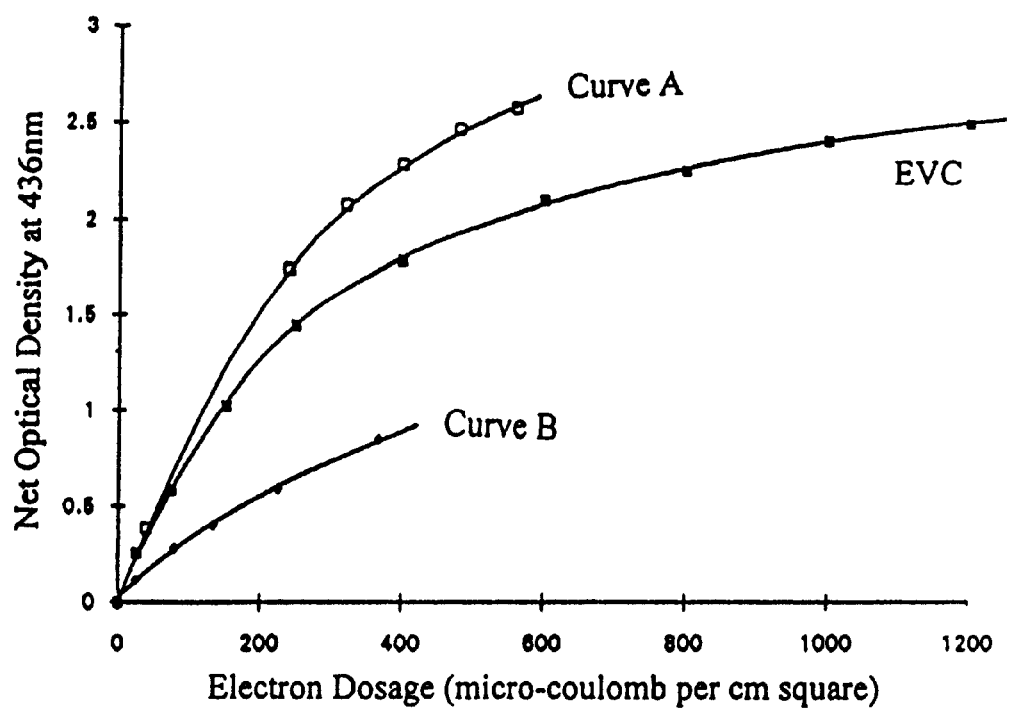
FIG. 8 records net optical density at 436 nm versus electron dosage at 20 kV. Curve A—MEBES III, 4000 na, 0.5 $\mu$m address size, 40 MHz. Curve B—Cambridge EBMF 10.5, 25 na, 0.1 $\mu$m address size. EVC—e-beam flood exposure.

FIG. 8 exhibits net optical density values of HEBS-glass No. 3 at 436 nm vs. electron dosage at 20 kv. Curve A displays the data of e-beam exposure using the raster scan e-beam pattern generator, MEBES III. MEBES III was operated at 20 kv. 40 MHz rate, using a spot size of 1 μm, a beam current of 4000 na and an addressing grid size of 0.5 μm. These write parameters result in an exposure dosage of 40 μm C/cm² per scan count. Electron dosage having multiples of 40 μC/cm² were

TABLE 1

Net optical density in HEBS-glass having been exposed to e-beam at 30 kv, 250 na beam current, 0.4 μm addressing grid size using Cambridge EBMF 10.5 e-beam writer at various clock rates

| Exposure Duration per pixel (micro sec) | Clock Rate (MHz) | Electron Dosage (micro C/cm²) | Electron Dosage (milli C/cm²) | Net Optical Density at 365 nm | Net Optical Density at 435 nm | Net Optical Density at 530 nm | Net Optical Density at 630 nm |
|---|---|---|---|---|---|---|---|
| 0.1039 | 9.625 | 16.23 | 0.01623 | 0.170 | 0.172 | 0.149 | 0.100 |
| 0.2091 | 4.782 | 32.67 | 0.03267 | 0.275 | 0.317 | 0.336 | 0.242 |
| 0.2984 | 3.351 | 46.63 | 0.04663 | 0.362 | 0.445 | 0.514 | 0.377 |
| 0.4126 | 2.424 | 64.47 | 0.06447 | 0.472 | 0.613 | 0.744 | 0.553 |
| 0.4956 | 2.018 | 77.44 | 0.07744 | 0.547 | 0.729 | 0.909 | 0.681 |
| 0.5966 | 1.676 | 93.22 | 0.09322 | 0.651 | 0.883 | 1.120 | 0.846 |
| 0.7236 | 1.382 | 113.06 | 0.11306 | 0.779 | 1.068 | 1.373 | 1.041 |
| 0.8248 | 1.212 | 128.88 | 0.12888 | 0.835 | 1.202 | 1.563 | 1.180 |
| 0.8855 | 1.129 | 138.36 | 0.13836 | 0.894 | 1.297 | 1.689 | 1.273 |
| 0.9870 | 1.013 | 154.22 | 0.15422 | 0.950 | 1.427 | 1.862 | 1.401 |
| 1.0900 | 0.917 | 170.31 | 0.17031 | 1.041 | 1.574 | 2.045 | 1.566 |
| 1.1940 | 0.838 | 186.56 | 0.18656 | 1.111 | 1.706 | 2.203 | 1.690 |
| 1.3445 | 0.744 | 210.08 | 0.21008 | 1.189 | 1.892 | 2.404 | 1.859 |
| 1.4430 | 0.693 | 225.47 | 0.22547 | 1.212 | 1.998 | 2.500 | 1.955 |
| 1.5474 | 0.646 | 241.78 | 0.24178 | 1.258 | 2.095 | 2.583 | 2.042 |
| 1.6485 | 0.607 | 257.58 | 0.25758 | 1.272 | 2.180 | 2.652 | 2.126 |

Electron beam pattern generators were employed to darken HEBS-glass No. 3 at a number of electron dosage levels using beam acceleration voltages, beam current, beam spot size and addressing grid size as variable parameters. Beam acceleration voltages ranging from 10 kV to 50 kV, beam spot size ranging from 0.1 μm to 1 μm, beam current ranging from 10 na to 8000 na, and addressing grid size ranging from 0.05 μm to 1 μm were studied to determine the practical and cost effective write schemes for HEBS-glass compositions. Experimental data of net optical density in the spectral range of 350 nm to 1100 nm and polynomial equations together with the best fit curves resembling FIGS.

exposed on HEBS-glass using the number of scan counts as a variable parameter. The data points of Curve A corresponds to 1, 6, 8, 10, 12, and 14 scan counts. Curve B displays the data of e-beam exposure using Cambridge EBMF 10.5 e-beam writer operated at 20 kv, 25 na and 0.1 μm addressing grid spacing. Also shown in FIG. 8 for comparison is the net optical density values at 436 nm resulting from EVC flood gun exposure at 20 kv.

The effect of retraces as well as the dependence of e-beam induced optical density on the variable write parameters of Table 2 are explained in the section "Heat effect of the Write e-beam" in light of a postulated mechanism of e-beam darkening.

Figure 9:
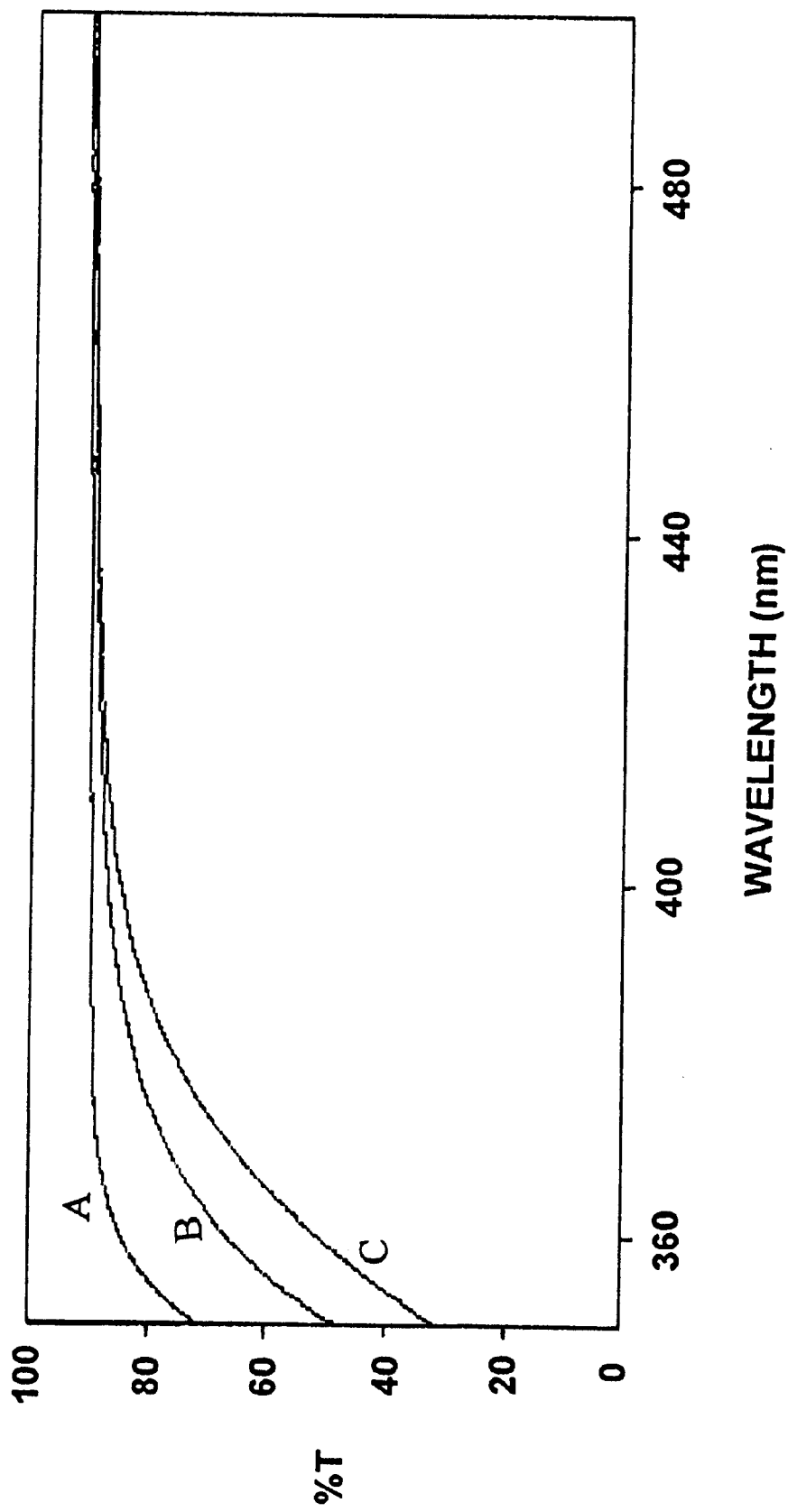
FIG. 9 depicts the transmittance spectra of exemplary HEBS-glass No. 3. A—a base glass plate 0.090" thick; B—a HEBS-glass plate 0.086" thick having one ion-exchanged surface glass layer, C—a HEBS-glass plate 0.090" thick having two ion-exchanged surface glass layer.

FIG. 9 exhibits the transmittance spectra of the base glass plate 0.090 inch thick of the exemplary glass composition No. 3. The cut off in transmittance i.e., the absorption edge of the base glass is due to electronic transitions of the constituting chemical elements of the base glass. As the concentration of the doping with photo inhibitors increases, the absorption edge of the base glass shifts to longer wavelengths; namely %T of the base glass reduces in the spectal range of uv, then near uv and then blue light as the doping concentration of photo inhibitors increases. The concentration of photo inhibitors in the exemplary base glass compositions of Exhibit A was optimized for use at mercury G-line so that the HEBS-glass is totally inert to actinic radiation having wavelengths $\lambda$ equal to or longer than 436 nm, and has a %T value of more than 88%. The %T values of the exemplary HEBS-glass No. 3 is shown in FIG. 9 and Table 3. A value of 88% transmittance corresponds to 96% internal transmission, since reflection less from two glass surfaces is 8%. The values of %T and the internal transmission of the corresponding base glass 0.090 inch thick are more than 90% and more than 98% respectively for $\lambda \geq 436$ nm.

A HEBS-glass plate in general consists of two ion-exchanged surface glass layers, since both surfaces of a base glass plate were ion exchanged during an ion exchange process. To increase the transmittance of the HEBS-glass plate at $\lambda < 436$ nm one may grind off one ion-exchanged surface glass layer and polish the now anhydrous surface to photomask quality. The transmittance spectra of HEBS-glass No. 3, 0.086" thick having only one ion-exchanged surface is also shown in FIG. 9.

The internal transmittance of one ion exchanged surface glass layer was measured by placing the HEBS-glass plate 0.086" thick with one ion exchanged surface in the sample beam of the U2000 spectrophotometer and placing a base glass plate 0.090 inch thick in the reference beam. The internal transmittance from 350 nm to 500 nm of the ion exchanged glass layer of the exemplary HEBS-glass No. 3 is listed in Table 3.

TABLE 2

The best polynomial fit equation and the slope of the linear portion of an electron beam darkening sensitivity curve

| Write Scheme No. and Equation No. | parameters of write schemes | | | | Electron Beam Darkening Sensitivity Curve Y = Optical Density X = Electron Dosage in milli coulomb/cm2 | Slope of the linear portion of the Sensitivity Curve |
|---|---|---|---|---|---|---|
| | Acceleration voltage (kV) | Addressing grid size (micron) | Beam Current (na) | Wavelength (nm) | | |
| 1 | 30 | 0.4 | 250 | 365 | y = 19708$x^6$ − 17787$x^5$ + 6181.2$x^4$ − 1063.8$x^3$ + 85.688$x^2$ + 3.3806x | 6.2767 |
| 2 | 30 | 0.4 | 250 | 435 | y = −15440$x^6$ + 12082$x^5$ − 3761.5$x^4$ + 555.15$x^3$ − 40.414$x^2$ + 10.637x | 9.2113 |
| 3 | 30 | 0.4 | 250 | 530 | y = 46062$x^6$ − 38146$x^5$ + 12229$x^4$ − 2013.9$x^3$ + 173.69$x^2$ − 5.8097x | 12.507 |
| 4 | 30 | 0.4 | 250 | 630 | y = 51961$x^6$ − 43905$x^5$ + 14402$x^4$ − 2361.2$x^3$ + 197.27$x^2$ + 2.2436x | 9.5929 |
| 5 | 30 | 0.2 | 75 | 365 | y = 4788.8$x^6$ − 4881.1$x^5$ + 1822.8$x^4$ − 308.43$x^3$ + 19.251$x^2$ + 4.098x | 4.3024 |
| 6 | 30 | 0.2 | 75 | 435 | y = 3780.7$x^6$ − 4395.5$x^5$ + 1959$x^4$ − 421.14$x^3$ + 40.268$x^2$ + 4.882x | 6.1553 |
| 7 | 30 | 0.2 | 75 | 530 | y = 4227.3$x^6$ − 4897.4$x^5$ + 2192.6$x^4$ − 490.42$x^3$ + 50.025$x^2$ + 6.8341x | 8.6203 |
| 8 | 30 | 0.2 | 75 | 630 | y = 3750.9$x^6$ − 4226.7$x^5$ + 1854.8$x^4$ − 408.5$x^3$ + 41.902$x^2$ + 4.8131x | 3.4022 |
| 9 | 30 | 0.2 | 100 | 365 | y = −355.78$x^6$ + 466.62$x^5$ − 243.17$x^4$ + 62.851$x^3$ − 12.485$x^2$ + 5.5571x | 4.424 |
| 10 | 30 | 0.2 | 100 | 435 | y = −692.18$x^6$ + 804.39$x^5$ − 358.96$x^4$ + 75.143$x^3$ − 10.535$x^2$ + 6.9982x | 6.1269 |
| 11 | 30 | 0.2 | 100 | 530 | y = −175.37$x^6$ + 38.823$x^5$ + 112.01$x^4$ − 80.56$x^3$ + 14.073$x^2$ + 7.6867x | 8.3914 |
| 12 | 30 | 0.2 | 100 | 630 | y = −839.24$x^6$ + 947.64$x^5$ − 359.07$x^4$ + 40.139$x^3$ − 0.7855$x^2$ + 6.4234x | 6.3643 |
| 13 | 30 | 0.2 | 125 | 365 | y = −664.62$x^6$ + 932.44$x^5$ − 464.2$x^4$ + 95.04$x^3$ − 13.314$x^2$ + 6.4665x | 5.392 |
| 14 | 30 | 0.2 | 125 | 435 | y = −900.79$x^6$ + 1480.9$x^5$ − 905.98$x^4$ + 243.25$x^3$ − 32.801$x^2$ + 9.8528x | 7.7152 |
| 15 | 30 | 0.2 | 125 | 530 | y = −1283.3$x^6$ + 1929.4$x^5$ − 1020$x^4$ + 210.47$x^3$ − 22.431$x^2$ + 12.109x | 10.672 |
| 16 | 30 | 0.2 | 125 | 630 | y = 111.03$x^6$ − 345.7$x^5$ + 352.69$x^4$ − 158.9$x^3$ + 24.867$x^2$ + 6.7982x | 8.1056 |
| 17 | 30 | 0.2 | 150 | 365 | y = −104.68$x^6$ + 149.86$x^5$ − 51.158$x^4$ − 8.925$x^3$ − 0.3208$x^2$ + 5.866x | 5.4107 |
| 18 | 30 | 0.2 | 150 | 435 | y = −341.18$x^6$ + 643.91$x^5$ − 430.4$x^4$ + 115.13$x^3$ − 16.314$x^2$ + 9.1502x | 7.8427 |
| 19 | 30 | 0.2 | 150 | 530 | y = −237.51$x^6$ + 304.15$x^5$ − 52.05$x^4$ − 65.071$x^3$ + 15.235$x^2$ + 10.164x | 11.048 |
| 20 | 30 | 0.2 | 150 | 630 | y = 225.42$x^6$ − 507.45$x^5$ + 442.41$x^4$ − 182.81$x^3$ + 27.586$x^2$ + 6.9154x | 3.8774 |
| 30 | 20 | 0.2 | 100 | 365 | y = 1165$x^6$ − 1729.1$x^5$ + 969.72$x^4$ − 255.38$x^3$ + 28.215$x^2$ + 1.9949x | 3.1561 |
| 22 | 20 | 0.2 | 100 | 435 | y = 321.26$x^6$ − 495.79$x^5$ + 299.53$x^4$ − 93.047$x^3$ + 11.878$x^2$ + 3.99x | 4.4463 |
| 23 | 20 | 0.2 | 100 | 530 | y = 530.82$x^6$ − 893.24$x^5$ + 604.38$x^4$ − 205.16$x^3$ − 28.195$x^2$ + 4.3652x | 5.7739 |
| 24 | 20 | 0.2 | 100 | 630 | y = 747.21$x^6$ − 1197.4$x^5$ + 741.5$x^4$ − 217.47$x^3$ + 24.784$x^2$ + 2.8845x | 3.8774 |
| 25 | 20 | 0.2 | 125 | 365 | y = −454.78$x^6$ + 748.41$x^5$ − 467.28$x^4$ + 137.8$x^3$ − 22.463$x^2$ + 4.8643x | 3.0043 |
| 26 | 20 | 0.2 | 125 | 435 | y = −399.43$x^6$ + 659.66$x^5$ − 409.6$x^4$ + 113.52$x^3$ − 15.916$x^2$ + 5.6722x | 4.5474 |
| 27 | 20 | 0.2 | 125 | 530 | y = −46.317$x^6$ − 22.298$x^5$ + 112.29$x^4$ − 77.504$x^3$ + 13.876$x^2$ + 5.0038x | 5.7824 |
| 28 | 20 | 0.2 | 125 | 630 | y = 417.51$x^6$ − 711.04$x^5$ + 469.27$x^4$ − 145.5$x^3$ + 16.454$x^2$ + 3.218x | 3.8464 |
| 29 | 20 | 0.2 | 150 | 365 | y = −74.993$x^6$ + 118.24$x^5$ − 57.174$x^4$ + 5.249.2$x^3$ − 0.6172$x^2$ + 3.3699x | 3.2267 |
| 30 | 20 | 0.2 | 150 | 435 | y = −278.14$x^6$ + 503.66$x^5$ − 329.14$x^4$ + 89.552$x^3$ − 11.422$x^2$ + 5.4742x | 4.7421 |
| 31 | 20 | 0.2 | 150 | 530 | y = 3.461$x^6$ − 102.55$x^5$ + 172.08$x^4$ − 102.48$x^3$ + 18.951$x^2$ + 4.8104x | 5.872 |
| 32 | 20 | 0.2 | 150 | 630 | y = 161.84$x^6$ − 348.51$x^5$ + 286.3$x^4$ − 107.41$x^3$ + 13.817$x^2$ + 3.2921x | 3.8027 |
| 33 | 20 | 0.2 | 175 | 365 | y = 7.7262$x^6$ − 37.019$x^5$ + 56.546$x^4$ − 35.995$x^3$ + 6.9532$x^2$ + 2.7738x | 3.1017 |
| 34 | 20 | 0.2 | 175 | 435 | y = 45.959$x^6$ − 160.56$x^5$ + 213.4$x^4$ − 135.08$x^3$ + 37.556$x^2$ + 0.3871x | 4.6256 |
| 35 | 20 | 0.2 | 175 | 530 | y = 82.35$x^6$ − 237.03$x^5$ + 259.77$x^4$ − 130.11$x^3$ + 23.171$x^2$ + 4.6292x | 6.0434 |
| 36 | 20 | 0.2 | 175 | 630 | y = 138.78$x^6$ − 316.52$x^5$ + 272.92$x^4$ − 106.53$x^3$ + 14.299$x^2$ + 3.2743x | 3.7417 |
| 37 | 20 | 0.1 | 25 | 365 | y = −257.78$x^6$ + 493.22$x^5$ − 357.35$x^4$ + 125.26$x^3$ − 24.07$x^2$ + 4.2726x | 2.454 |
| 38 | 20 | 0.1 | 25 | 435 | y = −421.26$x^6$ + 736.88$x^5$ − 503.36$x^4$ + 168.42$x^3$ − 30.486$x^2$ + 5.7851x | 3.5813 |
| 39 | 20 | 0.1 | 25 | 530 | y = 55.321$x^6$ − 40.121$x^5$ − 7.75$x^4$ + 13.643$x^3$ − 8.1316$x^2$ + 5.4291x | 4.7759 |
| 40 | 20 | 0.1 | 25 | 630 | y = −199.22$x^6$ + 369.63$x^5$ − 264.28$x^4$ + 94.119$x^3$ − 20.554$x^2$ + 4.7848x | 2.9976 |

Also listed in Table 3 are the corresponding transmittance values of the base glass plate 0.090 inch thick, the HEBS-glass plate 0.090 inch thick having two ion exchanged surface glass layers (i.e. 2 IEed surfaces) and the HEBS-glass plate 0.086" thick having one ion exchanged surface glass layers (i.e. 1 IEed surface).

Accelerated test on stability of HEBS-glass No. 3 under intense actinic exposure at 436 nm was carried out. HEBS-glass No. 3, 0.090 inch thick, having. a transmittance value of 89.2% was exposed for a duration of 30 days to 586 milli watt/cm$^2$ light intensity at 436 nm from the output actinic radiation of a 200 watt mercury arc lamp, the actinic radiation being filtered with an interference filter and focused to a spot of 5 mm diameter. The transmittance value remains constant at 89.2% before and after the intense G-line exposure for 30 days.

From accelerated tests using focused 365 nm radiation from the 200 watt mercury arc lamp, it has been determined that the residual sensitivity of the exemplary HEBS-glass No. 3 to I-line at 365 nm is not detectable for optical lithographic exposure of less than about one million I-line stepper exposures.

The grayscale mask made of HEBS-glass No. 3 can in general be employed in I-line as well as G-line optical lithographic exposure systems.

An exchange of $H^+$ and/or $H_3O^+$ ions for alkali metal ions takes place concurrently with the exchange of $Ag^+$ ions for alkali-metal ions when HEBS-glass is ion exchanged in an acidic aqueous solution containing silver ions. As a result, $H^+$ and/or $H_3O^+$ ions entered into the silicate glass network and silanol groups SiOH formed in the glass network. The formation of the silanol groups in a silicate glass network is referred to as hydration of glass. HEBS-glass was hydrated, and a moving boundary type concentration profile formed. When water species are among the diffusion species in glass, the diffusion of water species (i.e.,$H^+$ and/or $H_3O^+$) and $Ag^+$ ions through a hydrated layer is accompanied by an instantaneous and irreversible immobilization of the diffusion species at the boundary surface. The moving boundary type diffusion profile is due to the fact that the diffusion coefficient of $H^+$, $H_3O^+$ and $Ag^+$ in the hydrated layer is many order of magnitude larger than that in the anhydrous base glass.

An essential feature of diffusion accompanied by an instantaneous and irreversible immobilization of the diffusion species is that a sharp boundary surface moves through the medium, separating a region in which all of the sites are occupied from one in which none are occupied. In front of the advancing boundary the concentration of freely diffusing species is zero whereas behind it immobilization is complete.

FIG. 1 is a qualitative representation of the result of silver ion exchange of HEBS-glass in an acidic aqueous solution containing soluble ionic silver. There exists a leached surface glass layer, $x_1$ in thickness, wherein essentially all of the alkali ions are leached out instead of being exchanged by $Ag^+$ ions. The leached surface glass layer is essentially fused silica in composition and contains little or no mobile ions such as sodium, potassium and lithium ions. The exemplary HEBS-glass No. 3 have a leached surface glass layer of less than about 0.5 $\mu$m, i.e., $x_1 < 0.5$ $\mu$m and has an e-beam sensitized glass layer of 3 $\mu$m, i.e., $x_2 - x_1 = 3$ $\mu$m. HEBS-glass photomask blanks having an e-beam sensitized glass layer ($x_2 - x_1$) of 2 $\mu$m, 4 $\mu$m, 5 $\mu$m and other thickness' were fabricated by controlling the ion exchange duration and/or heat schedules.

By controlling the operation parameters of the solution ion exchange reactions, the thickness of the e-beam sensitized glass layer can be controlled precisely.

Heat Effect of the Write E-Beam

The net optical density is a function of the e-beam exposure scheme and the e-beam write parameters. This is because the e-beam sensitivity of HEBS-glass is enhanced by the heating effect of the write beam. Listed in Exhibit B is the input-power density from e-beam exposure for the three exposure schemes of FIG. 8, where input-power density is equal to (beam current)×(beam acceleration voltage)/(beam spot size).

The rate of temperature increase at the beam exposure spot i.e. the e-beam exposed volume of HEBS-glass, is proportional to the net power density which is defined herein as the rate of input-power density minus the rate of heat dissipation. The rate of heat dissipation is larger for a smaller exposed volume corresponding to a smaller beam spot size. This is because the ratio of surface area to mass is larger for a smaller volume. The rate of heat dissipation relative to the rate of input-power density, together with the corresponding beam spot size are also listed in Exhibit B.

Comparing the write parameters that we employed using MEBES III with those of Cambridge EBMF 10.5. It is apparent from Exhibit B that the net power density of the MEBES exposure scheme is a factor of 10 to 100 times that of the Cambridge exposure. scheme (20 kV, 0.1 $\mu$m address, 0.25 $\mu$m spot size, 25 na). The very big difference in heat accumulation between the above described exposure parameters of MEBES III and Cambridge EBMF 10.5 should contribute to the observed difference in the e-beam induced optical density.

The following hypothesis explains the reason why the e-beam sensitivity of HEBS-glass is enhanced by the heat effect of the write beam. During e-beam exposure, silver specks of atomic dimensions were formed from silver halide-alkali halide complex crystals. The formation of a silver speck consisting of 2, 3, or more atoms requires the deformation of silver halide lattice to silver lattice. Cycles of lattice vibration of sufficient amplitude is necessary to cause the formation of the silver specks. Since larger amplitudes of lattice vibrational modes exist at higher temperatures, silver specks are formed more quickly at a higher temperature. Each retrace (i.e. each scan count) allows an extended time period for the formation of the silver specks.

The e-beam sensitivity of HEBS-glass using the exposure scheme of the EVC flood exposure system is further elaborated below. Although the input-power density of EVC exposure scheme is very little compared to that of Cambridge EBMF 10.5, the rate of heat dissipation during EVC exposure is very small relative to the input-power density, due to the enormous beam exposure spot size of 8 inches. Therefore, a large fraction of the input-power density is accumulated throughout the

TABLE 3

Transmittance Values (% T) of HEBS-glass No. 3

| Wavelength (nm) | base glass 0.090" (% T) | HEBS-glass 2 IEed Surface (% T) | HEBS-glass 1 IEed Surface (% T) | Internal Transmittance of an IEed glass layer (% T) |
|---|---|---|---|---|
| 500.0 | 91.2 | 90.6 | 90.5 | 100 |
| 495.0 | 91.0 | 90.5 | 90.2 | 100 |
| 490.0 | 91.0 | 90.6 | 90.2 | 100 |
| 485.0 | 91.0 | 90.4 | 90.3 | 100 |
| 480.0 | 90.9 | 90.2 | 90.0 | 100 |
| 475.0 | 90.8 | 90.4 | 90.0 | 100 |

TABLE 3-continued

Transmittance Values (% T) of HEBS-glass No. 3

| Wave-length (nm) | base glass 0.090" (% T) | HEBS-glass 2 IEed Surface (% T) | HEBS-glass 1 IEed Surface (% T) | Internal Transmittance of an IEed glass layer (% T) |
|---|---|---|---|---|
| 470.0 | 90.7 | 89.9 | 89.9 | 100 |
| 465.0 | 90.7 | 89.9 | 89.7 | 100 |
| 460.0 | 90.6 | 89.9 | 89.7 | 100 |
| 455.0 | 90.6 | 89.6 | 89.7 | 100 |
| 450.0 | 90.5 | 89.6 | 89.4 | 100 |
| 445.0 | 90.4 | 89.4 | 89.4 | 100 |
| 440.0 | 90.4 | 89.2 | 89.3 | 100 |
| 435.0 | 90.4 | 89.2 | 89.1 | 99.9 |
| 430.0 | 90.2 | 88.6 | 89.0 | 99.9 |
| 425.0 | 90.2 | 88.6 | 88.8 | 99.6 |
| 420.0 | 90.1 | 88.0 | 88.7 | 99.6 |
| 415.0 | 90.0 | 87.6 | 88.3 | 99.3 |
| 410.0 | 89.9 | 86.9 | 88.0 | 99.0 |
| 405.0 | 89.9 | 86.1 | 87.6 | 98.7 |
| 400.0 | 89.9 | 84.9 | 87.0 | 98.1 |
| 395.0 | 89.7 | 83.3 | 86.3 | 97.4 |
| 390.0 | 89.7 | 81.3 | 85.3 | 96.3 |
| 385.0 | 89.5 | 78.7 | 83.9 | 94.9 |
| 380.0 | 89.4 | 75.0 | 82.1 | 92.7 |
| 375.0 | 89.1 | 71.2 | 79.9 | 90.5 |
| 370.0 | 88.4 | 65.7 | 76.8 | 87.6 |
| 365.0 | 87.1 | 59.1 | 72.3 | 83.7 |
| 360.0 | 84.7 | 51.2 | 66.7 | 79.1 |
| 355.0 | 80.0 | 41.9 | 58.8 | 73.6 |
| 350.0 | 71.6 | 31.3 | 48.2 | 66.9 | flood exposure duration. Moreover, HEBS-glass was under EVC flood gun exposure for a long duration of e.g. 10 minutes which corresponds to 600×10$^{12}$ periods of lattice vibration. There is thus plenty of time for the deformation of silver halide lattice into silver lattice.

For the choice of write parameters using any e-beam writer to write a gray level mask it is helpful to consider the HEBS-glass properties which are summarized immediately below. HEBS-glass is more sensitive using a larger beam current density and a larger beam spot size, since the sensitivity is enhanced by the heating effect of the write beam. At a given current density, a larger spot size is beneficial since heat dissipation is slower. Using a high kV beam and a spot size of up to about 0.2 μm, the resolution of the recorded image in HEBS-glass is primarily determined by the scattering of the electrons in glass. To a certain extent, one can increase both the spot size and the beam current to maximize the throughput without the adverse effect of reducing resolution.

A much larger beam current density than that normally used in exposing photoresist can be employed and is recommended for e-beam write on HEBS-glass.

Using a vector scan e-beam writer, a large range of available clock rates is the key factor to produce a large optical density range of gray levels. The maximum clock rate of an e-beam writer is employed to produce the minimum optical density level of the gray levels. The larger the maximum clock rate the higher the currant density that can be employed and therefore higher throughput.

When a vector scan e-beam writer has a limited range of useful clock rates, one retrace (i.e. two scan counts) can be utilized to double the optical density values for all phase levels provided the linear region of the sensitivity curve is utilized.

Number of retraces can be employed as a variable parameter using a raster scan e-beam writer. For example, 16 phase levels can be obtained using 1 to 16 scan counts, namely, using 1 scan count to expose the lowest optical density level and using 16 scan counts to write the highest optical density level.

Although the e-beam sensitivity of HEBS-glass is a function of the exposure scheme and write parameters, e-beam induced optical density in the HEBS-glass is a unique function of electron dosage for a given set of write parameters. Therefore, the net optical density versus electron dosage is very reproducible.

Exhibit B Input-power density and rate of heat dissipation.

| | Input-Power Density (Watt/cm$^2$) | Beam Spot Size | Relative Rate of Heat Dissipation |
|---|---|---|---|
| MEBES III 1 scancount | 8 × 10$^6$ | 1 μm | Small |
| Cambridge EBMF 10.5 | 8 × 10$^5$ | 0.25 μm | Large |
| EVC | 0.1 | 8 inch | Very small |

Coloring Speck of Silver

Upon e-beam exposure coloring specks of silver are formed in the HEBS-glass. Since there are no chemical or physical development steps, the silver specks are of atomic dimensions and the image has no graininess. The recorded image has a continuous tone even when observed at the highest magnification under microscope e.g. 1500×. On the contrary, at this high magnification the image in a conventional high resolution photographic emulsion plate is intrinsically halftone, because isolated grains of photographic emulsion plates resembling dispersed halftone dots exist at gray levels of low optical density values.

Sub 0.25 Micrometer Resolution

Since there is no graininess, HEBS-glass is capable of very high resolution. Sub 0.25 μm features were written in the exemplary HEBS-glasses of Exhibit A.

Vertical resist profile exists at the boundary of sub micron resist features which were printed using HEBS-glass masks.

HEBS-Glass Gray Scale Masks with Multi-Gray Levels

Figure 10:
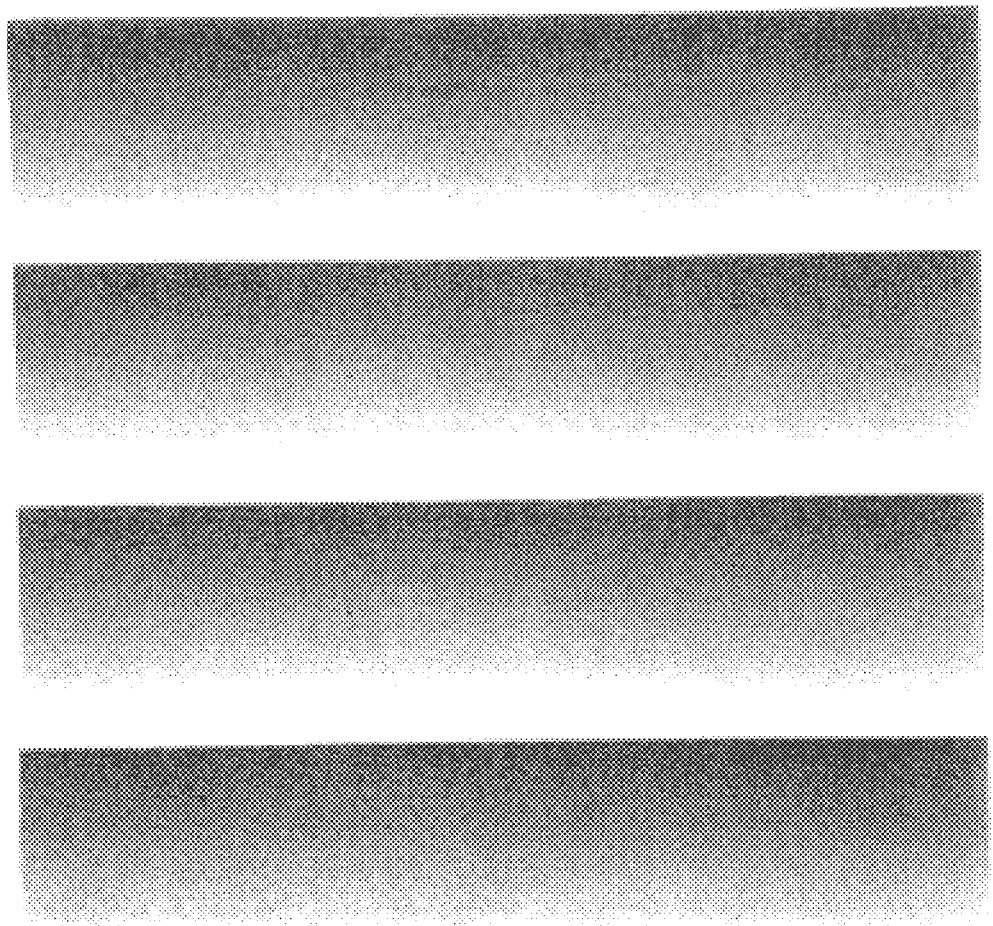
FIG. 10 exhibits an optical micrograph of a gray scale mask which is a grating in HEBS-glass No. 3. The grating has 250 gray levels within a period of 200 $\mu$m.

FIG. 10 exhibits an optical micrograph of a gray scale mask which is a grating in HEBS-glass No.3 The grating has 250 gray levels within a period of 200 micrometers. A Cambridge EBMF 10.5 e-beam writer operated at 20 kV, 0.2 μm addressing grid size and 100 na beam current, was employed to fabricate the grating with 250 predetermined optical density values. The maximum and minimum optical density value are 1.6 and 0.149 respectively. The gray levels have an equal interval of transmittance, namely the values of the transmittance T corresponding to 250 gray levels are $$Ti=0.709578-(0.684459/249)i$$

Where i=0, 1, 2, . . . to 249

The gradual and smooth increase in the transmittance within each grating period seen in FIG. 10 should result in analog resist profile having smooth continuous blaze surfaces.

Figure 11:
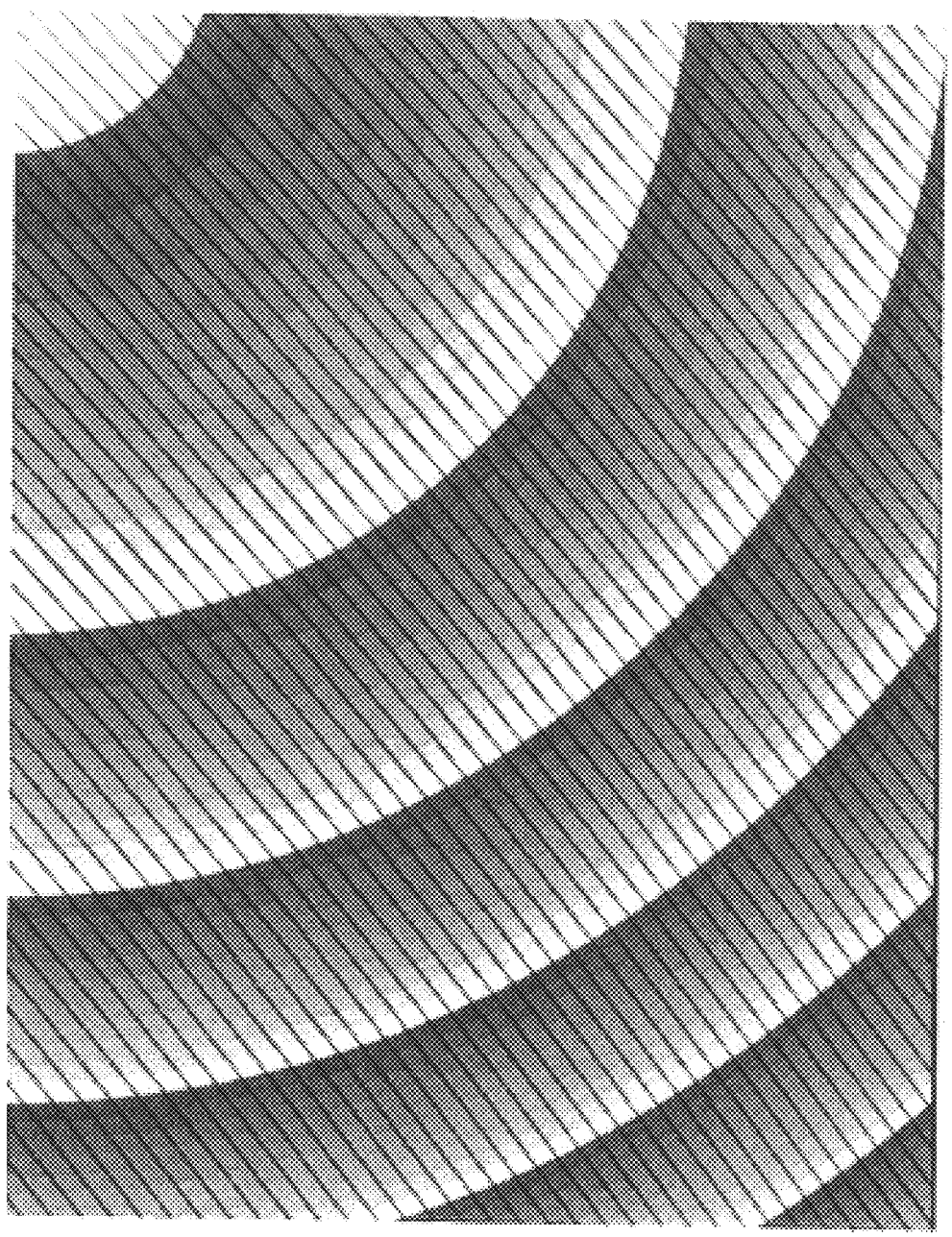
FIG. 11 exhibits an optical micrograph of a portion of a gray scale mask which is a diffractive optical lens having ten gray levels in each zone.

FIG. 11 exhibits an optical micrograph of a portion of a gray scale mask made of HEBS-glass No. 3. The primary mask pattern is a diffractive. optical lens having ten gray levels in each zone. The width of 5 complete zones represented in the photo are 920 μm, 500 μm, 390 μm, 330 μm and 290 μm. Ten gray levels in the range of 0 to 1.0 unit of optical density values, were written in HEBS-glass No. 3 using Cambridge EBMF 10.5 e-beam writer operated at 20 kv acceleration voltage, 0.2 μm addressing grid size and 150 na beam current. It is seen in FIG. 11, as the zone width reduces from 920 μm the discreet gray levels become less apparent.

A second pattern which consists of parallel lines with a 42 μm pitch was written within the lens pattern to demonstrate that a predetermined optical density value can be added to the existing mask pattern in HEBS-glass. Since the parallel lines was written with a constant e-beam dosage, the optical density along each lines increases as it enters into a darker gray level of the lens pattern.

One of the products of the present invention is a transparent HEBS-glass which in bodies of 0.090 inch cross section will exhibit the following properties:

(a) the transmittance is more than 88% at 436 nm (b) upon exposure to an electron beam with an electron beam pattern generator operated at a value of acceleration voltage selected from 20 to 30 kV, a value of addressing grid size selected from 0.1 to 0.4 micrometer, and a value of beam current selected from 25 to 250 na, the electron beam darkening sensitivity in the linear portion of the sensitivity curve, is at least 2.454 unit of optical density value in the spectral range of 365 nm to 630 nm per milli coulomb/cm$^2$.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% TiO$_2$, 1.1 to 2.4% Al$_2$O$_3$, 0 to 4.6% B$_2$O$_3$, 3.7 to 13.2% ZnO, 0.5 to 6% Cl and 58.2 to 78.8% SiO$_2$.

Another of the product of the present invention is a transparent HEBS-glass which in bodies of 0.090 inch cross section will exhibit the following properties:

(a) the transmittance is more than 88% at 436 nm (b) upon exposure to an electron beam using an electron beam pattern generator operated with a write scheme having a value of acceleration voltage selected from 20 to 30 kV, a value of addressing grid size selected from 0.1 to 0.4 micrometer, and a value of beam current selected from 25 to 250 na, the electron beam darkening sensitivity in the linear portion of the sensitivity curve, is at least 2.454 unit of optical density value in the spectral range of 365 nm to 630 nm per milli coulomb/cm$^2$. The write scheme is selected from the write schemes of Table 2, said electron beam darkening sensitivity of the HEBS-glass is substantially represented by the sensitivity curve corresponding to that of the chosen write scheme of Table 2.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% TiO$_2$, 1.1 to 2.4% Al$_2$O$_3$, 0 to 4.6% B$_2$O$_3$, 3.7 to 13.2% ZnO, 0.5 to 6% Cl and 58.2 to 78.8% SiO$_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 30 kV, an addressing grid size of 0.4 micrometer and a beam current of 250 na will darken to a net optical density value Y at 365 nm substantially in accordance with the equation stated immediately below;

$$Y=19708x^6-17787x^5+6181.2x^4-1063.8x^3+85.688x^2+3.3806x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% TiO$_2$, 1.1 to 2.4% Al$_2$O$_3$, 0 to 4.6% B$_2$O$_3$, 3.7 to 13.2% ZnO, 0.5 to 6% Cl and 58.2 to 78.8% SiO$_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 30 kV, an addressing grid size of 0.4 micrometer and a beam current of 250 na will darken to a net optical density value Y at 435 nm substantially in accordance with the equation stated immediately below;

$$Y=-15440x^6+12082x^5-3761.5x^4+555.15x^3-40.414x^2+10.637x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% TiO$_2$, 1.1 to 2.4% Al$_2$O$_3$, 0 to 4.6% B$_2$O$_3$, 3.7 to 13.2% ZnO, 0.5 to 6% Cl and 58.2 to 78.8% SiO$_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 30 kV, an addressing grid size of 0.4 micrometer and a beam current of 250 na will darken to a net optical density value Y at 530 nm substantially in accordance with the equation stated immediately below;

$$Y=46062x^6-38146x^5+12229x^4-2013.9x^3+173.69x^2+5.8097x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% TiO$_2$, 1.1 to 2.4% Al$_2$O$_3$, 0 to 4.6% B$_2$O$_3$, 3.7 to 13.2% ZnO, 0.5 to 6% Cl and 58.2 to 78.8% SiO$_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 30 kV, an addressing grid size of 0.4 micrometer and a beam current of 250 na will darken to a net optical density value Y at 630 nm substantially in accordance with the equation stated immediately below;

$$Y=51961x^6-43905x^5+14402x^4-2361.2x^3+197.27x^2+2.2436x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 20 kV, an addressing grid size of 0.1 micrometer and a beam current of 25 na will darken to a net optical density value Y at 365 nm substantially in accordance with the equation stated immediately below;

$$Y=-257.78x^6+493.22x^5-357.35x^4+125.26x^3-24.07x^2+4.2726x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 20 kV, an addressing grid size of 0.1 micrometer and a beam current of 25 na will darken to a net optical density value Y at 435 nm substantially in accordance with the equation stated immediately below;

$$Y=421.26x^6+736.88x^5-503.36x^4+168.42x^3-30.486x^2+5.785x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 20 kV, an addressing grid size of 0.1 micrometer and a beam current of 25 na will darken to a net optical density value Y at 530 nm substantially in accordance with the equation stated immediately below;

$$Y=55.321x^6-40.121x^5-7.75x^4+13.643x^3-8.1316x^2+5.4291x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 20 kV, an addressing grid size of 0.1 micrometer and a beam current of 25 na will darken to a net optical density value Y at 630 nm substantially in accordance with the equation stated immediately below;

$$Y=-199.22x^6+369.63x^5-264.28x^4+94.119x^3-20.554x^2+4.7848x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 75 na will darken to a net optical density value Y at 365 nm substantially in accordance with the equation stated immediately below;

$$Y=4788.8x^6-4881.1x^5+1822.8x^4-308.43x^3+19.251x^2+4.098x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 75 na will darken to a net optical density value Y at 435 nm substantially in accordance with the equation stated immediately below;

$$Y=3780.7x^6-4395.5x^5+1959.1x^4-421.14x^3+40.268x^2+4.882x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 100 na will darken to a net optical density value Y at 365 nm substantially in accordance with the equation stated immediately below;

$$Y=-355.78x^6+466.62x^5-243.17x^4+62.851x^3-12.485x^2+5.5571x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 100 na will darken to a net optical density value Y at 435 nm substantially in accordance with the equation stated immediately below;

$$Y=-692.18x^6+804.39x^5-358.96x^4+75.143x^3-10.535x^2+6.9982x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 125 na will darken to a net optical density value Y at 365 nm substantially in accordance with the equation stated immediately below;

$$Y=-664.62x^6+932.44x^5-464.2x^4+95.04x^3-13.314x^2+6.4665x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 125 na will darken to a net optical density value Y at 435 nm substantially in accordance with the equation stated immediately below;

$$Y=900.79x^6+1480.9x^5-905.98x^4+243.25x^3-32.801x^2+9.8528x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 150 na will darken to a net optical density value Y at 365 nm substantially in accordance with the equation stated immediately below;

$$Y=-104.68x^6+149.86x^5-51.158x^4-8.925x^3-0.3208x^2+5.866x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 30 kV, an addressing grid size of 0.2 micrometer and a beam current of 150 na will darken to a net optical density value Y at 435 nm substantially in accordance with the equation stated immediately below;

$$Y=-341.18x^6+643.91x^5-430.4x^4+115.13x^3-16.314x^2+9.1502x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_{2,\ 1.1}$ to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm² of electron dosage with an electron beam writer operated at a beam acceleration voltage of 20 kV, an addressing grid size of 0.2 micrometer and a beam current of 100 na will darken to a net optical density value Y at 365 nm substantially in accordance with the equation stated immediately below;

$$Y=1165x^6-1729.1x^5+969.72x^4-255.38x^3+28.215x^2+1.9949x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 m (b) upon exposure to a value X in milli coulomb/cm$^2$ of electron dosage with an electron beam writer operated at a beam acceleration voltage of 20 kV, an addressing grid size of 0.2 micrometer and a beam current of 100 na will darken to a net optical density value Y at 435 nm substantially in accordance with the equation stated immediately below;

$$Y=321.26x^6-495.79x^5+299.53x^4-93.047x^3+11.878x^2+3.99x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 20 kV, an addressing grid size of 0.2 micrometer and a beam current of 125 na will darken to a net optical density value Y at 365 nm substantially in accordance with the equation stated immediately below;

$$Y=-454.78x^6+748.41x^5-467.28x^4+137.8x^3-22.463x^2+4.8643x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 20 kV, an addressing grid size of 0.2 micrometer and a beam current of 125 na will darken to a net optical density value Y at 435 nm substantially in accordance with the equation stated immediately below;

$$Y=-399.43x^6+659.66x^5-409.6x^4+113.52x^3-15.916x^2+5.6722x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 20 kV, an addressing grid size of 0.2 micrometer and a beam current of 150 na will darken to a net optical density value Y at 365 nm substantially in accordance with the equation stated immediately below;

$$Y=-74.993x^6+118.24x^5-57.174x^4+5.2492x^3-0.6172x^2+3.3699x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 20 kV, an addressing grid size of 0.2 micrometer and a beam current of 150 na will darken to a net optical density value Y at 435 nm substantially in accordance with the equation stated immediately below;

$$Y=-278.14x^6+503.66x^5-329.14x^4+89.552x^3-11.422x^2+5.4742x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 20 kV, an addressing grid size of 0.2 micrometer and a beam current of 175 na will darken to a net optical density value Y at 365 nm substantially in accordance with the equation stated immediately below;

$$Y=7.7262x^6-37.019x^5+56.546x^4-35.995x^3+6.9532x^2+2.7738x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

Another product of the present invention is a transparent HEBS-glass which in bodies of 0.090 inch cross section will exhibit the following properties:

(a) the transmittance is more than 88% at 436 nm (b) upon exposure to a value X in milli coulomb/cm$^2$ of electron dosage with an electron beam writer operated at a beam acceleration voltage of 20 kV, an addressing grid size of 0.2 micrometer and a beam current of 175 na will darken to a net optical density value Y at 530 nm substantially in accordance with the equation stated immediately below;

$$Y=82.35x^6-237.03x^5+259.77x^4-130.11x^3+23.171x^2+4.6292x$$

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$.

The products of the present invention described above have utility in making a gray scale mask with multi-gray levels, each of said gray levels having a predetermined optical density value which is obtained through exposure to a predetermined electron dosage, said gray scale mask can be utilized in making three dimensional microstructures with general three dimensional surfaces in photoresist through a single optical exposure in a photolithographic process.

The profile of a three dimensional surface is transferred into a substrate material using an etching process.

For example, one of the products of the present invention is a transparent HEBS-glass which in bodies of 0.090 inch cross section will exhibit the following properties:

(a) the transmittance is more than 88% at 436 nm (b) upon exposure to an electron beam with an electron beam pattern generator operated at a value of acceleration voltage selected from 20 to 30 kV, a value of addressing grid size selected from 0.1 to 0.4 micrometer, and a value of beam current selected from 25 to 250 na, the electron beam darkening sensitivity in the linear portion of the sensitivity curve, is at least 2.454 unit of optical density value in the spectral range of 365 nm to 630 nm per milli coulomb/cm$^2$.

Said HEBS-glass having a base glass composition consisting essentially on the mole % oxide basis 11.4 to 17.5% of one or more alkali: metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$ has utility in making a gray scale mask with multi-gray levels, each of said gray levels having a predetermined optical density value which is obtained through exposure to a predetermined electron dosage, said gray scale mask can be utilized in making three dimensional microstructures with general three dimensional surfaces in photoresist through a single optical exposure in a photolithographic process.

Cost Efficient Mass Fabrication of Diffractive Optical Elements (DOEs)

HEBS-glass is a mask material sensitive towards e-beam exposure, and exposure with a certain electron beam dosage changes the optical density of the material. After e-beam exposure the mask needs no further development or fixation process. The mask with multi levels of optical densities can then be used to expose a photo resist in a contact aligner or in a reduction stepper. This allows to associate a certain resist thickness after development with each optical density. The information was used to determine the e-beam dosages for each of the (e.g. 32) phase levels necessary to generate a Diffractive Optical Elements (DOE herein after). The so generated HEBS-glass gray level mask can be used to expose numerous DOEs using an optical lithography tool. After many copies of the mask on the photo resist are developed, many substrates with the developed photo resist are placed in a Chemically Assisted Ion Beam Etching (CAIBE) system, to simultaneously transfer the microstructures from the analog resists onto the surfaces of the substrates. An overview of these processing steps is shown in FIG. 12.

Figure 12:
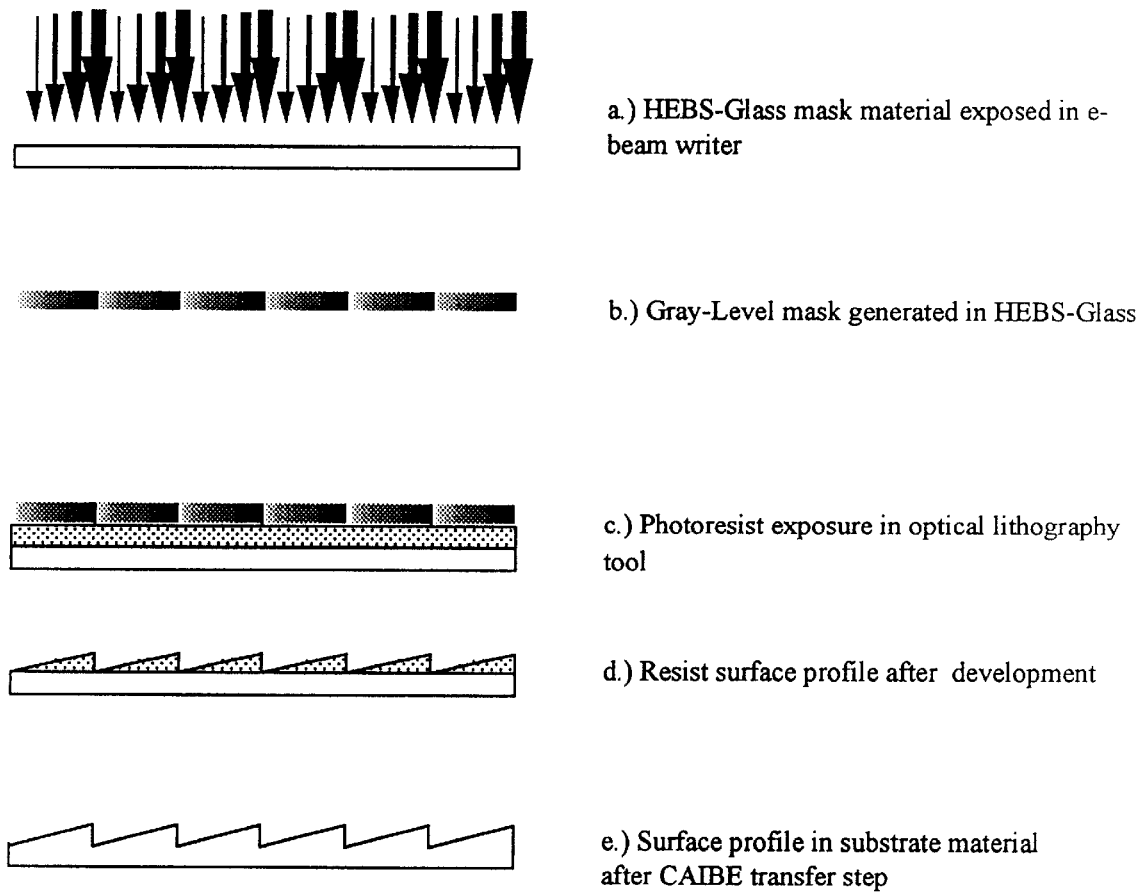
FIG. 12 illustrate that the processing steps necessary to generate Diffractive Optical Elements consisting of (a) a HEBS-glass photo mask blank being exposed in e-beam writer (b) gray level mask generated in HEBS-glass (c) photoresist exposure in optical lithography tool (d) resist surface profile after development (e) surface profile in substrate material after CAIBE transfer step.

The fabrication of DOE arrays using a HEBS-glass gray scale mask with multi gray levels and the process steps of FIG. 12 was described in "cost-effective mass fabrication of multi-level diffractive optical elements by use of a single optical exposure with a gray scale mask on high-energy beam sensitive glass" Applied Optics, Jul. 10, 1997/Vol. 36, No. 20 by Walter Daschner, Pin Long, Robert Stein, Che-Kuang (Chuck) Wu and S. H. Lee.

The described fabrication method shows the cost effective mass fabrication of DOEs. There are a number of advantages:

The mass fabrication is simplified and more cost-effective. Instead of a set of masks (i.e. 5 masks for 32 phase levels) with all the associated resist processing, only a single mask needs to be exposed in the e-beam writer and no resist processing is associated with the mask generation. Phase levels of DOE are immediately visible as gray levels in HEBS-glass upon e-beam exposure.

All phase levels are written in a single step on a single mask. The inevitable mis-registrations and associated efficiency losses between subsequent exposures are avoided.

Third, the number of processing steps for the DOE fabrication compared to binary mask fabrication of e.g. 32 phase levels is reduced by a factor of 5. This will reduce the cost for high quality monolithic DOEs substantially.

Fourth, even with a binary fabrication method for master fabrication and a following replication step based on injection molding this replication method only becomes economic with a number of DOEs to be fabricated in the 10's of thousands. Since the proposed fabrication method greatly reduces the involved fabrication steps resulting in a cost reduction, the number at which molding based methods become economically feasible will grow considerably. This will allow to avoid the problems associated with the molding approach. The material which is best suited for the application, can be chosen without being limited by the constraints of the molding material (i.e. limited temperature range of operation or limited wavelength range). Also all the involved materials and tools are compatible with VLSI fabrication so that no new fabrication or software tools need to be established unlike in the case of replication by injection molding or casting.

There is a considerable gain in turn around time since the number of production steps has been reduced and the mask fabrication steps have been simplified.

Cost Efficient Mass Fabrication of Asymmetric Irregularly Shaped Micro-Lens Arrays A cost-effective way of fabricating large arrays of refractive micro lenses becomes more and more important. Gray level mask fabrication offers the possibility to shape arbitrary resist profiles and therefore produce arrays of general aspheric non rotationally symmetric refractive lenses with different functionality, complete aberration correction and a 100% fill-factor. The fabrication method based on HEBS-glass gray level mask allows for complete freedom in terms of the shapes e.g. asymmetric, irregularly shaped lenses, and location of the lenses e.g. with accurate center to center spacing.

As the resist for the lithography step a comparatively thick photoresist can be employed in order to achieve a resist thickness in the range of up to 30 microns. This feature depth in resist will allow for a total lens sag after the etching transfer of up to about 120 microns, since a magnification of the feature depth of about a factor of 3 to 5 can be achieved during the transferring step of resist profiles into their respective substrates via Chemically Assisted Ion Beam Etching (CAIBE). The described fabrication steps are shown in FIG. 13.

Figure 13:
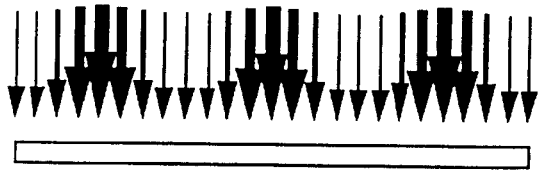
FIG. 13 illustrates that the processing steps to fabricate refractive lens arrays consisting of (a) a HEBS-glass photo mask blank being exposed in e-beam writer (b) gray level mask generated in HEBS-glass (c) photoresist exposure in mask aligner (d) resist surface profile after development (e) lens profile after etching transfer step.
Figure 13:
Figure 13:
Figure 13:
Figure 13:

For the analog transfer scheme of FIG. 13, i.e. from an optical density profile in the gray-level mask into a surface height profile in the photoresist, it is necessary that the number of gray levels be increased as the aperture of the refractive lens increases; for example, HEBS-glass masks having a minimum of 32, 64, and 96 gray levels are desirable to fabricate refractive micro lenses having apertures of 50 $\mu$m, 100 $\mu$m, and 200 $\mu$m, respectively.

The fabrication of refractive microlens arrays using a HEBS-glass gray level mask and the processing steps of FIG. 13 was described in "General aspheric refractive micro-optics fabricated by optical lithography using a high energy beam sensitive glass gray-level mask" J. Vac. Sci. Technol. B 14 (6), November/December 1996 by Walter Daschner, Pin Long, Robert Stein, Che-kuang (Chuck) Wu and S. H. Lee.

The Analog Transfer Scheme Using HEBS-glass Gray Scale Masks

It has been determined that the procedures of processing photoresist to produce analog resist profile can be derived from those normally used for binary photo lithography with the following modifications and provisions:

1. positive and non chemically amplified Novalac based photoresist is preferred
2. prebake photoresist at a low temperature and for a shortened time duration from that is normally used for binary lithography
3. use a weak developer, or dilute the usual developers for example, by a factor of 4.

Figure 14:
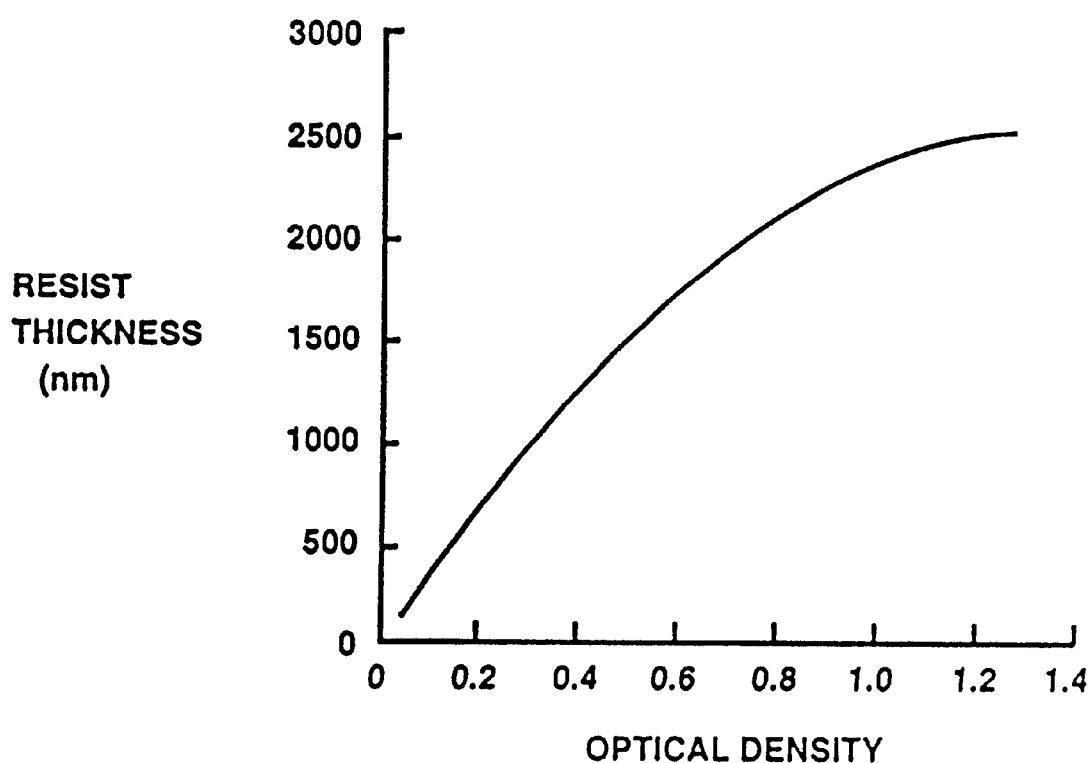
FIG. 14 depicts the thickness of Shipley S1650 Photoresist versus optical density at 436 nm of HEBS-glass mask; photoresist was exposed in an optical contact aligner.

Exemplary Calibration Curves (a) Surface height versus optical density, i.e. the calibration curve of the analog transfer scheme FIG. 14 shows the remaining thickness after development of Shipley S1650 photoresist as a function of the optical density at 436 nm of the gray levels in a HEBS-glass mask. The initial (i.e. as coated) thickness of the Shipley S1650 photoresist was 4.0 $\mu$m. The range of resist thickness in the depth versus optical density calibration curve can be altered through the choice of a photoresist and/or resist parameters, the initial thickness of the photoresist in particular. In the plots of resist thickness versus optical density, the slope of the calibration curve reduces as the developed resists thickness approaches the initial (as coated) resists thickness. Therefore, to produce an analog resist profile of a given feature depth, it is necessary to start with an as coated resist thickness which is more than that of its required feature depth.

To transfer multilevel resist structure of DOE into quartz through a dry etching process, the relative etch rate between photoresist and quartz substrate can be so chosen to achieve the final needed etch depth 3 to 6 times that in the resist. Therefore, for the fabrication of DOE in quart, a surface height variation of e.g. 500 nm in the resist results in a depth modulation in quartz of up to 3000 nm.

(b) Electron beam darkening sensitivity curve (Optical density versus electron dosage).

Table 2 list, FIG. 7 and FIG. 8 depict the exemplary e-beam darkening sensitivity curves of HEBS-glass No.3. For DOE fabrication the required optical density values of a HEBS-glass gray level mask are typically in the range of 0.1 to 1.2.

For the fabrication of refractive micro lens arrays, the optical density levels in a HEBS-glass gray level mask is in general in the range of 0 to more than 1.2. The maximum optical density value is larger to produce a larger lens-sag.

(c) Optical density versus clock rate, i.e. the calibration curve of e-beam exposure.
The electron dosage D in micro coulomb/cm$^2$ is calculated as follows:

$$D(\mu c/cm^2)=I \cdot t \cdot N=I \cdot N/f$$

Where I is bean current in amp., t is exposure duration i.e. dwell time per pixel in $\mu$sec, and N is number of pixels in 1 cm$^2$. The exposure duration per pixel is equal to 1/f, where f is the clock rate i.e. the write frequency. Since the clock rate can be varied on the fly using a vector scan e-beam writer, the calibration curve of e-beam exposure "optical density versus clock rate" is a practical one for a vector scan e-beam writer. The calibration curve was determined experimentally for each combination of write parameters which include beam acceleration voltage, beam current and addressing grid size.

Figure 15:
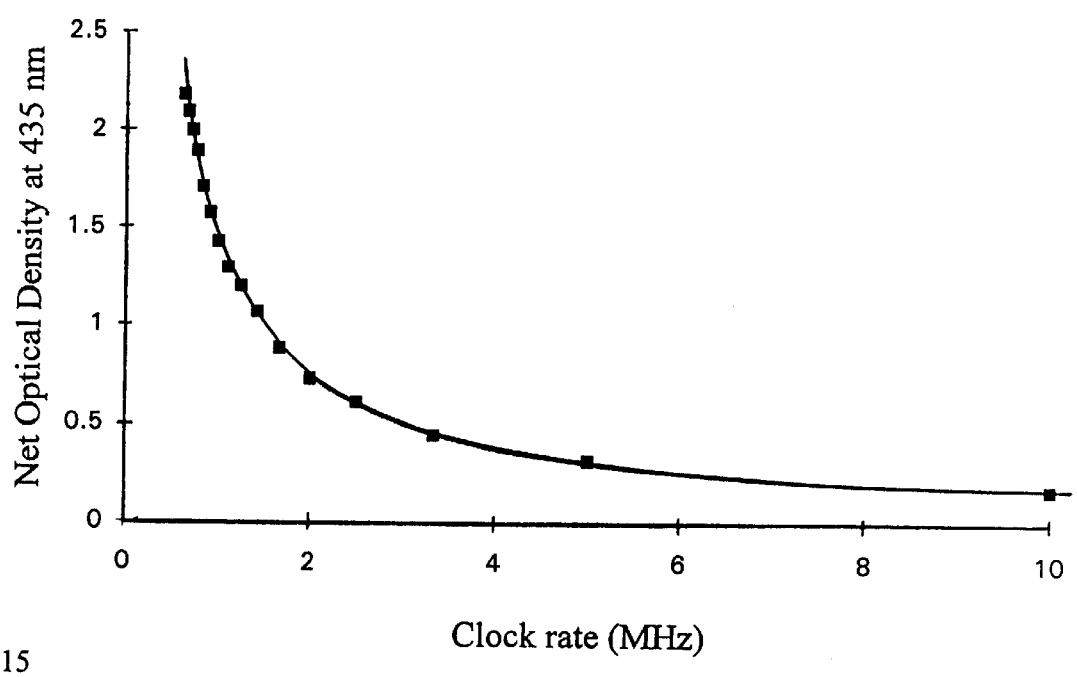
FIG. 15 records the calibration curve "net optical density at 435 nm versus clock rate" of e-beam exposure at 30 kv using Cambridge EBMF 10.5 e-beam writer with 250 na beam current and 0.4 $\mu$m addressing grid size.
Figure 16:
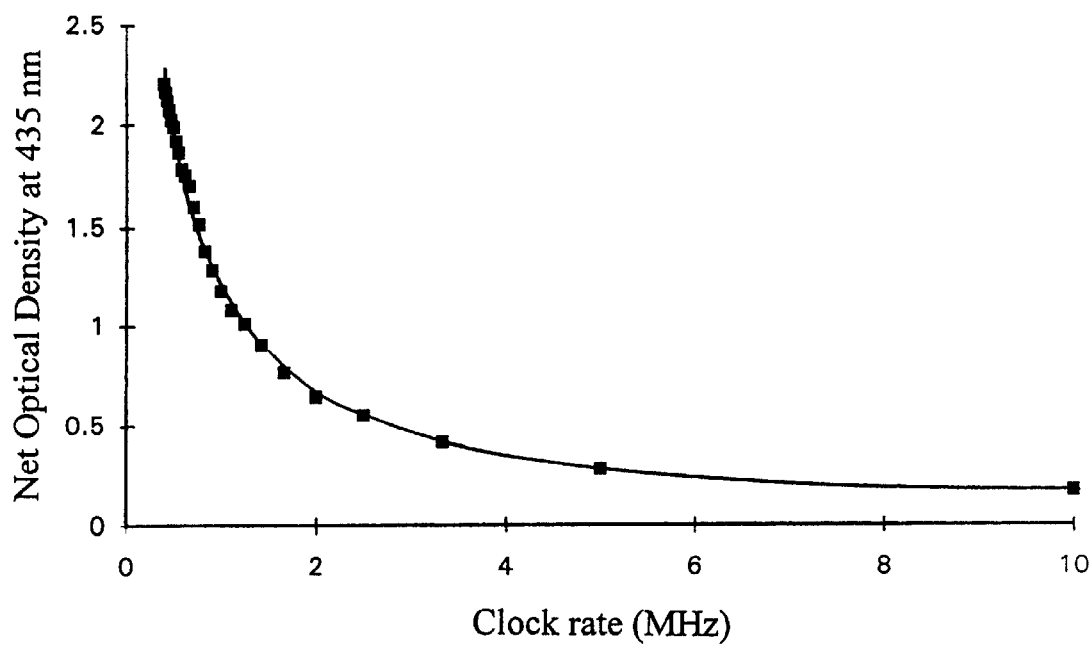
FIG. 16 records the calibration curve "net optical density at 435 nm versus clock rate" of e-beam exposure at 30 kv using Cambridge EBMF 10.5 e-beam writer with 75 na beam current and 0.2 $\mu$m addressing grid size.

The net optical density values at 435 nm and the corresponding clock rates are plotted in FIG. 15 and FIG. 16 for two write scheme using the data of Table 1 and Table 2. FIG. 15 exhibits the calibration curve "net optical density versus clock rate" for the e-beam write scheme of 30 kv, 250 na beam current and 0.4 $\mu$m addressing grid size. FIG. 16 displays the calibration curve "net optical density versus clock rate" for the e-beam write scheme of 30 kv, 75 na beam current and 0.2 $\mu$m addressing grid size.

Fabrication of HEBS-glass Gray Level Masks

A HEBS-glass photomask with multi-gray levels is ideally suited for fabrication of diffractive optical elements (DOE), refractive micro optics, micro-electro-mechanical (MEM) devices, micro-opto-electro-mechanical (MOEM) devices and integrated optical components, and for beam shaping optics.

A mask for multi phase levels of DOE is made by exposing in an e-beam writer with predetermined dosages according to a calibration curve of the analog transfer scheme such as that shown in FIG. 14 together with the e-beam darkening sensitivity curve, examples of which are listed in Table 2.

To make a HEBS-glass gray level mask using a vector scan e-beam writer, optical density levels which will achieve evenly spaced multi depth levels over the thickness range of photoresist needed for a subsequent dry etching, are determined from a calibration curve of the analog transfer scheme e.g. FIG. 14. Each optical density level in the mask is then written with a clock rate corresponding to the predetermined optical density value. The clock rate is determined from the calibration curve of e-beam exposure such as that shown in FIG. 15 and FIG. 16. The calculation of the clock rate is further elaborated below.

The clock rates f were calculated from polynomial equations such as eq. A and eq. B for a large number of the predetermined optical density levels of gray level mask designs. Eq. A and eq. B are the best polynomial fit equations of the experimental data.

$$1/f=0.0692\ D^6-0.4299\ D^5+1.0403\ D^4-1.2009\ D^3+0.666\ D^2+0.5339D \qquad \text{eq. A}$$

$$1/f=0.012\ D^6-0.0862\ D^5+0.304\ D^4-0.5256\ D^3+0.5491\ D^2+0.5622D \qquad \text{eq. B}$$

Figure 17:
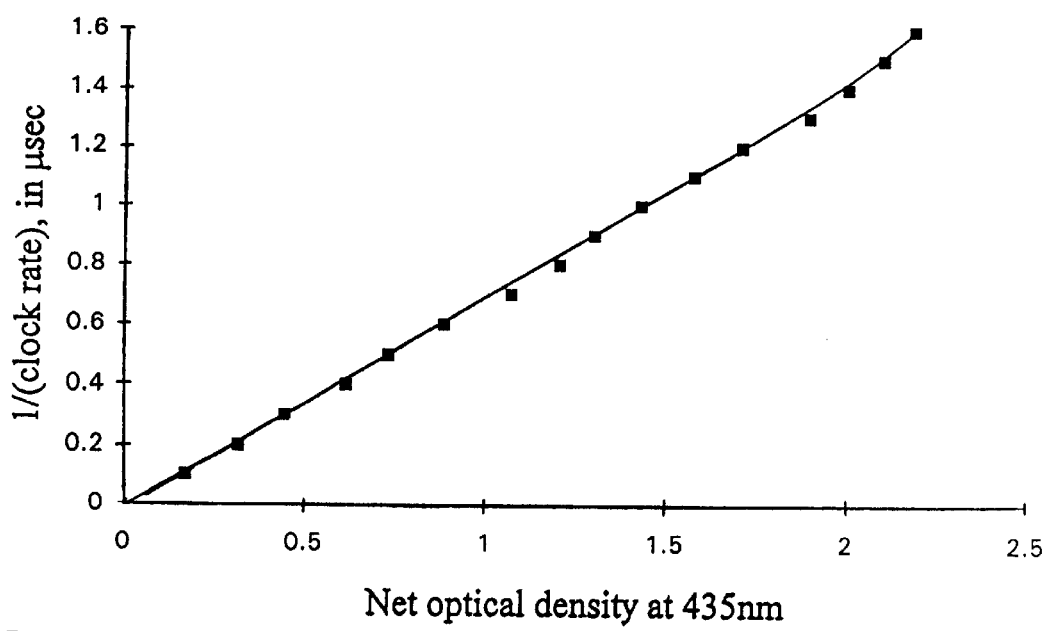
FIG. 17 records the calibration curve "1/(clock rate) versus net optical density at 435 nm" of e-beam exposure at 30 kv using Cambridge EBMF 10.5 e-beam writer with 250 na beam current and 0.4 μm addressing grid size.

Plotted the experimental data of Table 1, FIG. 17 exhibits the calibration curve "1/(clock rate) versus net optical density at 435 nm" for the e-beam write scheme of 30 kv, 250 na beam current and 0.4 $\mu$m addressing grid size. Eq. A is the best polynomial fit equation of the data points of FIG. 17.

Figure 18:
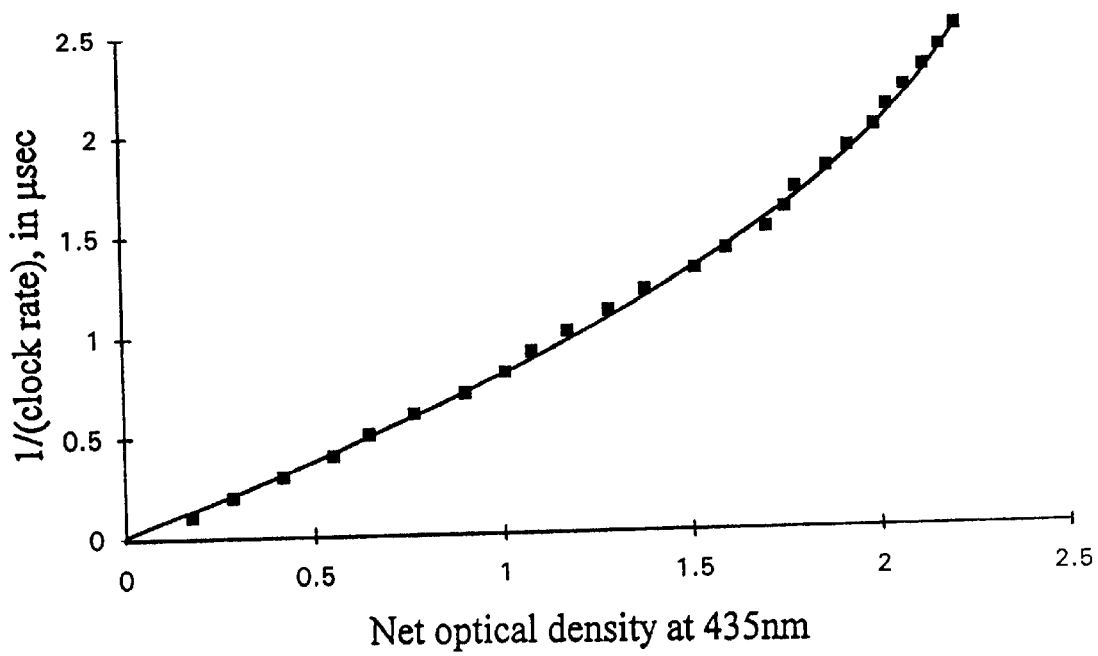
FIG. 18 records the calibration curve "1/(clock rate) versus net optical density at 435 nm" of e-beam exposure at 30 kv using Cambridge EBMF 10.5 e-beam writer with 75 na beam current and 0.2 μm addressing grid size.

FIG. 18 displays the calibration curve "1/(clock rate) versus net optical density at 435 nm" for the e-beam write scheme of 30 kv, 75 na beam current and 0.2 $\mu$m addressing grid size. Eq. B is the best fit polynomial equation of the data points of FIG. 18.

HEBS-glass masks having gray levels ranging from just a few to many hundreds were fabricated via e-beam direct write in HEBS-glass. For example, a very high quality, sinusoidal absorption grating 2 cm×2 cm in size having 625 gray levels within each period of 250 $\mu$m±0.2 $\mu$m was fabricated using Cambridge EBMF 10.5 e-beam writer. The grating is a series of linear strips, 2 cm long whose absorbance varies sinusoidally along the direction perpendicular to the strips. The linear strip which is the lines of constant optical density, has a requirement of better than ±0.1 $\mu$m in linearity. Within each period, the minimum transmission at the wavelength of 435 nm is 1% of the maximum transmission. 625 clock rates were determined from the eq. A for the grating fabricated using the write scheme of Table 1. A different set of 625 clock rates were determined from eq. B for a second grating fabricated using a second set of write parameters. The minimum and the maximum optical density values of the 625 gray levels are 0.172 and 2.172 using the write scheme of FIG. 17, and are 0.178 and 2.178 using the write parameters of FIG. 18.

Using a gray level mask in an optical exposure system, the throughput of resist exposure in DOE fabrication increases with a lower value of the minimum optical density level in the gray level mask. It is therefore desirable to have the optical density value of the lowest gray level being about or below 0.1.

A vector scan e-beam writer having the capability of higher clock rates can be employed to increase the throughput of mask making and also to reduce the minimum optical density value toward zero. The capability of focusing a larger beam current to a given e-beam spot size is an important feature to take full advantage of a larger clock rate.

It has been determined that the sensitivity of HEBS-glass is enhanced by the heat effect of a larger beam current. The throughput of writing a HEBS-glass gray level mask increases by a factor of 7.5 instead of 4 when the addressing grid size is increased from 0.2 $\mu$m to 0.4 $\mu$m, and at the same time the beam current is increased from 75 na to 300 na.

A grounding layer in the form of a 10 nm (or thicker) chrome layer should be applied to the HEBS-glass photomask blank. The only purpose of this thermally evaporated layer is to avoid local charging of the mask plate during the e-beam writing process. The mask is then exposed in the e-beam writer.

After the e-beam exposure the only necessary processing step is the wet etching of the Cr grounding layer to make the mask ready for exposure in an optical lithography exposure tool. Besides the removal of the grounding layer no processing of the mask is necessary.

Microscope Observation

Phase levels of DOE are immediately visible as gray levels in HEBS-glass upon e-beam exposure. The pattern data or image should be observed in a transmission mode. Since the pattern data or image in HEBS-glass do not scatter or reflect light, they are essentially not visible in a reflection mode.

DOE Made of an E-Beam Direct-Write HEBS-Glass Plate or Made of a Laser Beam Direct-Write LDW-Glass Plate The multi-gray levels in HEBS-glass were transformed into multi-phase levels, i.e., depth variation of surface relief in HEBS-glass upon a wet chemical etching or a dry etching process. An exemplary etching process consists of dipping an e-beam patterned HEBS-glass plate in 1.25% HF solution for 40 minutes. Before the etching process the image in HEBS-glass causes an absorption or amplitude modulation of an incoming light beam, whereas after the etching process the image in HEBS-glass effects a phase modulation of the incoming light beam.

Under microscope observation, the e-beam written pattern is essentially not visible in a reflection mode. After the selective etching process the pattern becomes visible in the reflection mode.

HEBS-glasses having been uniformly darkened with a high energy beam, electron beam in particular, is a laser beam direct write glass, LDW glass herein after.

The laser beam direct write LDW-glass has a much superior selective etch ratio than the e-beam direct write HEBS-glass. Due to a very large etch ratio of the laser exposed area vs. unexposed area within a LDW-glass mask, DOE as well as refractive micro lens arrays and general three dimensional surfaces can be fabricated in LDW-glass with the laser direct write approach to result in a LDW-glass mask and followed by an etching step.

LDW-Glass Mask Fabrication

One of the products of the present invention is an LDW-glass which is a HEBS-glass having been uniformly darkened to a predetermined optical density value. Said predetermined optical density value is at least the maximum optical density value of a pre-designed gray scale mask with multi-gray levels, said LDW-glass prior to being darkened with an electron beam or a flood electron gun is a transparent HEBS-glass which in bodies of 0.090 inch cross section will exhibit the following properties:

(a) the transmittance is more than 88% at 436 nm (b) upon exposure to an electron beam with a flood electron gun or with an electron beam pattern generator operated at a value of acceleration voltage selected from 20 to 30 kV, the electron beam darkening sensitivity in the linear portion of the sensitivity curve, is at least 2.454 unit of optical density value in the spectral range of 365 nm to 630 nm per milli coulomb/cm$^2$.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$, said gray scale mask is made by exposure to a focused laser beam, said multi-gray levels are made using laser write speed and/or laser beam intensity and/or number of retraces as variable write parameters.

Another products of the present invention is an LDW-glass which is a HEBS-glass having been uniformly darkened to a predetermined optical density value, said predetermined optical density value is at least the maximum optical density value of a pre-designed gray scale mask with multi-gray levels, said LDW-glass prior to being darkened with an electron beam or a flood electron gun is a transparent HEBS-glass which in bodies of 0.090 inch cross section will exhibit the following properties:

(a) the transmittance is more than 88% at 436 nm
(b) upon exposure to an electron beam with a flood electron gun or with an electron beam pattern generator operated at a value of acceleration voltage selected from 10 to 100 kV, the HEBS-glass is darkened to a predetermined optical density value which is at least the maximum optical density value of a pre-designed gray scale mask with multi-gray levels.

Said HEBS-glass having a base glass composition consisting essentially on the mole % oxide basis 11.4 to 17.5% of one or more alkali metal oxide, 2.4 to 10.2% total of photosensitivity inhibitors and RS suppressing agents including 2.4 to 10.2% $TiO_2$, 1.1 to 2.4% $Al_2O_3$, 0 to 4.6% $B_2O_3$, 3.7 to 13.2% ZnO, 0.5 to 6% Cl and 58.2 to 78.8% $SiO_2$, said gray scale mask is made by exposure to a focused laser beam, said multi-gray levels are made using laser write speed and/or laser beam intensity and/or number of retraces as a variable write parameters.

The LDW-glass gray scale mask can be utilized in making three dimensional microstructures with general three dimensional surfaces in photoresist through a single optical exposure in a photolithographic process.

The profile of a three dimensional surface in photoresist is transferred into a substrate material using an etching process.

Laser Direct Write glass (LDW-glass) also offers the advantages of a one step fabrication of a true gray level mask. The exposure of this gray level mask is done in a laser writing tool. This also allows the use of the existing software previously written to support mask making and direct write on resist approaches for the fabrication of diffractive optical elements (DOEs). The so generated gray level mask can be used in an optical lithographic exposure tool (e.g., a G-line or a I-line wafer stepper, or a contact aligner) to mass fabricate resist profiles.

Using the LDW gray level mask fabrication and a following optical lithographic exposure, alignment errors are avoided, since the mask is written in a single step using different energy densities of a laser beam to generate multi-gray levels. This new approach also allows a very economical mask fabrication. Instead of fabricating a set of 5 binary chrome masks with all the involved resist processing and wet etching, a single writing step without the need for any processing is needed. This single mask then contains all the necessary information previously contained in a set of 5 binary masks. Misalignment due to sequential printing of 5 binary masks in a set is completely avoided. After the LDW gray level mask is fabricated a series of single exposure in a step-and-repeat system can generate hundreds of DOEs on the same wafer. This wafer can then be processed with a single CAIBE step to transfer the DOE structure of a large number of different elements simultaneously into the substrate. Since the complete DOE structure is transferred into the substrate there is no need for a resist stripping step after the etching process. After dicing the wafer hundreds of monolithic multilevel DOEs can be generated by a process which cut the involved processing steps by more than a factor of 5.

Figure 19:
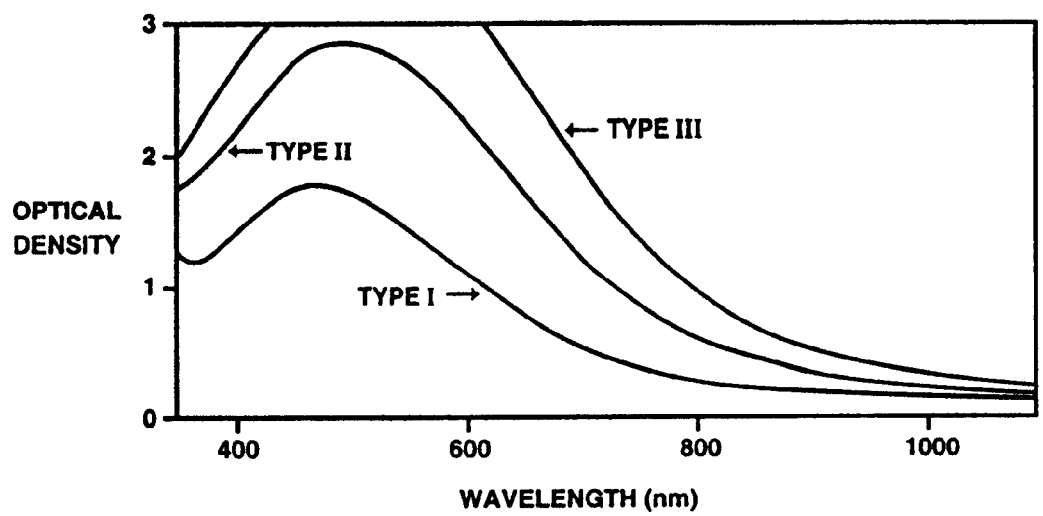
FIG. 19 depicts absorption spectra of LDW-HR plates—Type I, —Type II and —Type III.
Figure 20:
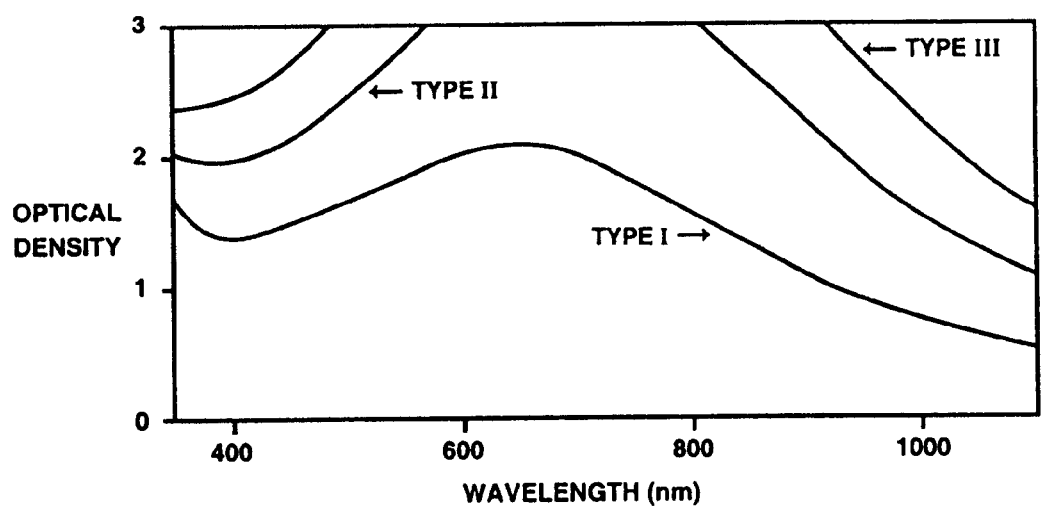
FIG. 20 depicts absorption spectra of LDW-IR plates—Type I, —Type II and Type III.

The optical density spectra of exemplary LDW-glasses are shown in FIG. 19 and FIG. 20. FIG. 19 exhibits the optical density spectra of LDW-HR plates-Type I, -Type II and -Type III. FIG. 20 exhibits the optical density spectra of LDW-IR plates-Type I, -Type II and -Type III. LDW-HR plates-Type I, -Type II and -Type III as well as LDW-IR plates-type I, -Type II and -Type III are HEBS-glass No. 3 having been darkened with flood electron gun, using the acceleration voltage and electron dosage of the electron beam exposure as variable parameters.

LDW-glass photomask blanks are monolithic silicate glass plates with no coating of any kind. LDW-glasses contain a large number density of coloring specks of silver within 1 $\mu$m in the thickness dimension into the glass surface. A focused laser beam of any wavelength in the spectral range of near uv, visible (e.g., 514 nm, 632 nm and 647 nm), near infrared (e.g. 820 nm and 1060 m) and infrared (e.g. 10.6 $\mu$m) can be used to heat erase these coloring specks, causing a portion or all of the coloring specks of silver in glass to become colorless silver ions. The transmittance of LDW-glass plates increases with increasing writing-energy density of a focused laser beam. The required writing energy density is a function of the wavelength of write beam, writing velocity, i.e., the speed of laser sweep, the intensity profile of the focused laser beam and the value of %T at the desired gray level. For example, having been exposed to an energy density of 2 joule/$cm^2$ a write beam at the wavelength of 514 nm and a writing velocity of 4 meters/sec, LDW-HR plate-type I becomes totally transparent.

At any given writing velocity, there exists an erasure-threshold-intensity $I_{ETh}$ below which there is no change in optical density of LDW-glass plates even with multiple retraces. Using a write-beam intensity above the erasure-threshold-intensity $I_{ETh}$, the optical density of LDW-glass plates reduces with each additional retrace and the LDW-glass plates can be erased to a transparent state with multiple retraces. As the write-beam intensity increases further above the erasure-threshold-intensity $I_{ETh}$, retraces needed to bring about the transparent state decrease in number. LDW-glass plates are made transparent in one laser sweep i.e., no retraces at a full-erasure-intensity $I_{FE}$.

At any given writing velocity, there also exists an abrasion-threshold-intensity $I_{ATh}$ at and above which the LDW-glass plates are abraded or damaged on the glass surface due to excessive temperature (>800° C.) at the laser focused spot. However, the abrasion is not a pure thermal effect, since the abrasion-threshold-intensity $I_{ATh}$ is lower using a write beam of a shorter wavelength.

At a given writing velocity, the write-latitude is defined as the difference $I_{ATh}-I_{FE}$ between the abrasion-threshold-intensity and the full-erasure-intensity. The write-latitude increases with decreasing writing velocity and also increases with a write-beam of a longer wavelength.

At a writing velocity of 1 to 4 meter/sec the required writing energy density for full erasure is 2 to 4 joule/$cm^2$ using a write-beam whose wavelength in the spectral range of 488 nm to 1060 nm, provided the optical density of the LDW-glass plate is in excess of about 0.5 at the wavelength of the write-beam.

The values of the writing energy density cited are based on experimental data using write-beams having a Gaussian intensity profile at the focused laser spot. One can expect the required writing energy density to reduce by a actor of more than 2 and the write-latitude increases, when a flat top intensity profile. is utilized.

Multigray levels were written in LDW-glass plates using the writing velocity or laser beam intensity or multiple retraces or a combination thereof as variable parameters.

A LDW-glass photomask with multi-gray levels is ideally suited for fabrication of diffractive optical elements (DOE), Micro-electro-mechanical (MEM) devices, Micro-Opto-electro-mechanical (MOEM) devices. A mask for 32 phase levels of DOE is made by exposing in a laser beam writer with predetermined energy density levels according to a depth versus optical density calibration curve.

To transfer a multilevel resist structure of DOE into quartz through a dry etching process, the relative etch rate between photoresist and quartz substrate can be so chosen to achieve the final needed etch depth 3 to 6 times that in the resist. Therefore for the fabrication of DOE in quartz a surface height variation of 1 $\mu$m in the resist results in a depth modulation in quartz of up to 6 $\mu$m.

The optical density at the wavelength of optical lithographic exposure tool, e.g., 436 nm (G line of mercury arc) is 1.4, 2.4 and 3.0 for LDW-HR plates type I, type II and type III respectively. The corresponding optical density at 365 nm (I line) is 1.0, 1.6 and 2.0 for type I, type II and type III plates respectively. The optical density at 405 nm (H line) is 1.2, 2.0 and 2.7 for type I, type II and type III plates respectively. The optical density of type III plates exceeds 3.0 in the spectral range of 430 nm to 615 nm. Depending on the photoresist, and its thickness requirement, one can select among type I, type II and type III of LDW-HR plates for the required optical density at the wavelength of lithographic exposure tool. LDW-HR plates having optical density of any specified value that is the same or different from those of type I, type II and type III plates are fabricated by controlling the variable parameters in the darkening process using a high energy beam. The increased optical density values from type I to type II to type III plates are due primarily to an increased thickness of the colored glass layer.

LDW-HR plate-type I has a larger write-latitude than the type II plate which in turn has a better write-latitude than the type III plate.

LDW-HR plates are recommended for write-wavelengths shorter than about 900 nm and is also good for a write beam using $CO_2$ laser at 10.6 $\mu$m wavelength. For write-wavelengths longer than about 750 nm, LDW-IR plates are preferred.

The optical density values at the wavelength of optical lithographic exposure tool, e.g. 436 nm are 1.2, 1.8 and 2.6 for LDW-IR plates type L type II and type III respectively. The corresponding optical density values at 365 nm are 1.4, 1.8 and 2.1 for type I, type II and type III plates respectively. The optical density values at 405 nm are 1.2, 1.8 and 2.4 for type I, type II and type III plates, respectively. The optical density of type II plates exceeds 3.0 in the spectral range of 570 nm to 805 nm. The optical density of type III plates exceeds 3.0 in the spectral range of 490 nm to 915 nm. Depending on the wavelength of a laser writer and on the photoresist thickness requirement, one can select among type I, type II and type III of LDW-IR plates. LDW-IR plates having optical density values that are the same or different from those of type I, type II and type III plates are fabricated by controlling the variable parameters in the darkening process using a high energy beam. The increased optical density values from type I to type II to type III plates are due primarily to an increased thickness of the colored glass layer. The type 1 plate has a larger write latitude than type II plate which in turn has a better write-latitude than the type III plate.

Due to the effect of the erasure-threshold intensity, there is little or no soft line-edges in the laser direct write patterns recorded in LDW-glass plates using a focused laser beam with a Gaussian intensity profile. The recorded spot size in LDW-glass plates is substantially smaller than the size of the airy disc of the focused laser spot in air. Moreover, the grain size of coloring specks of silver in the LDW-glass is of atomic dimension, and LDW-glass plates have no graininess. Submicron features were recorded in LDW-glass plate using laser beams of various visible wavelengths focused with an objective lens which has a numerical aperture as low as 0.25.

Absorption-Phase-Shift Mask

A binary absorption HEBS-glass mask becomes a binary phase-shift mask upon a selective wet chemical etching or a dry etching process. Starting with a HEBS-glass blank having an e-beam sensitized glass layer which is sufficiently thick so that the binary phase-shift mask is still sensitive to e-beam, a second e-beam exposure produces an absorption-phase-shift mask.

Advantages of Direct Write All-Glass Photomasks

Direct write all-glass photomask blanks includes HEBS-glass photomask blanks and LDW-glass photomask blanks.

Direct write on HEBS-glasses or LDW-glasses create instant photomasks, and eliminate chrome and photoresist, and their associated processing chemicals. This is a zero-waste, inexpensive solution for mask making. By employing the all-glass photomask blanks, photomasks meeting specifications containing the most stringent defect levels can be prepared consistently. Advantages gained in using all-glass photomask blanks include the following:

1. Photomasks can be patterned from all-glass blanks without a number of processing steps.

2. The advantages that can be expected from eliminating the post exposure processing steps include faster turnaround, better line width control and much lower defect densities.

3. Defects such as intrusion, extrusion, lack of adhesion, excess material/chrome spots and scratches in chrome are eliminated due to the elimination of chrome and resist as well as the associated processing steps.

4. No post exposure process-induced CD variation. No process induced image quality problems (e.g., line distortion) due to resist swelling during baking.

5. The direct write all-glass photomasks are non-reflective, and have near zero difference in reflectivity between darkened and undarkened areas. Reflectivity is 4% which is much less than that of the anti-reflective chrome at all wavelengths.

6. White light is a safe light for the all-glass photomask banks enabling inspection of the mask-blanks with intense white light before, during, and after the pattern is generated.

7. The all-glass mask is more durable than a chrome mask since the all-glass mask is less sensitive to surface scratching due to its volume effect, i.e., the masking pattern is within the glass surface rather than on the surface.

8. For contact printing, the all-glass masks have long life times and more wafers produced per mask.

9. The sensitivity of an all-glass blank is very uniform throughout the whole blank surface. Therefore, good CD control is not limited to the center of the mask. In contrast, chrome blanks often have the non-uniform photoresist coating thickness near the edges of the chrome plate.

10. Easy re-inspection of accepted masks; since there exists no scattered light from a clean all-glass photomask (without the chrome features which scatter light in the image plane), defects such as dust particles, fingerprints, and scratches are readily observable/detected in the passage of an intense light beam in a dark room. No expensive inspection equipment are needed to re-inspect used masks, or could-be contaminated masks.

11. Unlike chrome blanks, there is no chemical waste problems.

Applications of the Direct Write All-glass Photomask Blanks

Surfaces with three dimensional structures are required in several fields of micro technology. Structures with sawtooth profile (blaze) increases the efficiency of DOE. Tapered structures offer more flexibility in the design of microelectronics and micro mechanical components. Examples of 3D shaping using HEBS-glass gray level masks and/or LDW-glass gray level masks are:

1. Tapered structures for microelectronics, e.g. tapered structures in thick polyimide to realize electrical connection between two metallic layers separated by the thick polyimide, 2. Micro optical devices such as diffractive and refractive micro lenses, bifocal intraocular lenses, widely asymmetric DOE, miniature compact disc heads, anti reflective surface, complex imaging optics, grating couples, polarization-sensitive beam splitters, spectral filters, wavelength division multiplexers, elements for head-up and helmet mounted display, for focal plane optical concentration and optical efficiency enhancement, for color separation, beam shaping, and for miniature optical scanners, microles arrays, diffraction gratings, laser diode array collimators and correctors, aberration correction, hybrid optics, microprism arrays, micromirror arrays and Bragg gratings.

3. Integrated optical components, two dimensional fanout gratings, optical interconnect, signal switching, fiber pigtailing, DOE to couple light from a laser into a fiber, 4. Micro-electro-mechanical (MEM) devises for sensors and actuators in automotive, machine tools, robotics and medical instrumentation, also devices for applications in micro valves, inertial micro sensors, micro machined RF switches, GPS component miniaturization, and a host of other sensors and actuators for applications to space, air, land, and sea vehicles, as well as industrial, biotechnology and future consumer electronics, 5. Micro-opto-electro-mechanical (MOEM) devices such laser scanners, optical shutters, dynamic micro mirrors, optical choppers and optical switches.

In the description which follows like elements are marked throughout the specification and drawing with the same reference numerals, respectively. Drawing figures showing actual physical elements are not intended to be to scale.

Several types of micro-elements are required to be of a three dimensional configuration which includes a variable surface contour or geometry and which may be symmetric or non-symmetric. Micro-optic devices such as micro-lenses, wave guides and computer generated holograms, for example, often require. a geometry which is preferably a continuously curved surface or which has a profile of continuously varying depth from a reference point. Examples are diffractive optical elements such as spherical micro-lenses, Fresnel lenses and certain optical waveguide and coupling devices. The fabrication of such elements may be carried out, generally, using methodology similar to that used for the fabrication of very large scale integrated circuits (VLSI) wherein a photoresist material is placed on a substrate and is etched to produce a replica of the microelement, preferably to a finely detailed and precise geometry. This precision geometry is particularly important for micro-optic devices and micro-machines, for example.

Gray scale masks (also known as gray "level" masks) have been developed, as mentioned hereinabove, to provide the necessary surface contours of micro-elements, including micro-lens devices, to replace the multi-step binary fabrication methods for these devices. However, the shortcomings of prior art gray scale masks mentioned hereinabove have inhibited the development of a method for volume production of micro-optic elements and other micro-elements. In accordance with this invention it has been discovered that an improved gray scale mask suitable for use in the fabrication of precise, highly efficient micro-optic elements can be provided using, as the mask structure, glass plates which have been composed to be sensitive to controlled electron beams to generate a darkened image in the glass having a precise configuration and having a substantially continuously varying light transmissivity capability over a pre-determined area.

The present invention contemplates the provision of a gray scale mask comprising a structure formed of a base glass such as a low expansion zinc-boro-silicate glass or so-called white crown glass. The base glass composition also contains alkali to facilitate an ion exchange reaction which achieves the sensitivity of the glass composition to high energy beams. After ion exchange the glass material becomes alkali-free as a result of the ion exchange process, which is typically carried out in an acidic aqueous solution at temperatures above 320.degree. C. The base glass composition comprises silica, metal oxides, nitrates, halides and photo inhibitors. Typically, $TiO_2$, $Nb_2O_5$ or $Y_2O_3$ are used as photo inhibitors. The photo inhibitors are used to dope silver-alkali-halide complex crystals, for example. The $(AgX)_m(MX)_n$ complex crystals are beam sensitive and the doping process increases the energy band gap of the otherwise photosensitive material.

The beam sensitive glass used in the present invention may be of a type III may be such as described in U.S. Pat. No. 5,078,771 issued Jan. 7, 1992 to Che-Kuang Wu, which is incorporated by reference herein. Other glasses which are beam sensitive and which may be used to fabricate a gray level mask in accordance with the invention are described in U.S. Pat. No. 5,114,813 issued May 19, 1992 and U.S. Pat. No. 5,145,757 issued Sep. 8, 1992, both to Steven W. Smoot, et al., which are also incorporated herein by reference. However, the invention is not necessarily limited to the particular glass compositions described hereinabove for fabrication of the gray scale masks and other materials which are darkenable in different degrees in accordance with the invention may be used.

Accordingly, a gray scale mask in accordance with the present invention may be fabricated from a glass structure or similar material comprising a relatively thin plate which, after being drawn, ground and polished is treated in such a way that at least one surface of the plate (or a similar glass article) becomes effective to render the surface darkenable upon exposure to electron beam radiation over at least a portion of the surface and wherein the plate or article is preferably substantially not alterable by or sensitive to actinic radiation. Preferably, the gray scale mask article is exposed to a high energy beam, such as an electron beam, preferably at an acceleration voltage of greater than about 20 kV (kilovolts) whereby the necessary change in transmissivity or optical density of the article is such that a gray scale mask can be produced while maintaining good resolution of the image produced on the glass.

Figure 21:
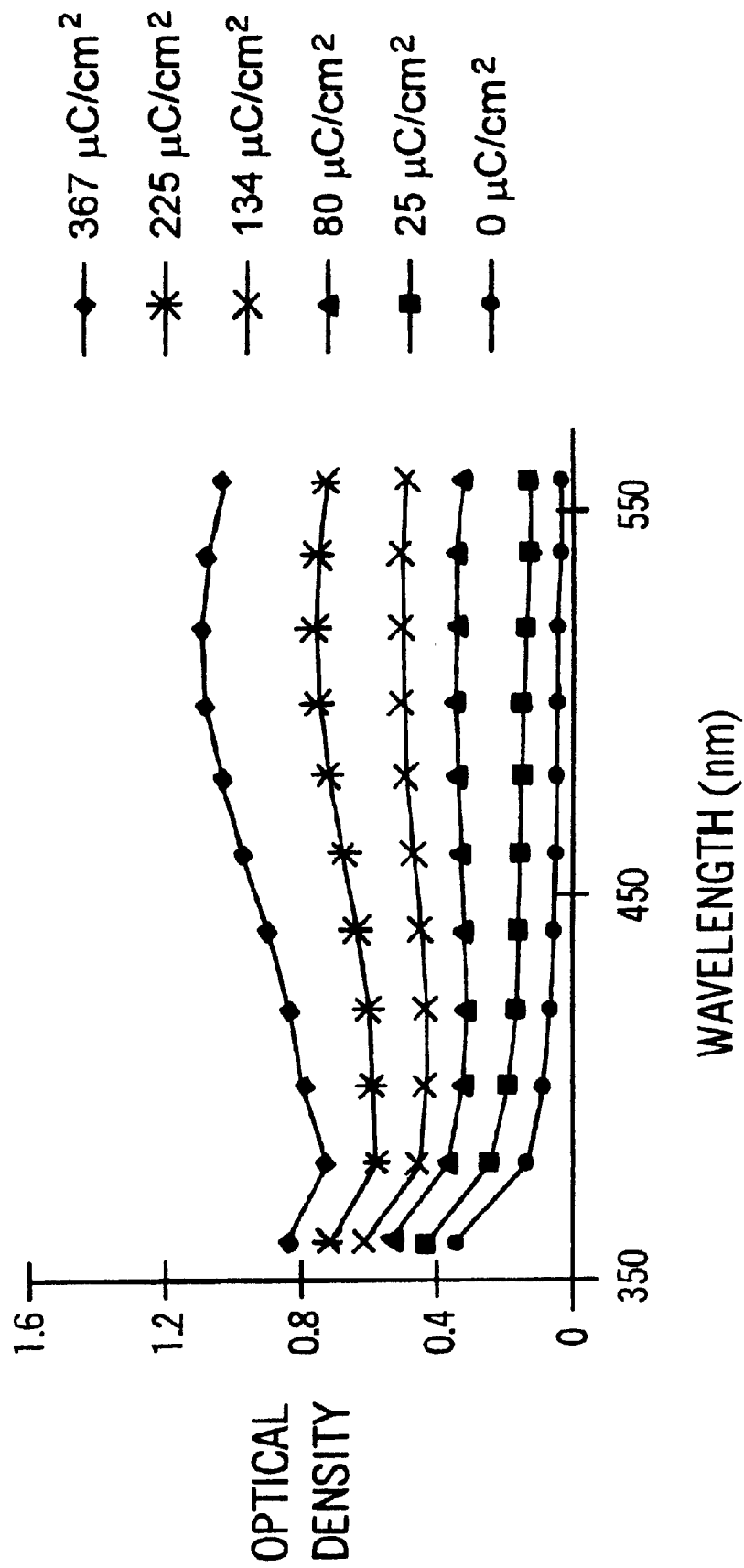
FIG. 21 is a diagram showing the variation in optical density of a gray scale mask formed of high energy beam sensitive glass after exposure with an electron beam of a particular acceleration voltage.
Figure 22:
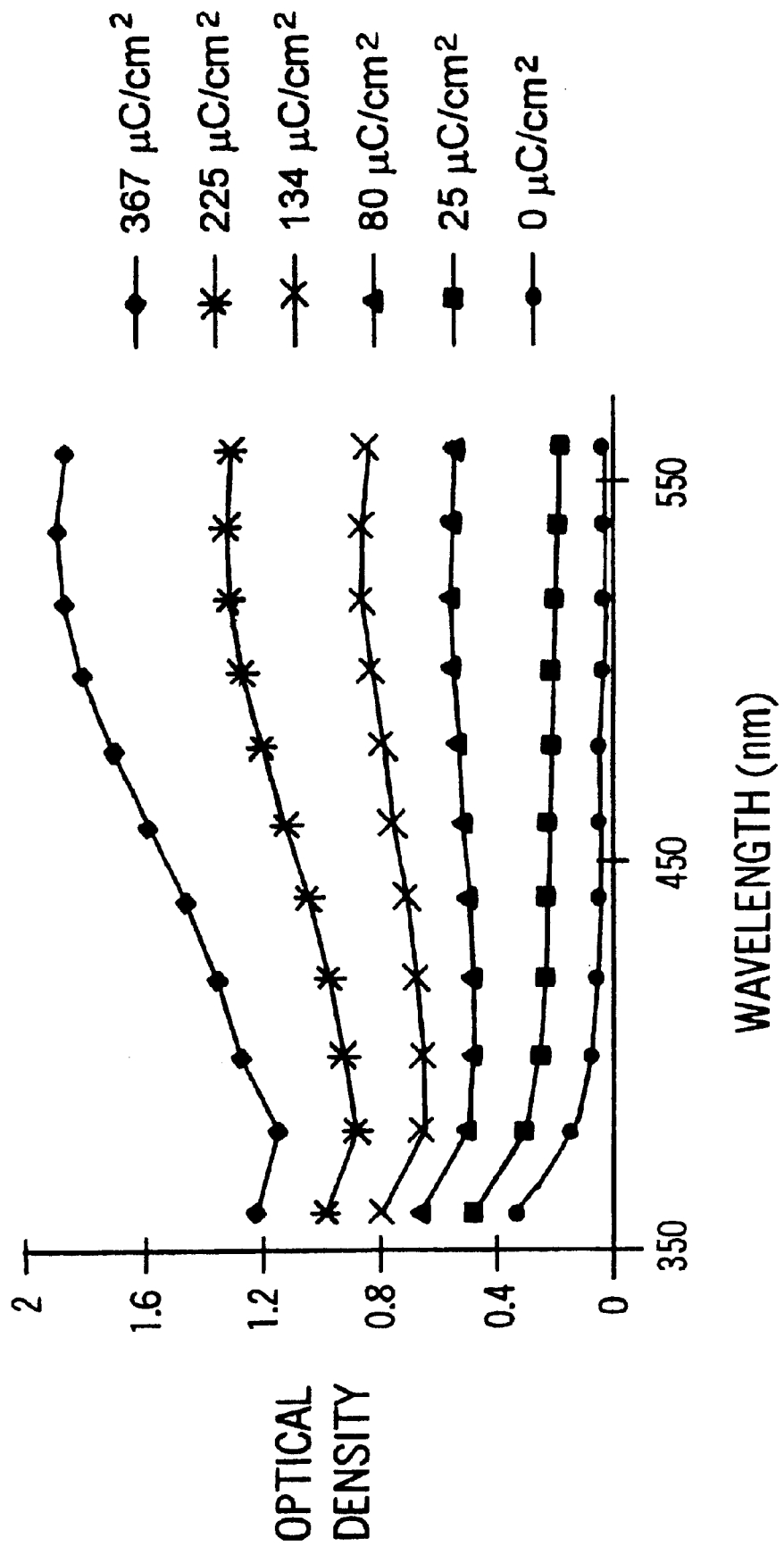
FIG. 22 is a diagram similar to FIG. 1 showing the variation in optical density of a mask formed of the same material after exposure to a beam of higher acceleration voltage.

Referring to FIGS. 21 and 22, and by way of example, diagrams of the optical density or optical transmissivity of a gray scale mask in accordance with the invention are illustrated showing the variation in optical density for light of wavelengths between about 350 nm (nanometers) and 550 nm for electron beam acceleration voltages of 20 kV (FIG. 21) and 30 kV (FIG. 22) for electron charge densities or "dosages" ranging from 0 to 367 .mu.C/cm.sup.2 (microcoulombs per centimeter squared). A writing current of about 25 nA (nanoamperes) was used in obtaining the data for FIGS. 21 and 22.

A gray scale mask comprising a glass article of a composition in accordance with the teachings of U.S. Pat. No. 5,078,771 can be produced using a commercially available electron beam writing device. These devices can be controlled to expose the glass article, such as a plate, to an electron beam to generate images of varying optical density wherein the image is generated on a grid having grid spacings of about 0.1 mm, for example. The grid spacings may be smaller if desired but the writing time is increased accordingly. Larger grid spacings will tend to reduce image resolution. The lower of the two acceleration voltages used to generate the data in FIGS. 21 and 22 is preferable to minimize the spreading of the darkened spacings on the grid by the electron beam. Since the size of the interaction volume of the electron beam with the glass material depends on the energy of the incident beam the lowest acceleration voltage which still achieves a high enough penetration depth for sufficient optical density is preferred. An acceleration voltage of 20 kV produces enough penetration in the glass material of a gray scale mask as described herein without extending the electron trajectories unnecessarily in a way which would result in the loss of image resolution. The operating parameters of the beam writer or a similar device may be varied with the particular beam sensitive material being used to fabricate the gray scale mask and the values given herein are for an exemplary embodiment of the invention.

Preparation of a glass plate utilizing the electron beam-sensitive glass for generating the pre-determined gray scale darkened areas preferably includes depositing a so-called grounding layer of material on the surface of the glass. The purpose of this layer is to avoid local electrical charging of the mask plate during the electron beam writing process. A grounding layer in the form of a layer of chromium of a thickness of about 10.0 nm may be applied to the glass plate surface adjacent to the ion exchanged surface layer of the glass containing the high concentration of silver ions. The chromium grounding layer may be removed by wet etching after the mask plate is darkened to the predetermined gray level pattern desired.

Figure 23:
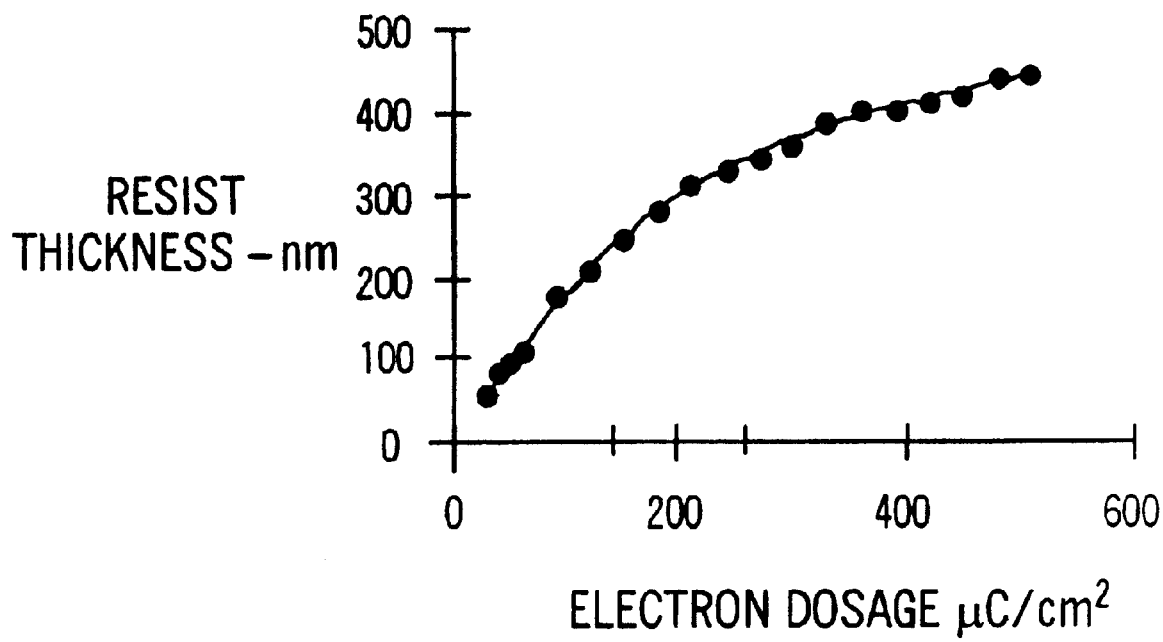
FIG. 23 is a diagram showing photoresist thickness versus electron charge density or dosage used to expose a gray scale mask in accordance with the present invention.

In the fabrication of a diffractive optical element as well as other micro-elements using a photoresist material on the surface of a substrate and an etching process to develop the photoresist and the substrate, a correlation must be obtained between the electron charge density or dosage (in coulombs per centimeter squared, for example) which will be applied to the gray scale mask and the corresponding thickness of penetration of the photoresist during the resultant exposure of the photoresist through the gray level mask. FIG. 23 shows, by way of example, a calibration curve for depth of penetration in a photoresist, such as a type OeBR-514 photoresist available from Olin-Ciba-Geigy Corporation, for example, compared with electron beam charge density applied to the mask grid spacings, respectively. In other words if a depth contour in the substrate such as a diffractive optical element is to be correlated with the thickness of a photoresist which is to be altered by exposure through the gray level mask, then a corresponding degree of darkening of the mask must be achieved and the electron dosage which will achieve this darkening can be correlated directly with the degree of penetration or exposure of the photoresist. For the sake of discussion herein it will be assumed that, if a large amount of exposure light is transmitted through a particular mask to the photoresist, then the height of the processed photoresist is limited and the thickness of the micro-element produced in the etching process is correspondingly small. If the amount of light transmitted through a particular mask opening is small, then the height of the processed photoresist is large and the corresponding thickness or height of the processed substrate article is also correspondingly large. Photoresist materials which, upon exposure to varying light intensities, respond in the opposite manner upon processing, may, of course, be used in conjunction with the method of the present invention.

In designing a surface profile for a particular diffractive optical element, a particular number of evenly spaced depth levels may be selected. For example, for a photoresist thickness of about 350 nm, thirty-two depth levels of penetration of light which will alter the characteristics of the photoresist may be selected and these different depth levels may then be correlated with a particular electron beam dosage to cause the appropriate darkening of the gray level mask. In other words, thirty-two different gray levels are generated.

For the particular gray level mask discussed herein, an acceleration voltage for the electron beam of 20 kV may be selected, so as to avoid substantial exposure time of the beam at each grid spacing. For the production of diffractive optical elements such as spherical lenses having a focal length of about 4.4 mm and a lens size of about 100 m.times.100 m a grid spacing of about 0.1 m may be selected, for example. A photoresist having a thickness of about 350–500 nm will produce a depth in the micro-element substrate in the range of three to six times the depth of the photoresist so that, for example, the substrate profile may have a total depth of up to about 2100 nm, by way of example. Again, by way of example, the design of the surface profile is spaced out over thirty-two evenly spaced depth levels over a 350 nm thickness range of the photoresist. With a grid spacing of 0.1 m the different depth levels may then be written into a computer program for controlling the electron beam writer in a way wherein the program controls the writer to dwell for a predetermined period of time at each grid spacing.

Figure 24:
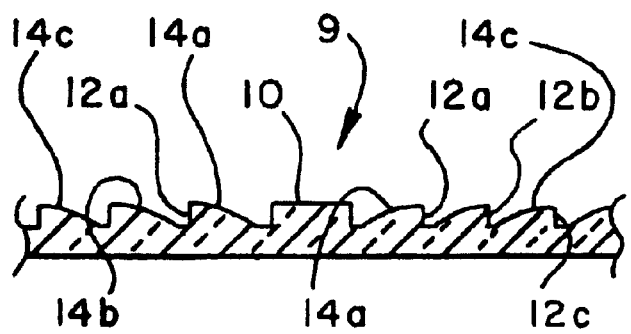
FIG. 24 is a transverse section view of a portion of a micro-lens fabricated in accordance with the method of the present invention.

FIG. 24 illustrates a cross sectional profile for a generally circular lens 9 having a hub portion 10, concentric circumferential lens surfaces 12a, 12b, 12c and 12d and corresponding concentric contoured lens surfaces 14a, 14b, 14c and 14d. These lens surfaces may be repeated at selected radii from the hub portion 10 in accordance with known practices for spherical or Fresnel lens design, for example. Referring to FIG. 25B, a portion of the cross-sectional profile of the lens 9 is shown on a processed photoresist layer 16 disposed on a substrate 18 of a suitable light transmissive material, such as quartz glass, silica glass or germanium to be used as the lens itself. Quartz glass is used in an example described hereinbelow.

In FIG. 25B, the layer of photoresist 16 is shown with the contour or profile of the lens 9 formed therein for the sake of clarity. Accordingly, a portion of the hub 10 of lens 9 is indicated at 10r, the contoured lens surface 14a is indicated at 14ar, the circumferential lens surface 12a is indicated at surface 12a r and the contoured surface 14b is indicated at 14br, for example.

Figure 25A:
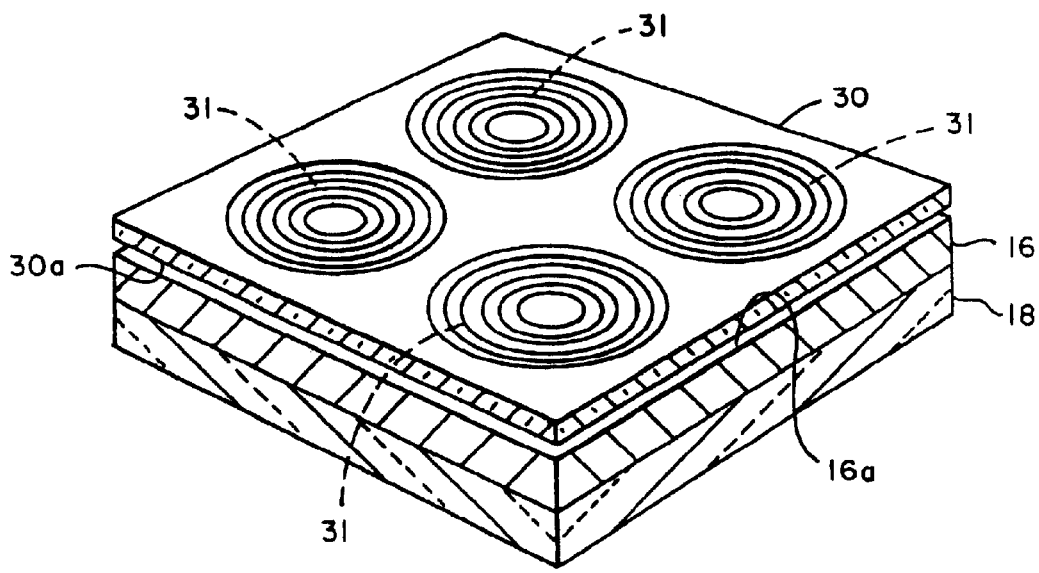
FIG. 25A is a partial plat of a grid showing darkened areas corresponding to changes in contour of portions of the lens shown in FIG. 4.
Figure 25B:
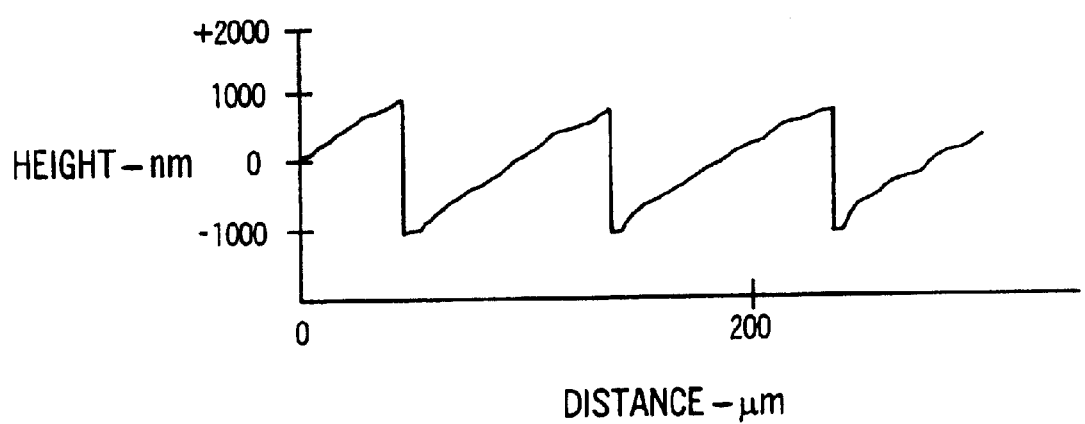
FIG. 25B is intended to be read in conjunction with FIG. 5A and shows a partial transverse section on a larger scale of the micro-lens shown in FIG. 4.

FIG. 25A is intended to be read in conjunction with FIG. 25B and shows a portion of a grid 20 having the spacings mentioned above and showing, for example, grid spacings 21, of equal area, that is, squares of 0.1 .mu.m, exemplary ones of which are shown darkened to varying degrees to provide the thirty-two depth or phase levels in the photoresist 16 and eventually in the lens 9. Of course, the grid 20 exists only in the micro-processor which controls the electron beam writer and the spacing of the writing mechanism as it moves from one spacing 21 on the grid to the next spacing and the electron beam is then generated to darken the spacings, accordingly. Representative darkened grid spacings are indicated at 22 defining the edge of the circumferential surface 12a, for example. Representative grid spacings 21 which have been slightly darkened, as indicated at 24, show the contour of the periphery of hub portion 10 of the lens as represented on the contour of the etched photoresist 16. Darkened grid spacings indicated at 25 define the edge or juncture of surfaces 12br and 14br, for example.

Accordingly, for a particular photoresist material, the thickness of the photoresist which is to remain after exposure and etching may be correlated with the electron beam dosage required to darken a high energy beam-sensitive glass of the type described herein and the contour or profile of a micro-optic element or other micro-element may be correlated with the dosages or beam charge density required for each subdivided space in a grid. The electron beam writing device may be controlled to index to each of the spaces 21 in the grid and apply a pre-determined electron beam dosage to that space corresponding to the degree of darkening of the gray level mask desired. Of course, the size of the grid spaces may be varied, the acceleration voltage may be varied and the electron beam charge density-may be varied depending on the characteristics of the particular mask material and the photoresist material being used.

Electron beam dosing of the gray scale mask plate at each of the grid spacings 21 will darken the glass across the grid to produce the gray levels desired. After removal of the aforementioned electrical charge grounding layer no further treatment of the gray scale mask is necessary, the gray levels are visible and repairs or additional image configurations or other features may be provided by additional writing operations with the electron beam writer.

Fabrication of micro-elements, such as diffractive optical elements, may then be carried out using a gray scale mask fabricated in accordance with the description hereinabove. For example, a gray scale mask 30 is shown in FIG. 26 comprising a glass plate formed of a glass of the type described above and in the patents referenced herein and which has been exposed to an electron beam writer to generate gray level images of an array of generally spherical micro-lenses, as indicated by the images 31 in FIG. 26. These images are in the surface layer 30a facing surface 16a of the photoresist layer 16. The gray scale mask 30 may then be brought into contact or close proximity with surface 16a of photoresist 16 which is disposed on a quartz glass plate 18.

Equipment used in the production of micro-electronic devices by exposure of photomasks to photoresist coated substrates may be used to produce diffractive optical elements in accordance with this invention. For example, the gray scale mask 30 may be placed in contact with or close proximity to the layer of photoresist 16 in a commercially available aligner and the photoresist of the type mentioned above is then exposed to light in a range of wavelengths of 327 nm–400 nm, for example. The mask 30 may also be disposed remote from the photoresist and the mask image projected onto the photoresist using an optical imaging or scanning system. Accordingly, photo reduction (demagnification) or photo enlargement (magnification) of the image in the gray scale mask may be carried out on photoresist, if desired.

Preparation of the substrate and photoresist, using a photoresist of the type mentioned hereinabove (OeBr-514) or another ultraviolet curable polymer may be carried out by spinning a layer of photoresist onto the substrate at a speed of about 4,000 rpm, for about 30 seconds, for example. A 0.8 .mu.m thick layer applied to a quartz glass substrate may be obtained and, the photoresist coated substrate baked for about 30 minutes at 90.degree. C. prior to exposure of the resist through the gray level mask.

After exposure of the photoresist 16 with the gray scale mask 30, development of the photoresist may be carried out by post-baking the resist for a predetermined period and at a relatively low temperature so as to avoid reflow of the resist during the post-baking procedure which might result in a degraded profile of the micro-element. Alternatively, the photoresist may be developed in a metal ion-free developer such as a type made by Shipley Corporation. The photoresist-coated substrate may then be subjected to a conventional etching process such as an ion beam milling procedure. A Veeco Instruments Microtech 301-type milling system may be used, for example.

The ion milling system may be modified to accommodate the introduction of reactive gasses to provide chemically assisted ion beam etching. Chemically assisted ion beam etching is advantageous because it allows for the accurate control of the energy, number and incidence angle of ions during the milling process. Moreover, the amount of released reactive gas can be chosen freely which allows for control of the q-factor. The q-factor is defined as the substrate etch rate to the resist etch rate. Varying the q-factor provides for varying the feature depth in the final micro-element to fit a specific application. For example, in the fabrication of diffractive optical elements, the feature depth in the final configuration will be dictated by the specific application, wave length of light to be transmitted, the refractive index of the substrate material, the refractive index of the surrounding environment, or dimensional constraints on the substrate structure. Variation in the amount of reactive gas, such as CHF.sub.3, introduced into the etching system will allow a change in the q-factor ranging from 1.8 to 4.3, for example. A higher q-factor is usually necessary to achieve a high etch depth required for elements transmitting longer wave-length light and also allows the reduction in the resist thickness which will. result in enhanced resolution. Lower q-factors may be. useful in achieving low feature depth and high accuracy needed for reflection type optical elements.

FIG. 27 illustrates a portion of the actual profile of a micro-spherical lens substantially like lens 9 and fabricated in accordance with the present invention wherein an overall height of the lens profile in the range of about 2000–2100 nm was achieved. The previously described technique was used to produce a 2.times.2 array of spherical lenses having an f number of nineteen and a focal length of 96 mm. A gray scale mask was fabricated of a high energy beam sensitive glass plate having a thickness of approximately 90 mils. The mask was exposed in a Cambridge Model EBMF 10.5 Electron Beam Writer which was controlled in accordance with aforedescribed procedure to produce thirty-two discrete levels of darkening of the mask in a predetermined pattern on 0.1 .mu.m spacing. The electron beam writer was controlled by a computer-aided design program developed for the University of California at San Diego to facilitate data generation necessary for direct write procedures with the electron beam writer. Electron beam charge density level for each depth or phase level in the final etched element profile can be included in data files used to operate the electron beam writer. This may be carried out by changing the writing frequency for different areas of the produced micro-element. Substrate material for the diffractive optical elements was fused silica. The diffractive optical element was, in particular, designed for an operational wavelength of 830 nm. The optical efficiency of the lens produced showed a 94% efficiency which is comparable to an efficiency measurement taken for a substantially identical lens fabricated by direct write methods.

A 10.times.10 array of spherical lenses of 100 mm by 100 mm size, an f number of 3.10 and a focal length of 4.4 mm was also fabricated using the above mentioned process for fabrication of the gray scale mask and the subsequent fabrication of the optical elements utilizing chemically assisted ion beam etching to transfer the resist profile into a quartz glass substrate.

As mentioned previously, a gray scale mask in accordance with the present invention may be advantageously used for mass production of diffractive optical elements, computer generated holograms and other micro-elements in a step and repeat fabrication system. In particular, a relatively large substrate member, suitably coated with photoresist may be exposed through a gray scale mask, such as the mask 30 in a commercially available aligner of a demagnification type or a contact type wherein the geometry of plural diffractive optical elements may be imprinted on the photoresist, the substrate member may be moved relative to the gray scale mask and the exposure step repeated so that a large array of micro-elements is imprinted on the photoresist step by step. This relatively large array of micro-elements may then be fabricated in a batch by a chemically assisted ion beam etching process, as described above, to transfer the geometry of the-micro-elements in the photoresist to the substrate member. Step and repeat or so-called stepper processes may, thus, be carried out with gray scale masks in accordance with the invention. Accordingly, the manufacture of various types of micro-elements as described herein, may be more efficiently and economically carried out.

Although preferred embodiments of the present invention have been described in detail herein, those skilled in the art will recognize that various substitutions and modifications may be made to the invention without departing from the scope and spirit of the appended claims.

What is claimed is:

1. A method of fabricating a three-dimensional diffractive optical element within photoresist which is coated on a substrate selected from a group consisting of quartz glass, silicate glass, germanium, and an optically transmissive material comprising:

providing a HEBS-glass photomask blank having a body portion and a surface layer formed thereon which is responsive to electron beam radiation to change the optical density of the surface layer;

exposing the HEBS-glass photomask blank to an electron beam of selected charge density over a grid of discrete locations on the photomask blank to provide a predetermined gray scale pattern of varying optical transmissivity on the photomask blank to produce a gray scale mask;

exposing the photoresist layer to radiation transmitted through the mask; and removing material from the photoresist layer to provide a predetermined varying thickness of the photoresist layer as determined by the gray scale patterns on the gray scale mask to produce the three-dimensional diffractive optical element.

2. A method comprising:

producing a gray level mask by electron beam exposing a High Energy Beam Sensitive glass (HEBS-glass) photomask blank having a body portion and an ion-exchanged surface glass layer formed thereon which is responsive to electron beam radiation of selected charge density over a grid of discrete locations on the photomask blank to form a predetermined gray scale pattern having multilevels of optical densities on the photomask blank;

exposing a photo resist layer to radiation transmitted through the gray level mask; and removing material from the photo resist layer to provide varying resist thickness of the photo resist layer as determined by the gray scale pattern on the gray level mask, to produce a surface with a three-dimensional structure in the photo resist layer.

3. The method according to claim 2 wherein said electron beam exposing comprises using a vector scan e-beam writer, to write each of the multilevels of the optical densities on the photomask blank with a clock rate corresponding to one of a plurality of predetermined optical density values of the predetermined gray scale pattern, further comprising determining the clock rate being from the predetermined optical density values using a selected calibration curve of optical density versus clock rate, said calibration curve for the HEBS-glass photomask blank having been determined experimentally for a number of variable parameters which include glass composition of the HEBS-glass photomask blank and write parameters of the e-beam writer, the write parameters include beam acceleration voltage, beam current and addressing grid size, the predetermined gray scale pattern corresponding to designed varying resist thicknesses as determined by the surface with a designed three dimensional structure, each of the predetermined optical density values of the predetermined gray scale pattern being determined from a resist thickness among the designed varying resist thicknesses using a calibration curve of an analog transfer scheme which relates resist thickness versus optical density, said calibration curve of the analog transfer scheme having been determined experimentally for a selected photoresist used in the photoresist layer.

4. The method according to claim 3 wherein the selected calibration curve of optical density versus clock rate having been determined with a combination of write parameters which are 20 kV for the beam acceleration voltage, 0.1 micrometer for the addressing grid size, and 25 na for the beam current.

5. The method according to claim 3 wherein the write parameters are 30kV for the beam acceleration voltage, 0.4 micrometer for the addressing grid size and 250 na for the beam current.

6. The method according to claim 3 wherein the selected photoresist is a Shipley photoresist.

7. The method according to claim 2 wherein said electron beam exposing comprises using a raster scan e-beam writer to write each of the multilevels of optical densities on the photomask blank with a certain number of scan counts corresponding to one of a plurality of predetermined optical density values of the predetermined gray scale pattern, further comprising determining the number of scan counts from the predetermined optical density values using a selected calibration curve of optical density versus number of scan counts, said calibration curve for the HEBS-glass photomask blank having been determined experimentally for a number of variable parameters which include glass composition of the HEBS-glass photomask blank and write parameters of the e-beam writer, the write parameters include beam acceleration voltage, beam current and addressing grid size, the predetermined gray scale pattern corresponding to designed varying resist thicknesses as determined by the surface with a designed three dimensional structure, each of the predetermined optical density values of the predetermined gray scale pattern being determined from a resist thickness among the designed varying resist thicknesses using a calibration curve of an analog transfer scheme which relates resist thickness versus optical density, said calibration curve of the analog transfer scheme having been determined experimentally for a selected photoresist used in the photoresist layer.

8. The method according to claim 7 wherein the write parameters are 20 kV for the beam acceleration voltage, 0.5 micrometer for the addressing grid size, and 4000 na for the beam current.

9. The method according to claim 2 wherein the three dimensional structure is selected from the group consisting of diffractive optical elements (DOE), refractive micro-optics, micro-electro-mechanical (MEMS) devices, micro-opto-electro-mechanical (MOEM) devices, integrated optical components and beam shaping optics.

10. The method according to claim 3 wherein the ion-exchanged surface glass layer is produced within the surface of a base glass plate through ion exchanging the base glass plate of a base glass composition in an acidic aqueous solution containing soluble ionic silver, the base glass composition comprising silica, metal oxides, halides and photoinhibitors.

11. The method according to claim 10 wherein the glass composition of the HEBS-glass photomask blank is the base glass composition having been ion exchanged in the acidic aqueous solution containing soluble ionic silver.

12. The method according to claim 10 wherein the base glass composition is selected from the group consisting of GLASS No. 1 to GLASS No. 20; wherein GLASS No. 1 is 71.5% $SiO_2$; 3.3% $Li_2O$; 5.3% $Na_2O$; 2.8% $K_2O$; 2.4% $TiO_2$; 1.3% $Al_2O_3$; 7.2% ZnO; 3.2% $B_2O_3$; and 3.0% Cl;

GLASS No. 2 is 78.8% $SiO_2$; 3.4% $Li_2O$; 5.4% $Na_2O$; 2.7% $K_2O$; 4.3% $TiO_2$; 1.2% $Al_2O_3$; 3.7% ZnO; and 0.5% Cl;

GLASS No. 3 is 68.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.8% $B_2O_3$; and 3.0% Cl;

GLASS No. 4 is 72.7% $SiO_2$; 3.6% $Li_2O$; 5.7% $Na_2O$; 3.1% $K_2O$; 3.4% $TiO_2$; 1.4% $Al_2O_3$; 7.1% ZnO; and 3.0% Cl;

GLASS No. 5 is 70.9% $SiO_2$; 3.7% $Li_2O$; 5.6% $Na_2O$; 3.1% $K_2O$; 4.5% $TiO_2$; 1.2% $Al_2O_3$; 6.0% ZnO; 2.0% $B_2O_3$; and 3.0% Cl;

GLASS No. 6 is 68.9% $SiO_2$; 3.9% $Li_2O$; 6.2% $Na_2O$; 3.3% $K_2O$; 5.6% $TiO_2$; 1.1% $Al_2O_3$; 7.0% ZnO; 1.0% $B_2O_3$; and 3.0% Cl;

GLASS No. 7 is 67.4% $SiO_2$; 3.9% $Li_2O$; 6.2% $Na_2O$; 3.3% $K_2O$; 4.5% $TiO_2$; 1.3% $Al_2O_3$; 9.0% ZnO; 1.4% $B_2O_3$; and 3.0% Cl;

GLASS No. 8 is 67.1% $SiO_2$; 4.2% $Li_2O$; 6.7% $Na_2O$; 3.5% $K_2O$; 5.4% $TiO_2$; 1.2% $Al_2O_3$; 7.1% ZnO; 1.8% $B_2O_3$; and 3.0% Cl;

GLASS No. 9 is 66.1% $SiO_2$; 4.2% $Li_2O$; 6.7% $Na_2O$; 3.5% $K_2O$; 5.4% $TiO_2$; 1.1% $Al_2O_3$; 8.2% ZnO; 0.8% $B_2O_3$; and 3.0% Cl;

GLASS No. 10 is 63.8% $SiO_2$; 4.5% $Li_2O$; 7.2% $Na_2O$; 3.8% $K_2O$; 6.7% $TiO_2$; 1.6% $Al_2O_3$; 7.6% ZnO; 1.8% $B_2O_3$; and 3.0% Cl;

GLASS No. 11 is 64.8% $SiO_2$; 4.5% $Li_2O$; 7.4% $Na_2O$; 3.6% $K_2O$; 5.4% $TiO_2$; 1.2% $Al_2O_3$; 10.1% ZnO; 1.8% $B_2O_3$; and 1.2% Cl;

GLASS No. 12 is 64.0% $SiO_2$; 4.7% $Li_2O$; 7.6% $Na_2O$; 4% $K_2O$; 7.4% $TiO_2$; 1.2% $Al_2O_3$; 8.1% ZnO; and 3.0% Cl;

GLASS No. 13 is 60.1% $SiO_2$; 4.3% $Li_2O$; 7.8% $Na_2O$; 4.2% $K_2O$; 6.1% $TiO_2$; 1.5% $Al_2O_3$; 11.0% ZnO; 2.0% $B_2O_3$; and 3.0% Cl;

GLASS No. 14 is 60.5% $SiO_2$; 5.1% $Li_2O$; 8.1% $Na_2O$; 4.3% $K_2O$; 10.2% $TiO_2$; 1.2% $Al_2O_3$; 7.1% ZnO; 0.5% $B_2O_3$; and 3.0% Cl;

GLASS No. 15 is 58.2% $SiO_2$; 5.1% $Li_2O$; 8.1% $Na_2O$; 4.3% $K_2O$; 5.7% $TiO_2$; 2.4% $Al_2O_3$; 13.2% ZnO; and 3.0% Cl;

GLASS No. 16 is 69.7% $SiO_2$; 3.9% $Li_2O$; 6.2% $Na_2O$; 3.3% $K_2O$; 4.4% $TiO_2$; 1.2% $Al_2O_3$; 7.1% ZnO; 2.0% $B_2O_3$; and 2.2% Cl;

GLASS No. 17 is 64.2% $SiO_2$; 3.8% $Li_2O$; 6.4% $Na_2O$; 3.2% $K_2O$; 4.6% $TiO_2$; 1.3% $Al_2O_3$; 7.4% ZnO; 1.6% $Ta_2O_5$; and 6.0% Cl;

GLASS No. 18 is 64.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.2% $Nb_2O_3$; 4.6% $B_2O_3$; and 3.0% Cl;

GLASS No. 19 is 66.3% $SiO_2$; 3.8% $Li_2O$; 6.4% $Na_2O$; 3.2% $K_2O$; 4.6% $TiO_2$; 1.3% $Al_2O_3$; 7.4% ZnO; 2.0% $ZrO_2$; 2.0% $B_2O_3$; and 3.0% Cl; and GLASS No. 20 is 67.8% $SiO_2$; 3.8% $Li_2O$; 6.4% $Na_2O$; 3.2% $K_2O$; 4.6% $TiO_2$; 1.3% $Al_2O_3$; 7.4% ZnO; 0.5% $WO_3$; 2.0% $B_2O_3$; and 3.0% Cl.

13. The method according to claim 10 wherein the base glass composition consists essentially of on the mole % oxide basis 11.4 to 17.5% of one or more alkali metal oxide; 2.4 to 10.2% of at least one photosensitivity inhibitors and RS suppressing agents selected from the group consisting of $TiO_2$, $Ta_2O_5$, $ZrO_2$, $Nb_2O_5$, $La_2O_3$, $Y_2O_3$, and $WO_3$ with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

14. A method comprising:
providing a High Energy Beam Sensitive glass (HEBS-glass) photomask blank having a body portion and an ion-exchanged surface glass layer formed thereon which is responsive to electron beam radiation and of a type where an optical density of the surface glass layer is changed by said electron beam radiation; and
exposing the HEBS-glass photomask blank to an electron beam of selected charge density over a grid of discrete locations on the photomask blank to produce a predetermined gray scale pattern having multilevels of optical densities on the photomask blank to produce a HEBS-glass gray level mask.

15. The method according to claim 14 wherein said exposing is done using a vector scan e-beam writer, and further comprising writing each of the multilevels of the optical densities on the photomask blank with a clock rate corresponding to one of a plurality of predetermined optical density values of the predetermined gray scale pattern, which clock rate is determined from the predetermined optical density values using a selected calibration curve of optical density versus clock rate, said calibration curve for the HEBS-glass photomask blank having been determined experimentally for a number of variable parameters which include glass composition of the HEBS-glass photomask blank and write parameters of the e-beam writer, the write parameters include beam acceleration voltage, beam current and addressing grid size.

16. The method according to claim 15 wherein the selected calibration curve of optical density versus clock rate having been determined with a combination of write parameters which are 20 kV for the beam acceleration voltage, 0.1 micrometer for the addressing grid size, and 25 na for the beam current.

17. The method according to claim 15 wherein the write parameters are 30 kV for the beam acceleration voltage, 0.4 micrometer for the addressing grid size and 250 na for the beam current.

18. The method according to claim 14 wherein said exposing is done using a raster scan e-beam writer, each of the multilevels of optical densities being written on the photomask blank with a certain number of scan counts corresponding to a predetermined optical density value of the predetermined gray scale pattern, the number of scan counts being determined from the predetermined optical density-value using a selected calibration curve of optical density-versus number of scan counts, said calibration curve for the HEBS-glass photomask blank having been determined experimentally for a number of variable parameters which include glass composition of the HEBS-glass photomask blank and write parameters of the e-beam writer, the write parameters include beam acceleration voltage, beam current and addressing grid size.

19. The method according to claim 18 wherein the write parameters are 20 kV for the beam acceleration voltage, 0.5 micrometer for the addressing grid size, and 4000 na for the beam current.

20. The method according to claim 14 wherein the HEBS-glass gray level mask is used as a phototool for fabrication of elements selected from the group consisting of diffractive optical elements (DOE), refractive micro-optics, micro-electro-mechanical (MEMS) devices, micro-opto-electro-mechanical (MOEM) devices, integrated optical components, beam shaping optics, and tapered structures for micro-electronics and micro mechanical components.

21. The method according to claim 15 wherein the ion-exchanged surface glass layer is produced within the surface of a base glass plate through ion exchanging the base glass plate of a base glass composition in an acidic aqueous solution containing soluble ionic silver, the base glass composition comprising silica, metal oxides, halides and photoinhibitors.

22. The method according to claim 21 wherein the glass composition of the HEBS-glass photomask blank is the base glass composition having been ion exchanged in the acidic aqueous solution containing soluble ionic silver.

23. The method according to claim 21 wherein the base glass composition is selected from the group consisting of GLASS No. 1 to GLASS No. 20; wherein GLASS No. 1 is 71.5% $SiO_2$; 3.3% $Li_2O$; 5.3% $Na_2O$; 2.8% $K_2O$; 2.4% $TiO_2$; 1.3% $Al_2O_3$; 7.2% ZnO; 3.2% $B_2O_3$; and 3.0% Cl;

GLASS No. 2 is 78.8% $SiO_2$; 3.4% $Li_2O$; 5.4% $Na_2O$; 2.7% $K_2O$; 4.3% $TiO_2$; 1.2% $Al_2O_3$; 3.7% ZnO; and 0.5% Cl;

GLASS No. 3 is 68.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.8% $B_2O_3$; and 3.0% Cl;

GLASS No. 4 is 72.7% $SiO_2$; 3.6% $Li_2O$; 5.7% $Na_2O$; 3.1% $K_2O$; 3.4% $TiO_2$; 1.4% $Al_2O_3$; 7.1% ZnO; and 3.0% Cl;

GLASS No. 5 is 70.9% $SiO_2$; 3.7% $Li_2O$; 5.6% $Na_2O$; 3.1% $K_2O$; 4.5% $TiO_2$; 1.2% $Al_2O_3$; 6.0% ZnO; 2.0% $B_2O_3$; and 3.0% Cl;

GLASS No. 6 is 68.9% $SiO_2$; 3.9% $Li_2O$; 6.2% $Na_2O$; 3.3% $K_2O$; 5.6% $TiO_2$; 1.1% $Al_2O_3$; 7.0% ZnO; 1.0% $B_2O_3$; and 3.0% Cl;

GLASS No. 7 is 67.4% $SiO_2$; 3.9% $Li_2O$; 6.2% $Na_2O$; 3.3% $K_2O$; 4.5% $TiO_2$; 1.3% $Al_2O_3$; 9.0% ZnO; 1.4% $B_2O_3$; and 3.0% Cl;

GLASS No. 8 is 67.1% $SiO_2$; 4.2% $Li_2O$; 6.7% $Na_2O$; 3.5% $K_2O$; 5.4% $TiO_2$; 1.2% $Al_2O_3$; 7.1% ZnO; 1.8% $B_2O_3$; and 3.0% Cl;

GLASS No. 9 is 66.1% $SiO_2$; 4.2% $Li_2O$; 6.7% $Na_2O$; 3.5% $K_2O$; 5.4% $TiO_2$; 1.1% $Al_2O_3$; 8.2% ZnO; 0.8% $B_2O_3$; and 3.0% Cl;

GLASS No. 10 is 63.8% $SiO_2$; 4.5% $Li_2O$; 7.2% $Na_2O$; 3.8% $K_2O$; 6.7% $TiO_2$; 1.6% $Al_2O_3$; 7.6% ZnO; 1.8% $B_2O_3$; and 3.0% Cl;

GLASS No. 11 is 64.8% $SiO_2$; 4.5% $Li_2O$; 7.4% $Na_2O$; 3.6% $K_2O$; 5.4% $TiO_2$;1.2% $Al_2O_3$; 10.1% ZnO; 1.8% $B_2O_3$; and 1.2% Cl;

GLASS No. 12 is 64.0% $SiO_2$; 4.7% $Li_2O$; 7.6% $Na_2O$; 4% $K_2O$; 7.4% $TiO_2$; 1.2% $Al_2O_3$; 8.1% ZnO; and 3.0% Cl;

GLASS No. 13 is 60.1% $SiO_2$; 4.3% $Li_2O$; 7.8% $Na_2O$; 4.2% $K_2O$; 6.1% $TiO_2$; 1.5% $Al_2O_3$; 11.0% ZnO; 2.0% B203; and 3.0% Cl;

GLASS No. 14 is 60.5% $SiO_2$; 5.1% $Li_2O$; 8.1% $Na_2O$; 4.3% $K_2O$; 10.2% $TiO_2$;1.2% $Al_2O_3$; 7.1% ZnO; 0.5% B203; and 3.0% Cl;

GLASS No. 15 is 58.2% $SiO_2$; 5.1% $Li_2O$; 8.1% $Na_2O$; 4.3% $K_2O$; 5.7% $TiO_2$; 2.4% $Al_2O_3$; 13.2% ZnO; and 3.0% Cl;

GLASS No. 16 is 69.7% $SiO_2$; 3.9% $Li_2O$; 6.2% $Na_2O$; 3.3% $K_2O$; 4.4% $TiO_2$; 1.2% $Al_2O_3$; 7.1% ZnO; 2.0% $B_2O_3$; and 2.2% Cl;

GLASS No. 17 is 64.2% $SiO_2$; 3.8% $Li_2O$; 6.4% $Na_2O$; 3.2% $K_2O$; 4.6% $TiO_2$; 1.3% $Al_2O_3$; 7.4% ZnO; 1.6% $Ta_2O_5$; and 6.0% Cl;

GLASS No. 18 is 64.5% $SiO_2$; 3.8% $Li_2O$; 6.4% $Na_2O$; 3.2% $K_2O$; 4.6% $TiO_2$; 1.3% $Al_2O_3$; 7.4% ZnO; 1.2% $Nb_2O_3$; 4.6% $B_2O_3$; 3.0% Cl;

GLASS No. 19 is 66.3% $SiO_2$; 3.8% $Li_2O$; 6.4% $Na_2O$; 3.2% $K_2O$; 4.6% $TiO_2$; 1.3% $Al_2O_3$; 7.4% ZnO; 2.0% $ZrO_2$; 2.0% $B_2O_3$; and 3.0% Cl; and GLASS No. 20 is 67.8% $SiO_2$; 3.8% $Li_2O$; 6.4% $Na_2O$; 3.2% $K_2O$; 4.6% $TiO_2$; 1.3% $Al_2O_3$; 7.4% ZnO; 0.5% $WO_3$; 2.0% $B_2O_3$; and 3.0% Cl.

24. The method according to claim 21 wherein the base glass composition consists essentially of on the mole % oxide basis 11.4 to 17.5% of one or more alkali metal oxide; 2.4 to 10.2% of at least one of photosensitivity inhibitors and RS suppressing agents selected from the group consisting of $TiO_2$, $Ta_2O_5$, $ZrO_2$, $Nb_2O_5$, $La_2O_3$, $Y_2O_3$, and $WO_3$ with at least 2.4% $TiO_2$; 1.1 to 2.4% $Al_2O_3$; 0 to 4.6% $B_2O_3$; 3.7 to 13.2% ZnO; 0.5 to 6% Cl; and 58.2 to 78.8% $SiO_2$.

25. The method according to claim 14 wherein the HEBS-glass gray level mask is used as a filter for beam shaping.

* * * * *